United States Patent
Sakaino et al.

(10) Patent No.: US 10,894,375 B2
(45) Date of Patent: Jan. 19, 2021

(54) COLOR CONVERSION FILM AND LIGHT SOURCE UNIT INCLUDING THE SAME, DISPLAY, AND LIGHTING APPARATUS

(71) Applicant: TORAY INDUSTRIES, INC., Tokyo (JP)

(72) Inventors: Hirotoshi Sakaino, Otsu (JP); Daisaku Tanaka, Otsu (JP); Masaaki Umehara, Otsu (JP); Yoshikazu Sato, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 379 days.

(21) Appl. No.: 15/763,341

(22) PCT Filed: Sep. 26, 2016

(86) PCT No.: PCT/JP2016/078296
§ 371 (c)(1),
(2) Date: Mar. 26, 2018

(87) PCT Pub. No.: WO2017/057287
PCT Pub. Date: Apr. 6, 2017

(65) Prior Publication Data
US 2018/0274753 A1 Sep. 27, 2018

(30) Foreign Application Priority Data
Sep. 29, 2015 (JP) ................................. 2015-190907

(51) Int. Cl.
| | | |
|---|---|---|
| B32B 7/02 | (2019.01) | |
| B32B 7/12 | (2006.01) | |
| B32B 7/08 | (2019.01) | |
| B32B 27/18 | (2006.01) | |
| B32B 37/12 | (2006.01) | |
| B32B 27/36 | (2006.01) | |
| G02B 5/00 | (2006.01) | |
| C09K 11/06 | (2006.01) | |
| H05B 33/12 | (2006.01) | |
| F21V 9/06 | (2018.01) | |
| F21V 9/08 | (2018.01) | |
| F21V 9/38 | (2018.01) | |
| F21V 9/32 | (2018.01) | |
| F21V 9/30 | (2018.01) | |
| H01L 51/50 | (2006.01) | |
| B29D 11/00 | (2006.01) | |
| G02B 5/20 | (2006.01) | |
| H01L 33/50 | (2010.01) | |
| B32B 27/08 | (2006.01) | |
| B32B 27/30 | (2006.01) | |
| G02F 1/13357 | (2006.01) | |
| H01L 51/52 | (2006.01) | |
| H01L 27/32 | (2006.01) | |
| F21Y 115/10 | (2016.01) | |
| B29K 83/00 | (2006.01) | |
| B29K 623/00 | (2006.01) | |
| B29K 667/00 | (2006.01) | |

(52) U.S. Cl.
CPC ............ *B29D 11/0073* (2013.01); *B32B 7/02* (2013.01); *B32B 7/12* (2013.01); *B32B 27/08* (2013.01); *B32B 27/306* (2013.01); *B32B 27/36* (2013.01); *B32B 37/12* (2013.01); *C09K 11/06* (2013.01); *F21V 9/06* (2013.01); *F21V 9/08* (2013.01); *F21V 9/32* (2018.02); *F21V 9/38* (2018.02); *G02B 5/20* (2013.01); *G02F 1/133621* (2013.01); *H01L 33/502* (2013.01); *H01L 51/50* (2013.01); *B29K 2083/00* (2013.01); *B29K 2623/086* (2013.01); *B29K 2667/003* (2013.01); *B32B 2383/00* (2013.01); *B32B 2551/00* (2013.01); *C09K 2211/1007* (2013.01); *C09K 2211/1022* (2013.01); *F21Y 2115/10* (2016.08); *G02F 2001/133614* (2013.01); *H01L 27/322* (2013.01); *H01L 51/5253* (2013.01)

(58) Field of Classification Search
None
See application file for complete search history.

(56) References Cited

U.S. PATENT DOCUMENTS

| | | |
|---|---|---|
| 5,446,157 A | 8/1995 | Morgan et al. |
| 9,711,665 B2 | 7/2017 | Wagenblast et al. |
| 2003/0027016 A1* | 2/2003 | Ara .................... H01L 51/0054 428/690 |

(Continued)

FOREIGN PATENT DOCUMENTS

| | | |
|---|---|---|
| CN | 103517964 A | 1/2014 |
| CN | 107614659 A | 1/2018 |

(Continued)

OTHER PUBLICATIONS

Chinese Office Action for Chinese Application No. 201680056343.7, dated Mar. 11, 2019, with translation, 18 pages.

(Continued)

*Primary Examiner* — Sheeba Ahmed
(74) *Attorney, Agent, or Firm* — RatnerPrestia

(57) ABSTRACT

A color conversion film converts incident light into light with a wavelength longer than that of the incident light. The color conversion film is a laminate film including the following Layer(A) and Layer (B):

Layer (A): a color conversion layer as a continuous layer containing at least one organic light-emitting material and a binder resin; and Layer (B): a transparent resin layer with an oxygen permeability of 1.0 cc/m²·day·atm or less.

20 Claims, 4 Drawing Sheets

(56) References Cited

U.S. PATENT DOCUMENTS

| | | | |
|---|---|---|---|
| 2004/0051781 A1* | 3/2004 | Kawaguchi | G02B 5/201 348/34 |
| 2011/0135958 A1 | 6/2011 | Okada et al. | |
| 2013/0252024 A1 | 9/2013 | Okada et al. | |
| 2014/0076397 A1 | 3/2014 | Wagenblast et al. | |
| 2018/0134952 A1 | 5/2018 | Ichihashi et al. | |

FOREIGN PATENT DOCUMENTS

| | | |
|---|---|---|
| JP | 08509471 A | 10/1996 |
| JP | 2000208262 A | 7/2000 |
| JP | 2001164245 A | 6/2001 |
| JP | 2002317175 A | 10/2002 |
| JP | 2002348568 A | 12/2002 |
| JP | 2007090663 A | 4/2007 |
| JP | 2007273440 A | 10/2007 |
| JP | 2010061824 A | 3/2010 |
| JP | 2011241160 A | 12/2011 |
| JP | 2012022028 A | 2/2012 |
| JP | 2014136771 A | 7/2014 |
| JP | 2014519191 A | 8/2014 |
| TW | 201301578 A | 1/2013 |
| WO | 2009116456 A1 | 9/2009 |
| WO | 2011013474 A1 | 2/2011 |
| WO | 2012168395 A1 | 12/2012 |
| WO | 2013182968 A1 | 12/2013 |
| WO | 2015019270 A1 | 2/2015 |

OTHER PUBLICATIONS

International Search Report and Written Opinion for International Application No. PCT/JP2016/078296, dated Dec. 13, 2016, 6 pages.
Taiwanese Office Action for Taivvanese Application No. 165131192, dated Feb. 5, 2020, 9 pages.

* cited by examiner

COLOR CONVERSION FILM AND LIGHT SOURCE UNIT INCLUDING THE SAME, DISPLAY, AND LIGHTING APPARATUS

CROSS REFERENCE TO RELATED APPLICATIONS

This is the U.S. National Phase application of PCT/JP2016/078296, filed Sep. 26, 2016, which claims priority to Japanese Patent Application No. 2015-190907, filed Sep. 29, 2015, the disclosures of these applications being incorporated herein by reference in their entireties for all purposes.

TECHNICAL FIELD OF THE INVENTION

The present invention relates to a color conversion film and a light source unit including the same, a display, and a lighting apparatus.

BACKGROUND OF THE INVENTION

Application of a multicoloring technique by a color conversion method to liquid crystal displays, organic electroluminescence (EL) displays, lighting apparatuses, and the like is being energetically studied. Color conversion means converting light emission from a light-emitting body into light with a longer wavelength and means converting blue light emission into green or red light emission, for example.

A film having this color conversion function is combined with a blue light source, for example, whereby the three primary colors of blue, green, and red can be extracted, that is, white light can be extracted from the blue light source. A white light source obtained by combining the blue light source and the film having the color conversion function with each other forms a light source unit, and this light source unit, a liquid crystal drive part, and color filters are combined with each other, whereby a full-color display can be produced. Without the liquid crystal drive part, the residual part can be used as a white light source as it is, which can be used as the white light source such as LED lighting.

Improvement in color reproducibility is a problem in liquid crystal displays using the color conversion method. Narrowing the full width at half maximum of the respective emission spectra of blue, green, and red of the light source unit to increase the color purity of each of blue, green, and red is effective in improving color reproducibility.

To solve this problem, disclosed is a technique that uses quantum dots formed of inorganic semiconductor fine particles as a component of a color conversion film (refer to Patent Literature 1, for example). Although the technique using the quantum dots indeed is narrow in the full width at half maximum of green and red emission spectra to improve color reproducibility, the quantum dots are vulnerable to heat, and water and oxygen in the air and are thus deficient in durability on the other hand. In addition, containing cadmium is another problem.

Also developed is a technique that uses a light-emitting material formed of an organic substance as a component of the color conversion film in place of the quantum dots. Disclosed as examples of the technique that uses an organic light-emitting material as the component of the color conversion film are one that uses a pyridine-phthaliraide condensation product (refer to Patent Literature 2, for example), one that uses a coumarin derivative (refer to Patent Literature 3, for example), for a red light-emitting material, one that uses a perylene derivative (refer to Patent Literature 4, for example), one that uses a rhodamine derivative (refer to Patent Literature 5, for example), and one that uses a pyrromethene derivative (refer to Patent Literature 6 and 7, for example).

CITATION LIST

Patent Literature

Patent Literature 1: Japanese Laid-open Patent Publication No. 2012-22028
Patent Literature 2: Japanese Laid-open Patent Publication No. 2002-348568
Patent Literature 3: Japanese Laid-open Patent Publication No. 2007-273440
Patent Literature 4: Japanese Laid-open Patent Publication No. 2002-317175
Patent Literature 5: Japanese Laid-open Patent Publication No. 2001-164245
Patent Literature 6: Japanese Laid-open Patent Publication No. 2011-241160
Patent Literature 7: Japanese Laid-open Patent Publication No. 2014-136771

SUMMARY OF THE INVENTION

However, even these organic light-emitting materials are still insufficient in view of achieving both color reproducibility and durability. In particular, deficient is a technique that also achieves durability when an organic light-emitting material that exhibits light emission with high color purity is used as a component of a color conversion film.

A problem to be solved by the present invention is to achieve both improvement in color reproducibility and durability in a color conversion film used for displays, lighting apparatuses, and the like and, in particular, to achieve both the light emission with high color purity and durability of an organic light-emitting material.

To solve the problem and achieve the object, a color conversion film according to the present invention is a color conversion film that converts incident light into light with a wavelength longer than that of the incident light, the color conversion film being a laminate film including the following Layer (A) and Layer (B):

Layer (A): a color conversion layer as a continuous layer containing at least one organic light-emitting material and a binder resin; and
Layer (B): a transparent resin layer with an oxygen permeability of 1.0 cc/m$^2$·day·atm or less.

The color conversion film according to the present invention is the above invention, in which the Layer (A) and the Layer (B) are laminated in order of the Layer (B), the Layer (A), and the Layer (B).

The color conversion film according to the present invention is the above invention, in which a transparent resin contained in the Layer (B) contains polyvinyl alcohol or an ethylene-vinyl alcohol copolymer.

The color conversion film according to the present invention is the above invention, in which a transparent resin contained in the Layer (B) is a polyol-based resin.

The color conversion film according to the present invention is the above invention, in which a transparent resin contained in the Layer (B) is a polyol-based resin, and the polyol-based resin is a resin having a weight ratio of a hydroxy group in the resin of 20% or more.

The color conversion film according to the present invention is the above invention, in which a transparent resin contained in the Layer (B) is a polyol-based resin, and the polyol-based resin is polyvinyl alcohol or an ethylene-vinyl alcohol copolymer.

The color conversion film according to the present invention is the above invention, in which the Layer (B) is a cured object layer of a polyol-based resin and a resin composition containing a silicon compound represented by General Formula (6) and a hydrolysate of the silicon compound.

(where $R^{12}$s are the same as or different from each other, and are selected from the group consisting of hydrogen, an alkyl group, a cycloalkyl group, an alkenyl group, a cycloalkenyl group, and a silyl group; $L^1$s are the same as or different from each other, and are selected from a single bond, an alkylene group, and a phenylene group; Ys are the same as or different from each other, and are selected from the group consisting of hydrogen, an alkyl group, a cycloalkyl group, a heterocyclic group, an alkenyl group, a cycloalkenyl group, an alkynyl group, a hydroxy group, a thiol group, a glycidyl group, an alkoxy group, an alkylthio group, a glycidyl ether group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a boryl group, and a phosphine oxide group; and n is an integer of 0 or more and 4 or less).

The color conversion film according to the present invention is the above invention, in which a silicon atom content in the Layer (B) is 1 wt % or more and 20 wt % or less.

The color conversion film according to the present invention is the above invention, in which a thickness of the Layer (B) is 100 µm or less.

The color conversion film according to the present invention is the above invention, in which the organic light-emitting material contains a compound represented by General Formula (1):

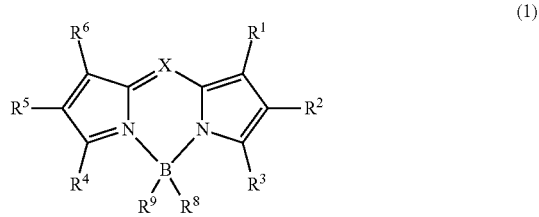

(where X is C—$R^7$ or N; $R^1$ to $R^3$ are the same as or different from each other, and are selected from hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, a phosphine oxide group, and a condensed ring and an aliphatic ring formed between adjacent substituents).

The color conversion film according to the present invention is the above invention, in which X in the General Formula (1) is C—$R^7$ in which $R^7$ is a group represented by General Formula (2):

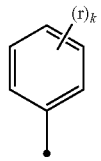

(where r is selected from the group consisting of hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, and a phosphine oxide group; k is an integer of 1 to 3; and when k is 2 or more, rs are the same as or different from each other).

The color conversion film according to the present invention is the above invention, in which $R^1$, $R^3$, $R^4$ and $R^6$ in the General Formula (1) are the same as or different from each other, and are substituted or unsubstituted phenyl groups.

The color conversion film according to the present invention is the above invention, in which $R^1$, $R^3$, $R^4$ and $R^6$ in the General Formula (1) are the same as or different from each other, and are substituted or unsubstituted alkyl groups.

A light source unit according to the present invention includes: a light source; and the color conversion film according to any one of the above-described inventions.

The light source unit according to the present invention is the above invention, in which the light source is a light-emitting diode having maximum emission in a range of 430 nm or more and 500 nm or less.

A display according to the present invention includes the light source unit according to any one of the above-described inventions.

A lighting apparatus according to the present invention includes the light source unit according to any one of the above-described inventions.

The color conversion film achieves both light emission with high color purity and durability and thus produces an effect of making it possible to achieve both high color reproducibility and high durability. The light source unit, the display, and the lighting apparatus according to the present invention use the color conversion film and thus produce an effect of making it possible to achieve both high color reproducibility and high durability.

DETAILED DESCRIPTION OF CERTAIN EMBODIMENTS OF THE INVENTION

The following specifically describes preferred embodiments of a color conversion film, a light source unit including the same, a display, and a lighting apparatus according to the present invention. The present invention is not limited to the following embodiments and can be performed in a variously modified manner in accordance with objects and uses.

<Color Conversion Film>

The color conversion film according to the embodiment of the present invention is a laminate film that converts incident light from a light-emitting body such as a light source into light with a wavelength longer than that of this incident light and includes Layer (A) as a color conversion layer and Layer (B) as a transparent resin layer having oxygen barrier property. In the present invention, the color conversion film may include a plurality of Layers (A) or a plurality of Layers (B); when a plurality of layers are included, they are optionally the same as or different from each other in composition, function, and film thickness in each of Layers (A) and Layers (B). The color conversion film may include a plurality of kinds of Layers (A) having different functions such as a color conversion layer (First Layer (A)) that converts blue light from the light-emitting body into green light and a color conversion layer (Second Layer (A)) that converts blue light or green light from the light-emitting body into red light, for example. Similarly, the color conversion film may include a plurality of kinds of Layers (B) having different compositions such as First Layer (B) and Second Layer (B) formed of different resins.

Figure 1:
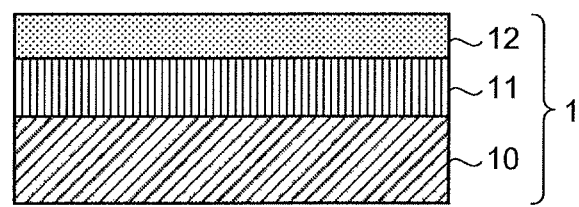
FIG. 1 is a schematic sectional view of an example of a color conversion film according to an embodiment of the present invention.

There are three representative structural examples of the color conversion film according to the embodiment of the present invention, for example. FIG. 1 is a schematic sectional view of an example of the color conversion film according to the embodiment of the present invention. This color conversion film 1 exemplified in FIG. 1 is a laminate of a base layer 10, a color conversion layer 11, and an oxygen barrier transparent resin layer 12. In this structural example of the color conversion film 1, a laminate of the color conversion layer 11 and the oxygen barrier transparent resin layer 12 is laminated in order of the color conversion layer 11 and the oxygen barrier transparent resin layer 12 on the base layer 10. In other words, the laminate of the color conversion layer 11 and the oxygen barrier transparent resin layer 12 exemplified in FIG. 1 is a laminate laminated in order of Layer (B)/Layer (A).

Figure 2:
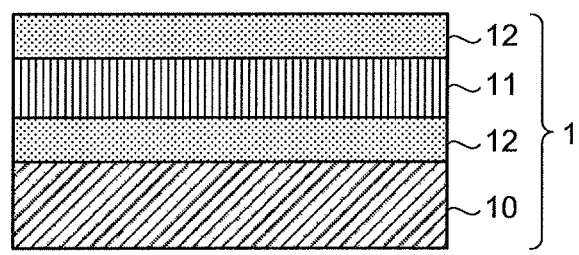
FIG. 2 is a schematic sectional view of another example of the color conversion film according to the embodiment of the present invention.

FIG. 2 is a schematic sectional view of another example of the color conversion film according to the embodiment of the present invention. The color conversion film 1 exemplified in FIG. 2 is a laminate of the base layer 10, a color conversion layer 11, and a plurality of oxygen barrier transparent resin layers 12. In this structural example of the color conversion film 1, a laminate of the color conversion layer 11 and a plurality of the oxygen barrier transparent resin layers 12 is laminated in order of the oxygen barrier transparent resin layer 12, the color conversion layer 11, and the oxygen barrier transparent resin layer 12 on the base layer 10. In other words, the laminate of the color conversion layer 11 and the oxygen barrier transparent resin layers 12 exemplified in FIG. 2 is a laminate laminated in order of Layer (B)/Layer (A)/Layer (B).

Figure 3:
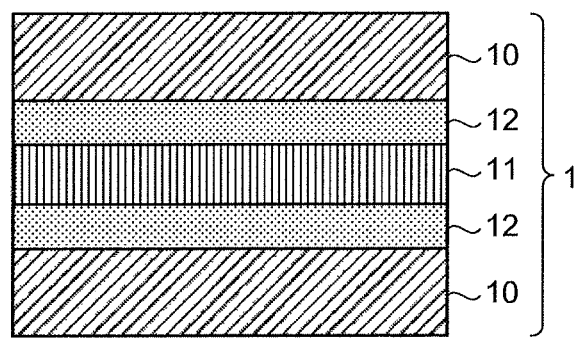
FIG. 3 is a schematic sectional view of still another example of the color conversion film according to the embodiment of the present invention.

FIG. 3 is a schematic sectional view of still another example of the color conversion film according to the embodiment of the present invention. The color conversion film 1 exemplified in FIG. 3 is a laminate of a plurality of base layers 10, the color conversion layer 11, and a plurality of oxygen barrier transparent resin layers 12. In this structural example of the color conversion film 1, a laminate of the color conversion layer 11 and a plurality of the oxygen barrier transparent resin layers 12 is laminated in order of the oxygen barrier transparent resin layer 12, the color conversion layer 11, and the oxygen barrier transparent resin layer 12 on the base layer 10. In other words, the laminate of the color conversion layer 11 and a plurality of the oxygen barrier transparent resin layers 12 exemplified in FIG. 3 is a laminate with a lamination order of Layer (B)/Layer (A)/Layer (B). As exemplified in FIG. 3, the base layer 10 is laminated on the oxygen barrier transparent resin layer 12 of this laminate. In other words, the color conversion film 1 exemplified in FIG. 3 is a laminate in which the laminate of the color conversion layer 11 and a plurality of the oxygen barrier transparent resin layers 12 is placed between the base layers 10.

In the color conversion film 1 exemplified in FIG. 1 to FIG. 3, the color conversion layer 11 corresponds to Layer (A) of the present invention. The oxygen barrier transparent resin layer 12 is a transparent resin layer having oxygen barrier property that inhibits oxygen permeation and corresponds to Layer (B) of the present invention.

Examples of the structural example of the color conversion film according to the embodiment of the present invention include structures in which Layer (A) or Layer (B) is continuous, such as Layer (B)/Layer (A)/Layer (A), Layer (B)/Layer (B)/Layer (A), and Layer (B)/Layer (B)/Layer (A)/Layer (A) apart from the structural examples of the color conversion film 1 exemplified in FIG. 1 to FIG. 3.

These are by way of example, and specific configurations of the color conversion film according to the embodiment of the present invention are not limited to these examples; configurations modified as appropriate based on matters derived from the following description are also included in the scope of the present invention.

<Layer (A)>

Layer (A) included in the color conversion film according to the embodiment of the present invention contains at least one organic light-emitting material and a binder resin and functions as the color conversion layer that converts incident light into light with a wavelength longer than that of the incident light.

Layer (A) included in the color conversion film according to the embodiment of the present invention is a continuous layer. The continuous layer refers to a layer that is not divided. When the layer containing the organic light-emitting material and the binder resin is present in a patterned manner within the same plane, for example, it is a divided layer and does not correspond to the continuous layer referred to in the present invention. When the layer is integral as a whole, although gaps and indentations are partially present, it corresponds to the continuous layer.

The film thickness of Layer (A), which is not limited to a particular thickness, is preferably 10 to 1,000 µm in view of the toughness of the film and the easiness of shaping. In view of increasing heat resistance, the film thickness of Layer (A) is preferably 200 μm or less, more preferably 100 μm or less, and further preferably 50 μm or less.

The film thicknesses of the respective layers in the present invention refer to a film thickness (an average film thickness) measured based on Method A for measuring thickness by mechanical scanning in JIS K 7130 (1999) Plastics—Film and sheeting—Determination of Thickness. The same holds true for the following description.

(A-1. Organic Light-Emitting Material)

Layer (A) contains at least one organic light-emitting material. The light-emitting material in the present invention refers to a material that, when being irradiated with some light, emits light with a wavelength different from that of the light. To achieve highly efficient color conversion, the light-emitting material preferably exhibits light emission characteristics with high quantum yield. Examples of the light-emitting material generally include known light-emitting materials such as inorganic fluorescent bodies, fluorescent pigments, fluorescent dyes, and quantum dots; the organic light-emitting material in view of dispersion uniformity, a reduction in the amount of use, and a reduction in environmental loads.

Examples of the organic light-emitting material include the following ones. Preferred examples of the organic light-emitting material include compounds having a condensed aryl ring such as naphthalene, anthracene, phenanthrene, pyrene, chrysene, naphthacene, triphenylene, perylene, fluoranthene, fluorene, and indene and derivatives thereof. Preferred examples of the organic light-emitting material include compounds having a heteroaryl ring such as furan, pyrrole, thiophene, silole, 9-silafluorene, 9,9'-spirobisilafluorene, benzothiophene, benzofuran, indole, dibenzothiophene, dibenzofuran, imidazopyridine, phenanthroline, pyridine, pyrazine, naphthyridine, quinoxaline, and pyrrolopyridine, derivatives thereof, and borane derivatives. Preferred examples of the organic light-emitting material include stilbene derivatives such as 1,4-distyrylbenzene, 4,4'-bis(2-(4-diphenylaminophenyl)ethenyl)biphenyl, and 4,4'-bis(N-(stilben-4-yl)-N-phenylamino)stilbene, aromatic acetylene derivatives, tetraphenyl butadiene derivatives, aldazine derivatives, pyrromethene derivatives, and diketopyrolo[3,4-c]pyrrole derivatives. Preferred examples of the organic light-emitting material include coumarin derivatives such as coumarin 6, coumarin 7, and coumarin 153, azole derivatives such as imidazole, thiazole, thiadiazole, carbazole, oxazole, oxadiazole, and triazole and metal complexes thereof, cyanine-based compounds such as indocyanine green, xanthene-based compounds such as fluorescein, eosine, and rhodamine, and thioxanthene-based compounds. Preferred examples of the organic light-emitting material include polyphenylene-based compounds, naphthalimide derivatives, phthalocyanine derivatives and metal complexes thereof, porphyrin derivatives and metal complexes thereof, oxazine-based compounds such as Nile Red and Nile Blue, helicene-based compounds, and aromatic amine derivatives such as N,N'-diphenyl-N,N'-di(3-methylphenyl)-4,4'-diphenyl-1,1'-diamine. Preferred examples of the organic light-emitting material include organic metal complex compounds of iridium (Ir), ruthenium (Ru), rhodium (Rh), palladium (Pd), platinum (Pt), osmium (Os), rhenium (Re), and the like. However, the organic light-emitting material of the present invention is not limited to these compounds.

The organic light-emitting material may be a fluorescent light-emitting material or a phosphorescent light-emitting material; to achieve high color purity, a fluorescent light-emitting material is preferred. Among these materials, preferred are compounds having a condensed aryl ring or derivatives thereof because of high thermal stability and photostability.

In view of solubility and the versatility of molecular structure, compounds having a coordinated bond are preferred as the organic light-emitting material. In view of being small in the full width at half maximum and the capability of giving highly efficient light emission, also preferred are compounds containing boron such as boron fluoride complexes. Among them, pyrromethene derivatives are preferred in view of giving high fluorescence quantum yield and being favorable in durability. More preferred is a compound represented by General Formula (1).

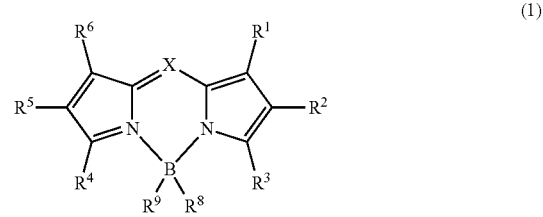

(1)

When the organic light-emitting material contains the compound represented by General Formula (1), in General Formula (1), X is C—$R^7$ or N. $R^1$ to $R^9$ may be the same as or different from each other and are selected from hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, a phosphine oxide group, and a condensed ring and an aliphatic ring formed between adjacent substituents.

In all the above groups, the hydrogen may be deuterium. This holds true for compounds or partial structures thereof described below. In the following description, a substituted or unsubstituted $C_{6-40}$ aryl group, for example, is an aryl group all the carbon number of which is 6 to 40 including the carbon number included in a substituent by which the aryl group is substituted. This holds true for other substituents defining the carbon number.

In all the above groups, a substituent when they are substituted is preferably an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, a phosphine oxide group, or further, a specific substituent described as preferred in the descriptions of the respective substituents. These substituents may be further substituted by the substituents described above.

"Unsubstituted" in "substituted or unsubstituted" means that a hydrogen atom or deuterium atom has substituted. The above holds true for cases described as "substituted or unsubstituted" in the compounds or partial structures thereof described below.

In all the above groups, the alkyl group refers to a saturated aliphatic hydrocarbon group such as a methyl group, an ethyl group, a n-propyl group, an isopropyl group, a n-butyl group, a sec-butyl group, or a tert-butyl group, which optionally has a substituent. An additional substituent when it is substituted is not limited to a particular substituent, and examples thereof include an alkyl group, halogen, an aryl group, and a hetercaryl group, which is common to the following description. The carbon number of the alkyl group, which is not limited to a particular number, is in the range of preferably 1 or more and 20 or less and more preferably 1 or more and 8 or less in view of availability and cost.

The cycloalkyl group refers to a saturated alicyclic hydrocarbon group such as a cyclopropyl group, a cyclohexyl group, a norbornyl group, or an adamantyl group, which optionally has a substituent. The carbon number of the alkyl group part, which is not limited to a particular number, is preferably in the range of 3 or more and 20 or less.

The heterocyclic group refers to an aliphatic ring having an atom other than carbon within its ring such as a pyran ring, a piperidine ring, or a cyclic amide, which optionally has a substituent. The carbon number of the heterocyclic group, which is not limited to a particular number, is preferably in the range of 2 or more and 20 or less.

The alkeny group refers to an unsaturated aliphatic hydrocarbon group containing a double bond such as a vinyl group, an allyl group, or a butadienyl group, which optionally has a substituent. The carbon number of the alkenyl group, which is not limited to a particular number, is preferably in the range of 2 or more and 20 or less.

The cycloalkenyl group refers to an unsaturated alicyclic hydrocarbon group containing a double bond such as a cyclopentenyl group, a cyclopentadienyl group, or a cyclohexenyl group, which optionally has a substituent.

The alkynyl group refers to an unsaturated aliphatic hydrocarbon group containing a triple bond such as an ethynyl group, which optionally has a substituent. The carbon number of the alkynyl group, which is not limited to a particular number, is preferably in the range of 2 or more and 20 or less.

The alkoxy group refers to a functional group to which an aliphatic hydrocarbon group bonds through an ether bond such as a methoxy group, an ethoxy group, or a propoxy group, and this aliphatic hydrocarbon group optionally has a substituent. The carbon number of the alkoxy group, which is not limited to a particular number, is preferably in the range of 1 or more and 20 or less.

The alkylthio group is a group in which the oxygen atom of the ether bond of the alkoxy group is substituted by a sulfur atom. The hydrocarbon group of the alkylthio group optionally has a substituent. The carbon number of the alkylthio group, which is not limited to a particular number, is preferably in the range of 1 or more and 20 or less.

The aryl ether group refers to a function group to which an aromatic hydrocarbon group bonds through an ether bond such as a phenoxy group, and the aromatic hydrocarbon group optionally has a substituent. The carbon number of the aryl ether group, which is not limited to a particular number, is preferably in the range of 6 or more and 40 or less.

The aryl thioether group is a group in which the oxygen atom of the ether bond of the aryl ether group is substituted by a sulfur atom. The aromatic hydrocarbon group of the aryl thioether group optionally has a substituent. The carbon number of the aryl thioether group, which is not limited to a particular number, is preferably in the range of 6 or more and 40 or less.

The aryl group refers to an aromatic hydrocarbon group such as a phenyl group, a biphenyl group, a terphenyl group, a naphthyl group, a fluorenyl group, a benzofluorenyl group, a dibenzofluorenyl group, a phenanthryl group, an anthracenyl group, a benzophenanthryl group, a benzoanthracenyl group, a crycenyl group, a pyrenyl group, a fluoranthenyl group, a triphenylenyl group, a benzofluoranthenyl group, a dibenzoanthracenyl group, a perylenyl group, or a helicenyl group. Among them, preferred are a phenyl group, a biphenyl group, a terphenyl group, a naphthyl group, a fluorenyl group, a phenanthryl group, an anthracenyl group, a pyrenyl group, a fluoranthenyl group, and a triphenylenyl group. The aryl group optionally has a substituent. The carbon number of the aryl group, which is not limited to a particular number, is in the range of preferably 6 or more and 40 or less and more preferably 6 or more and 30 or less.

When $R^1$ to $R^9$ are each a substituted or unsubstituted aryl group, the aryl group is preferably a phenyl group, a biphenyl group, a terphenyl group, a naphthyl group, a fluorenyl group, a phenanthryl group, or an anthracenyl group, more preferably a phenyl group, a biphenyl group, a terphenyl group, or a naphthyl group, further preferably a phenyl group, a biphenyl group, or a terphenyl group, and particularly preferably a phenyl group.

When each of the substituents is further substituted by an aryl group, the aryl group is preferably a phenyl group, a biphenyl group, a terphenyl group, a naphthyl group, a fluorenyl group, a phenanthryl group, or an anthracenyl group, more preferably a phenyl group, a biphenyl group, a terphenyl group, or a naphthyl group, and particularly preferably a phenyl group.

The heteroaryl group refers to a cyclic aromatic group having one or more atoms other than carbon within its ring such as a pyridyl group, a furanyl group, a thiophenyl group, a quinolinyl group, an isoquinolinyl group, a pyrazinyl group, a pyrimidyl group, a pyridazinyl group, a triazinyl group, a naphthyridinyl group, a cinnolinyl group, a phthalazinyl group, a quinoxalinyl group, a quinazolinyl group, a benzofuranyl group, a benzothiophenyl group, an indolyl group, a dibenzofuranyl group, a dibenzothiophenyl group, a carbazolyl group, a benzocarbazolyl group, a carbolinyl group, an indolocarbazolyl group, a benzofurocarbazolyl group, a benzothienocarbazolyl group, a dihydroindenocarbazolyl group, a benzoquinolinyl group, an acridinyl group, a dibenzoacridinyl group, a benzimidazolyl group, an imidazopyridyl group, a benzoxazolyl group, a benzothiazolyl group, or a phenanthrolinyl group. The naphthyridinyl group refers to any of a 1,5-naphthyridinyl group, a 1,6-naphthyridinyl group, a 1,7-naphthyridinyl group a 1,8-naphthyridinyl group, a 2,6-naphthyridinyl group, or a 2,7-naphthyridinyl group. The heteroaryl group optionally has a substituent. The carbon number of the heteroaryl group which is not limited to a particular number, is in the range of preferably 2 or more and 40 or less and more preferably 2 or more and 30 or less.

When $R^1$ to $R^9$ are each a substituted or unsubstituted heteroaryl group, the heteroaryl group is preferably a pyridyl group, a furanyl group, a thiophenyl group, a quinolinyl group, a pyrimidyl group, a triazinyl group, a benzofuranyl group, a benzothiophenyl group, an indolyl group, a dibenzofuranyl group, a dibenzothiophenyl group, a carbazolyl group, a benzimidazolyl group, an imidazopyridyl group, a benzoxazolyl group, a benzothiazolyl group, or a phenanthrolinyl group, more preferably a pyridyl group, a furanyl group, a thiophenyl group, or a quinolinyl group, and particularly preferably a pyridyl group.

When each of the substituents is further substituted by a heteroaryl group, the heteroaryl group is preferably a pyridyl group, a furanyl group, a thiophenyl group, a quinolinyl group, a pyrimidyl group, a triazinyl group, a benzofuranyl group, a benzothiophenyl group, an indolyl group, a dibenzofuranyl group, a dibenzothiophenyl group, a carbazolyl group, a benzimidazolyl group, an imidazopyridyl group, a benzoxazolyl group, a benzothiazolyl group, or a phenanthrolinyl group, more preferably a pyridyl group, a furanyl group, a thiophenyl group, or a quinolinyl group, and particularly preferably a pyridyl group.

The halogen refers to an atom selected from fluorine, chlorine, bromine, and iodine. The carbonyl group, the carboxy group, the oxycarbonyl group, and the carbamoyl group each optionally have a substituent. Examples of the substituent include an alkyl group, a cycloalkyl group, an aryl group, and a heteroaryl group, and these substituents may be further substituted.

The amino group is a substituted or unsubstituted amino group. The amino group optionally has a substituent; examples of the substituent when it is substituted include an aryl group, a heteroaryl group, a linear alkyl group, and a branched alkyl group. The aryl group and the heteroaryl group are preferably a phenyl group, a naphthyl group, a pyridyl group, or a quinolinyl group. These substituents may be further substituted. The carbon number, which is not limited to a particular number, is in the range of preferably 2 or more and 50 or less, more preferably 6 or more and 40 or less, and particularly preferably 6 or more and 30 or less.

The silyl group refers to an alkyl silyl group such as a trimethylsilyl group, a triethylsilyl group, a tert-butyl dimethyl silyl group, a propyl dimethyl silyl group, or a vinyl dimethyl silyl group and an aryl silyl group such as a phenyl dimethyl silyl group, a tert-butyl diphenyl silyl group, a triphenyl silyl group, or a trinaphthyl silyl group. The substituent on the silicon may be further substituted. The carbon number of the silyl group, which is not limited to a particular number, is preferably in the range of 1 or more and 30 or less.

The siloxanyl group refers to a silicide through an ether bond such as trimethylsiloxanyl group. The substituent on the silicon may be further substituted. The boryl group is a substituted or unsubstituted boryl group. The boryl group optionally has a substituent; examples of the substituent when it is substituted include an aryl group, a heteroaryl group, a linear alkyl group, a branched alkyl group, an aryl ether group, an alkoxy group, and a hydroxy group. Among them, preferred are an aryl group and an aryl ether group. The phosphine oxide group is a group represented by —P(=O)$R^{10}R^{11}$. $R^{10}R^{11}$ are each selected from a group similar to that for $R^1$ to $R^9$.

The condensed ring formed between adjacent substituents refers to mutual bonding between any two adjacent substituents ($R^1$ and $R^2$ in General Formula (1), for example) forming a conjugated or non-conjugated cyclic skeleton. The element of the condensed ring may contain an element selected from nitrogen, oxygen, sulfur, phosphorous, and silicon apart from carbon. The condensed ring may further condense with another ring.

The compound represented by General Formula (1) exhibits high fluorescence quantum yield and is small in the peak full width at half maximum of an emission spectrum, thus enabling both efficient color conversion and high color purity to be achieved. Furthermore, the compound represented by General Formula (1), by introducing an appropriate substituent to an appropriate position, enables various characteristics and properties such as emission efficiency, color purity, thermal stability, photostability, and dispersibility to be adjusted. A case in which at least one of $R^1$, $R^3$, $R^4$, and $R^6$ is a substituted or unsubstituted alkyl group, a substituted or unsubstituted aryl group, or a substituted or unsubstituted heteroaryl group exhibits better thermal stability and photostability compared with a case in which all $R^1$, $R^3$, $R^4$, and $R^6$ are hydrogens, for example.

When at least one of $R^1$, $R^3$, $R^4$, and $R^6$ is a substituted or unsubstituted alkyl group, the alkyl group is preferably a $C_{1-6}$ alkyl group such as a methyl group, an ethyl group, a n-propyl group, an isopropyl group, a n-butyl group, a sec-butyl group, a tert-butyl group, a pentyl group, or a hexyl group. Furthermore, this alkyl group is preferably a methyl group, an ethyl group, a n-propyl group, an isopropyl group, a n-butyl group, a sec-butyl group, or a tert-butyl group in view of being excellent in thermal stability. In view of preventing concentration quenching to improve fluorescence quantum yield, this alkyl group is more preferably a tert-butyl group, which is sterically bulky. In view of the easiness of synthesis and raw material availability, this alkyl group is also preferably a methyl group.

When at least one of $R^1$, $R^3$, $R^4$, and $R^6$ is a substituted or unsubstituted aryl group, the aryl group is preferably a phenyl group, a biphenyl group, a terphenyl group, or a naphthyl group, further preferably a phenyl group or a biphenyl group, and particularly preferably a phenyl group.

When at least one of $R^1$, $R^3$, $R^4$, and $R^6$ is a substituted or unsubstituted heteroaryl group, the heteroaryl group is preferably a pyridyl group, a quinolinyl group, or a thiophenyl group, further preferably a pyridyl group or a quinolinyl group, and particularly preferably a pyridyl group.

When all $R^1$, $R^3$, $R^4$, and $R^6$ may be the same as or different from each other and are substituted or unsubstituted alkyl groups, solubility to a binder resin or a solvent is favorable, which is preferred. In this case, the alkyl group is preferably a methyl group in view of the easiness of synthesis and raw material availability.

When all $R^1$, $R^3$, $R^4$, and $R^6$, which may be the same as or different from each other, are substituted or unsubstituted aryl groups or substituted or unsubstituted heteroaryl groups, better thermal stability and photostability are exhibited, which is preferred. In this case, all $R^1$, $R^3$, $R^4$, and $R^6$, which may be the same as or different from each other, are more preferably substituted or unsubstituted aryl groups.

Although some substituents improve a plurality of properties, substituents that exhibit sufficient performance in all are limited. In particular, it is difficult to achieve both high emission efficiency and high color purity. Given these circumstances, a plurality of kinds of substituents are introduced to the compound represented by General Formula (1), whereby a compound having a balance among emission characteristics, high color purity, and the like can be obtained.

In particular, when all $R^1$, $R^3$, $R^4$, and $R^6$, which may be the same as or different from each other, are substituted or unsubstituted aryl groups, a plurality of kinds of substituents are preferably introduced, such as $R^1 \neq R^4$, $R^3 \neq R^6$, $R^1 \neq R^3$, or $R^4 \neq R^6$. In this example, "$\neq$" means that they are groups having different structures, $R^1 \neq R^4$ means that $R^1$ and $R^4$ are groups having different structures, for example. A plurality of kinds of substituents are introduced as described above, whereby an aryl group that has an influence on color purity and an aryl group that has an influence on emission efficiency can be simultaneously introduced, and fine adjustment can be made.

Among them, $R^1 \neq R^3$ or $R^4 \neq R^6$ is preferred in view of improving emission efficiency and color purity with a good balance. In this case, to the compound represented by General Formula (1), one or more aryl groups having an influence on color purity can be introduced to both pyrrole rings each, whereas an aryl group having an influence on emission efficiency can be introduced to any other position, and both of these properties can be improved to the maximum. In addition, when $R^1 \neq R^3$ or $R^4 \neq R^6$, in view of improving both heat resistance and color purity, more preferred are $R^1=R^4$ and $R^3=R^6$.

The aryl group that has an influence mainly on color purity is preferably an aryl group substituted by an electron donating group. Examples of this electron donating group include an alkyl group and an alkoxy group. In particular, a $C_{1-8}$ alkyl group or a $C_{1-8}$ alkoxy group is preferred, and more preferred are a methyl group, an ethyl group, a tert-butyl group, and a methoxy group. In view of dispersibility, a tert-butyl group and a methoxy group are particularly preferred; when these substituents are introduced as the electron donating group, quenching caused by the flocculation of molecules can be prevented in the compound represented by General Formula (1). Although the substitution position of the substituent is not limited to a particular position, the substituent is preferably bonded to the meta position or the para position relative to the position bonding to the pyrromethene skeleton, because the twist of bonding is required to be inhibited in order to increase the photostability of the compound represented by General Formula (1). The aryl group that has an influence mainly on emission efficiency is preferably an aryl group having a bulky substituent such as a tert-butyl group, an adamantyl group, or a methoxy group.

When $R^1$, $R^3$, $R^4$, and $R^6$, which may be the same as or different from each other, are substituted or unsubstituted aryl groups, $R^1$, $R^3$, $R^4$, and $R^6$, which may be the same as or different from each other, are preferably substituted or unsubstituted phenyl groups. In this case, $R^1$, $R^3$, $R^4$, and $R^6$ are each more preferably selected from the following Ar-1 to Ar-6. In this case, examples of a preferred combination of $R^1$, $R^3$, $R^4$, and $R^6$ include, but are not limited to, combinations listed in Table 1-1 to Table 1-11.

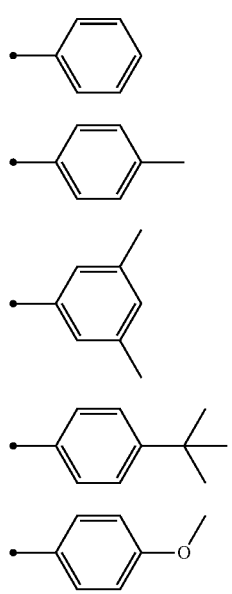

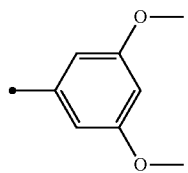

TABLE 1-1

| R1 | R3 | R4 | R6 |
|---|---|---|---|
| Ar-1 | Ar-1 | Ar-1 | Ar-1 |
| Ar-1 | Ar-1 | Ar-1 | Ar-2 |
| Ar-1 | Ar-1 | Ar-1 | Ar-3 |
| Ar-1 | Ar-1 | Ar-1 | Ar-4 |
| Ar-1 | Ar-1 | Ar-1 | Ar-5 |
| Ar-1 | Ar-1 | Ar-1 | Ar-6 |
| Ar-1 | Ar-1 | Ar-2 | Ar-1 |
| Ar-1 | Ar-1 | Ar-2 | Ar-2 |
| Ar-1 | Ar-1 | Ar-2 | Ar-3 |
| Ar-1 | Ar-1 | Ar-2 | Ar-4 |
| Ar-1 | Ar-1 | Ar-2 | Ar-5 |
| Ar-1 | Ar-1 | Ar-2 | Ar-6 |
| Ar-1 | Ar-1 | Ar-3 | Ar-1 |
| Ar-1 | Ar-1 | Ar-3 | Ar-2 |
| Ar-1 | Ar-1 | Ar-3 | Ar-3 |
| Ar-1 | Ar-1 | Ar-3 | Ar-4 |
| Ar-1 | Ar-1 | Ar-3 | Ar-5 |
| Ar-1 | Ar-1 | Ar-3 | Ar-6 |
| Ar-1 | Ar-1 | Ar-4 | Ar-1 |
| Ar-1 | Ar-1 | Ar-4 | Ar-2 |
| Ar-1 | Ar-1 | Ar-4 | Ar-3 |
| Ar-1 | Ar-1 | Ar-4 | Ar-4 |
| Ar-1 | Ar-1 | Ar-4 | Ar-5 |
| Ar-1 | Ar-1 | Ar-4 | Ar-6 |
| Ar-1 | Ar-1 | Ar-5 | Ar-1 |
| Ar-1 | Ar-1 | Ar-5 | Ar-2 |
| Ar-1 | Ar-1 | Ar-5 | Ar-3 |
| Ar-1 | Ar-1 | Ar-5 | Ar-4 |
| Ar-1 | Ar-1 | Ar-5 | Ar-5 |
| Ar-1 | Ar-1 | Ar-5 | Ar-6 |
| Ar-1 | Ar-1 | Ar-6 | Ar-1 |
| Ar-1 | Ar-1 | Ar-6 | Ar-2 |
| Ar-1 | Ar-1 | Ar-6 | Ar-3 |
| Ar-1 | Ar-1 | Ar-6 | Ar-4 |
| Ar-1 | Ar-1 | Ar-6 | Ar-5 |
| Ar-1 | Ar-1 | Ar-6 | Ar-6 |
| Ar-1 | Ar-2 | Ar-1 | Ar-2 |
| Ar-1 | Ar-2 | Ar-1 | Ar-3 |
| Ar-1 | Ar-2 | Ar-1 | Ar-4 |
| Ar-1 | Ar-2 | Ar-1 | Ar-5 |
| Ar-1 | Ar-2 | Ar-1 | Ar-6 |
| Ar-1 | Ar-2 | Ar-2 | Ar-1 |
| Ar-1 | Ar-2 | Ar-2 | Ar-2 |
| Ar-1 | Ar-2 | Ar-2 | Ar-3 |
| Ar-1 | Ar-2 | Ar-2 | Ar-4 |
| Ar-1 | Ar-2 | Ar-2 | Ar-5 |
| Ar-1 | Ar-2 | Ar-2 | Ar-6 |
| Ar-1 | Ar-2 | Ar-3 | Ar-1 |
| Ar-1 | Ar-2 | Ar-3 | Ar-2 |
| Ar-1 | Ar-2 | Ar-3 | Ar-3 |
| Ar-1 | Ar-2 | Ar-3 | Ar-4 |
| Ar-1 | Ar-2 | Ar-3 | Ar-5 |
| Ar-1 | Ar-2 | Ar-3 | Ar-6 |
| Ar-1 | Ar-2 | Ar-4 | Ar-1 |
| Ar-1 | Ar-2 | Ar-4 | Ar-2 |
| Ar-1 | Ar-2 | Ar-4 | Ar-3 |
| Ar-1 | Ar-2 | Ar-4 | Ar-4 |
| Ar-1 | Ar-2 | Ar-4 | Ar-5 |
| Ar-1 | Ar-2 | Ar-4 | Ar-6 |

TABLE 1-2

| R1 | R3 | R4 | R6 |
|---|---|---|---|
| Ar-1 | Ar-2 | Ar-5 | Ar-1 |
| Ar-1 | Ar-2 | Ar-5 | Ar-2 |
| Ar-1 | Ar-2 | Ar-5 | Ar-3 |
| Ar-1 | Ar-2 | Ar-5 | Ar-4 |
| Ar-1 | Ar-2 | Ar-5 | Ar-5 |
| Ar-1 | Ar-2 | Ar-5 | Ar-6 |
| Ar-1 | Ar-2 | Ar-6 | Ar-1 |
| Ar-1 | Ar-2 | Ar-6 | Ar-2 |
| Ar-1 | Ar-2 | Ar-6 | Ar-3 |
| Ar-1 | Ar-2 | Ar-6 | Ar-4 |
| Ar-1 | Ar-2 | Ar-6 | Ar-5 |
| Ar-1 | Ar-2 | Ar-6 | Ar-6 |
| Ar-1 | Ar-3 | Ar-1 | Ar-2 |
| Ar-1 | Ar-3 | Ar-1 | Ar-3 |
| Ar-1 | Ar-3 | Ar-1 | Ar-4 |
| Ar-1 | Ar-3 | Ar-1 | Ar-5 |
| Ar-1 | Ar-3 | Ar-1 | Ar-6 |
| Ar-1 | Ar-3 | Ar-2 | Ar-2 |
| Ar-1 | Ar-3 | Ar-2 | Ar-3 |
| Ar-1 | Ar-3 | Ar-2 | Ar-4 |
| Ar-1 | Ar-3 | Ar-2 | Ar-5 |
| Ar-1 | Ar-3 | Ar-2 | Ar-6 |
| Ar-1 | Ar-3 | Ar-3 | Ar-1 |
| Ar-1 | Ar-3 | Ar-3 | Ar-2 |
| Ar-1 | Ar-3 | Ar-3 | Ar-3 |
| Ar-1 | Ar-3 | Ar-3 | Ar-4 |
| Ar-1 | Ar-3 | Ar-3 | Ar-5 |
| Ar-1 | Ar-3 | Ar-3 | Ar-6 |
| Ar-1 | Ar-3 | Ar-4 | Ar-1 |
| Ar-1 | Ar-3 | Ar-4 | Ar-2 |
| Ar-1 | Ar-3 | Ar-4 | Ar-3 |
| Ar-1 | Ar-3 | Ar-4 | Ar-4 |
| Ar-1 | Ar-3 | Ar-4 | Ar-5 |
| Ar-1 | Ar-3 | Ar-4 | Ar-6 |
| Ar-1 | Ar-3 | Ar-5 | Ar-1 |
| Ar-1 | Ar-3 | Ar-5 | Ar-2 |
| Ar-1 | Ar-3 | Ar-5 | Ar-3 |
| Ar-1 | Ar-3 | Ar-5 | Ar-4 |
| Ar-1 | Ar-3 | Ar-5 | Ar-5 |
| Ar-1 | Ar-3 | Ar-5 | Ar-6 |
| Ar-1 | Ar-3 | Ar-6 | Ar-1 |
| Ar-1 | Ar-3 | Ar-6 | Ar-2 |
| Ar-1 | Ar-3 | Ar-6 | Ar-3 |
| Ar-1 | Ar-3 | Ar-6 | Ar-4 |
| Ar-1 | Ar-3 | Ar-6 | Ar-5 |
| Ar-1 | Ar-3 | Ar-6 | Ar-6 |
| Ar-1 | Ar-4 | Ar-1 | Ar-2 |
| Ar-1 | Ar-4 | Ar-1 | Ar-3 |
| Ar-1 | Ar-4 | Ar-1 | Ar-4 |
| Ar-1 | Ar-4 | Ar-1 | Ar-5 |
| Ar-1 | Ar-4 | Ar-1 | Ar-6 |
| Ar-1 | Ar-4 | Ar-2 | Ar-2 |
| Ar-1 | Ar-4 | Ar-2 | Ar-3 |
| Ar-1 | Ar-4 | Ar-2 | Ar-4 |
| Ar-1 | Ar-4 | Ar-2 | Ar-5 |
| Ar-1 | Ar-4 | Ar-2 | Ar-6 |
| Ar-1 | Ar-4 | Ar-3 | Ar-2 |
| Ar-1 | Ar-4 | Ar-3 | Ar-3 |
| Ar-1 | Ar-4 | Ar-3 | Ar-4 |
| Ar-1 | Ar-4 | Ar-3 | Ar-5 |
| Ar-1 | Ar-4 | Ar-3 | Ar-6 |

TABLE 1-3

| R1 | R3 | R4 | R6 |
|---|---|---|---|
| Ar-1 | Ar-4 | Ar-4 | Ar-1 |
| Ar-1 | Ar-4 | Ar-4 | Ar-2 |
| Ar-1 | Ar-4 | Ar-4 | Ar-3 |
| Ar-1 | Ar-4 | Ar-4 | Ar-4 |
| Ar-1 | Ar-4 | Ar-4 | Ar-5 |
| Ar-1 | Ar-4 | Ar-4 | Ar-6 |
| Ar-1 | Ar-4 | Ar-5 | Ar-1 |
| Ar-1 | Ar-4 | Ar-5 | Ar-2 |
| Ar-1 | Ar-4 | Ar-5 | Ar-3 |
| Ar-1 | Ar-4 | Ar-5 | Ar-4 |
| Ar-1 | Ar-4 | Ar-5 | Ar-5 |
| Ar-1 | Ar-4 | Ar-5 | Ar-6 |
| Ar-1 | Ar-4 | Ar-6 | Ar-1 |
| Ar-1 | Ar-4 | Ar-6 | Ar-2 |
| Ar-1 | Ar-4 | Ar-6 | Ar-3 |
| Ar-1 | Ar-4 | Ar-6 | Ar-4 |
| Ar-1 | Ar-4 | Ar-6 | Ar-5 |
| Ar-1 | Ar-4 | Ar-6 | Ar-6 |
| Ar-1 | Ar-5 | Ar-1 | Ar-2 |
| Ar-1 | Ar-5 | Ar-1 | Ar-3 |
| Ar-1 | Ar-5 | Ar-1 | Ar-4 |
| Ar-1 | Ar-5 | Ar-1 | Ar-5 |
| Ar-1 | Ar-5 | Ar-1 | Ar-6 |
| Ar-1 | Ar-5 | Ar-2 | Ar-2 |
| Ar-1 | Ar-5 | Ar-2 | Ar-3 |
| Ar-1 | Ar-5 | Ar-2 | Ar-4 |
| Ar-1 | Ar-5 | Ar-2 | Ar-5 |
| Ar-1 | Ar-5 | Ar-2 | Ar-6 |
| Ar-1 | Ar-5 | Ar-3 | Ar-2 |
| Ar-1 | Ar-5 | Ar-3 | Ar-3 |
| Ar-1 | Ar-5 | Ar-3 | Ar-4 |
| Ar-1 | Ar-5 | Ar-3 | Ar-5 |
| Ar-1 | Ar-5 | Ar-3 | Ar-6 |
| Ar-1 | Ar-5 | Ar-4 | Ar-2 |
| Ar-1 | Ar-5 | Ar-4 | Ar-3 |
| Ar-1 | Ar-5 | Ar-4 | Ar-4 |
| Ar-1 | Ar-5 | Ar-4 | Ar-5 |
| Ar-1 | Ar-5 | Ar-4 | Ar-6 |
| Ar-1 | Ar-5 | Ar-5 | Ar-1 |
| Ar-1 | Ar-5 | Ar-5 | Ar-2 |
| Ar-1 | Ar-5 | Ar-5 | Ar-3 |
| Ar-1 | Ar-5 | Ar-5 | Ar-4 |
| Ar-1 | Ar-5 | Ar-5 | Ar-5 |
| Ar-1 | Ar-5 | Ar-5 | Ar-6 |
| Ar-1 | Ar-5 | Ar-6 | Ar-1 |
| Ar-1 | Ar-5 | Ar-6 | Ar-2 |
| Ar-1 | Ar-5 | Ar-6 | Ar-3 |
| Ar-1 | Ar-5 | Ar-6 | Ar-4 |
| Ar-1 | Ar-5 | Ar-6 | Ar-5 |
| Ar-1 | Ar-5 | Ar-6 | Ar-6 |
| Ar-1 | Ar-6 | Ar-1 | Ar-2 |
| Ar-1 | Ar-6 | Ar-1 | Ar-3 |
| Ar-1 | Ar-6 | Ar-1 | Ar-4 |
| Ar-1 | Ar-6 | Ar-1 | Ar-5 |
| Ar-1 | Ar-6 | Ar-1 | Ar-6 |
| Ar-1 | Ar-6 | Ar-2 | Ar-2 |
| Ar-1 | Ar-6 | Ar-2 | Ar-3 |
| Ar-1 | Ar-6 | Ar-2 | Ar-4 |
| Ar-1 | Ar-6 | Ar-2 | Ar-5 |
| Ar-1 | Ar-6 | Ar-2 | Ar-6 |

TABLE 1-4

| R1 | R3 | R4 | R6 |
|---|---|---|---|
| Ar-1 | Ar-6 | Ar-3 | Ar-2 |
| Ar-1 | Ar-6 | Ar-3 | Ar-3 |
| Ar-1 | Ar-6 | Ar-3 | Ar-4 |
| Ar-1 | Ar-6 | Ar-3 | Ar-5 |
| Ar-1 | Ar-6 | Ar-3 | Ar-6 |
| Ar-1 | Ar-6 | Ar-4 | Ar-2 |
| Ar-1 | Ar-6 | Ar-4 | Ar-3 |
| Ar-1 | Ar-6 | Ar-4 | Ar-4 |
| Ar-1 | Ar-6 | Ar-4 | Ar-5 |
| Ar-1 | Ar-6 | Ar-4 | Ar-6 |
| Ar-1 | Ar-6 | Ar-5 | Ar-2 |
| Ar-1 | Ar-6 | Ar-5 | Ar-3 |
| Ar-1 | Ar-6 | Ar-5 | Ar-4 |
| Ar-1 | Ar-6 | Ar-5 | Ar-5 |
| Ar-1 | Ar-6 | Ar-5 | Ar-6 |
| Ar-1 | Ar-6 | Ar-6 | Ar-1 |
| Ar-1 | Ar-6 | Ar-6 | Ar-2 |
| Ar-1 | Ar-6 | Ar-6 | Ar-3 |
| Ar-1 | Ar-6 | Ar-6 | Ar-4 |

TABLE 1-4-continued

| R1 | R3 | R4 | R6 |
| --- | --- | --- | --- |
| Ar-1 | Ar-6 | Ar-6 | Ar-5 |
| Ar-1 | Ar-6 | Ar-6 | Ar-6 |
| Ar-2 | Ar-1 | Ar-1 | Ar-2 |
| Ar-2 | Ar-1 | Ar-1 | Ar-3 |
| Ar-2 | Ar-1 | Ar-1 | Ar-4 |
| Ar-2 | Ar-1 | Ar-1 | Ar-5 |
| Ar-2 | Ar-1 | Ar-1 | Ar-6 |
| Ar-2 | Ar-1 | Ar-2 | Ar-2 |
| Ar-2 | Ar-1 | Ar-2 | Ar-3 |
| Ar-2 | Ar-1 | Ar-2 | Ar-4 |
| Ar-2 | Ar-1 | Ar-2 | Ar-5 |
| Ar-2 | Ar-1 | Ar-2 | Ar-6 |
| Ar-2 | Ar-1 | Ar-3 | Ar-2 |
| Ar-2 | Ar-1 | Ar-3 | Ar-3 |
| Ar-2 | Ar-1 | Ar-3 | Ar-4 |
| Ar-2 | Ar-1 | Ar-3 | Ar-5 |
| Ar-2 | Ar-1 | Ar-3 | Ar-6 |
| Ar-2 | Ar-1 | Ar-4 | Ar-2 |
| Ar-2 | Ar-1 | Ar-4 | Ar-3 |
| Ar-2 | Ar-1 | Ar-4 | Ar-4 |
| Ar-2 | Ar-1 | Ar-4 | Ar-5 |
| Ar-2 | Ar-1 | Ar-4 | Ar-6 |
| Ar-2 | Ar-1 | Ar-5 | Ar-2 |
| Ar-2 | Ar-1 | Ar-5 | Ar-3 |
| Ar-2 | Ar-1 | Ar-5 | Ar-4 |
| Ar-2 | Ar-1 | Ar-5 | Ar-5 |
| Ar-2 | Ar-1 | Ar-5 | Ar-6 |
| Ar-2 | Ar-1 | Ar-6 | Ar-2 |
| Ar-2 | Ar-1 | Ar-6 | Ar-3 |
| Ar-2 | Ar-1 | Ar-6 | Ar-4 |
| Ar-2 | Ar-1 | Ar-6 | Ar-5 |
| Ar-2 | Ar-1 | Ar-6 | Ar-6 |
| Ar-2 | Ar-2 | Ar-1 | Ar-3 |
| Ar-2 | Ar-2 | Ar-1 | Ar-4 |
| Ar-2 | Ar-2 | Ar-1 | Ar-5 |
| Ar-2 | Ar-2 | Ar-1 | Ar-6 |
| Ar-2 | Ar-2 | Ar-2 | Ar-2 |
| Ar-2 | Ar-2 | Ar-2 | Ar-3 |
| Ar-2 | Ar-2 | Ar-2 | Ar-4 |
| Ar-2 | Ar-2 | Ar-2 | Ar-5 |
| Ar-2 | Ar-2 | Ar-2 | Ar-6 |

TABLE 1-5

| R1 | R3 | R4 | R6 |
| --- | --- | --- | --- |
| Ar-2 | Ar-2 | Ar-3 | Ar-2 |
| Ar-2 | Ar-2 | Ar-3 | Ar-3 |
| Ar-2 | Ar-2 | Ar-3 | Ar-4 |
| Ar-2 | Ar-2 | Ar-3 | Ar-5 |
| Ar-2 | Ar-2 | Ar-3 | Ar-6 |
| Ar-2 | Ar-2 | Ar-4 | Ar-2 |
| Ar-2 | Ar-2 | Ar-4 | Ar-3 |
| Ar-2 | Ar-2 | Ar-4 | Ar-4 |
| Ar-2 | Ar-2 | Ar-4 | Ar-5 |
| Ar-2 | Ar-2 | Ar-4 | Ar-6 |
| Ar-2 | Ar-2 | Ar-5 | Ar-2 |
| Ar-2 | Ar-2 | Ar-5 | Ar-3 |
| Ar-2 | Ar-2 | Ar-5 | Ar-4 |
| Ar-2 | Ar-2 | Ar-5 | Ar-5 |
| Ar-2 | Ar-2 | Ar-5 | Ar-6 |
| Ar-2 | Ar-2 | Ar-6 | Ar-2 |
| Ar-2 | Ar-2 | Ar-6 | Ar-3 |
| Ar-2 | Ar-2 | Ar-6 | Ar-4 |
| Ar-2 | Ar-2 | Ar-6 | Ar-5 |
| Ar-2 | Ar-2 | Ar-6 | Ar-6 |
| Ar-2 | Ar-3 | Ar-1 | Ar-3 |
| Ar-2 | Ar-3 | Ar-1 | Ar-4 |
| Ar-2 | Ar-3 | Ar-1 | Ar-5 |
| Ar-2 | Ar-3 | Ar-1 | Ar-6 |
| Ar-2 | Ar-3 | Ar-2 | Ar-3 |
| Ar-2 | Ar-3 | Ar-2 | Ar-4 |
| Ar-2 | Ar-3 | Ar-2 | Ar-5 |
| Ar-2 | Ar-3 | Ar-2 | Ar-6 |
| Ar-2 | Ar-3 | Ar-3 | Ar-2 |

TABLE 1-5-continued

| R1 | R3 | R4 | R6 |
| --- | --- | --- | --- |
| Ar-2 | Ar-3 | Ar-3 | Ar-3 |
| Ar-2 | Ar-3 | Ar-3 | Ar-4 |
| Ar-2 | Ar-3 | Ar-3 | Ar-5 |
| Ar-2 | Ar-3 | Ar-3 | Ar-6 |
| Ar-2 | Ar-3 | Ar-4 | Ar-2 |
| Ar-2 | Ar-3 | Ar-4 | Ar-3 |
| Ar-2 | Ar-3 | Ar-4 | Ar-4 |
| Ar-2 | Ar-3 | Ar-4 | Ar-5 |
| Ar-2 | Ar-3 | Ar-4 | Ar-6 |
| Ar-2 | Ar-3 | Ar-5 | Ar-2 |
| Ar-2 | Ar-3 | Ar-5 | Ar-3 |
| Ar-2 | Ar-3 | Ar-5 | Ar-4 |
| Ar-2 | Ar-3 | Ar-5 | Ar-5 |
| Ar-2 | Ar-3 | Ar-5 | Ar-6 |
| Ar-2 | Ar-3 | Ar-6 | Ar-2 |
| Ar-2 | Ar-3 | Ar-6 | Ar-3 |
| Ar-2 | Ar-3 | Ar-6 | Ar-4 |
| Ar-2 | Ar-3 | Ar-6 | Ar-5 |
| Ar-2 | Ar-3 | Ar-6 | Ar-6 |
| Ar-2 | Ar-4 | Ar-1 | Ar-3 |
| Ar-2 | Ar-4 | Ar-1 | Ar-4 |
| Ar-2 | Ar-4 | Ar-1 | Ar-5 |
| Ar-2 | Ar-4 | Ar-1 | Ar-6 |
| Ar-2 | Ar-4 | Ar-2 | Ar-3 |
| Ar-2 | Ar-4 | Ar-2 | Ar-4 |
| Ar-2 | Ar-4 | Ar-2 | Ar-5 |
| Ar-2 | Ar-4 | Ar-2 | Ar-6 |
| Ar-2 | Ar-4 | Ar-3 | Ar-3 |
| Ar-2 | Ar-4 | Ar-3 | Ar-4 |
| Ar-2 | Ar-4 | Ar-3 | Ar-5 |
| Ar-2 | Ar-4 | Ar-3 | Ar-6 |

TABLE 1-6

| R1 | R3 | R4 | R6 |
| --- | --- | --- | --- |
| Ar-2 | Ar-4 | Ar-4 | Ar-2 |
| Ar-2 | Ar-4 | Ar-4 | Ar-3 |
| Ar-2 | Ar-4 | Ar-4 | Ar-4 |
| Ar-2 | Ar-4 | Ar-4 | Ar-5 |
| Ar-2 | Ar-4 | Ar-4 | Ar-6 |
| Ar-2 | Ar-4 | Ar-5 | Ar-2 |
| Ar-2 | Ar-4 | Ar-5 | Ar-3 |
| Ar-2 | Ar-4 | Ar-5 | Ar-4 |
| Ar-2 | Ar-4 | Ar-5 | Ar-5 |
| Ar-2 | Ar-4 | Ar-5 | Ar-6 |
| Ar-2 | Ar-4 | Ar-6 | Ar-2 |
| Ar-2 | Ar-4 | Ar-6 | Ar-3 |
| Ar-2 | Ar-4 | Ar-6 | Ar-4 |
| Ar-2 | Ar-4 | Ar-6 | Ar-5 |
| Ar-2 | Ar-4 | Ar-6 | Ar-6 |
| Ar-2 | Ar-5 | Ar-1 | Ar-3 |
| Ar-2 | Ar-5 | Ar-1 | Ar-4 |
| Ar-2 | Ar-5 | Ar-1 | Ar-5 |
| Ar-2 | Ar-5 | Ar-1 | Ar-6 |
| Ar-2 | Ar-5 | Ar-2 | Ar-3 |
| Ar-2 | Ar-5 | Ar-2 | Ar-4 |
| Ar-2 | Ar-5 | Ar-2 | Ar-5 |
| Ar-2 | Ar-5 | Ar-2 | Ar-6 |
| Ar-2 | Ar-5 | Ar-3 | Ar-3 |
| Ar-2 | Ar-5 | Ar-3 | Ar-4 |
| Ar-2 | Ar-5 | Ar-3 | Ar-5 |
| Ar-2 | Ar-5 | Ar-3 | Ar-6 |
| Ar-2 | Ar-5 | Ar-4 | Ar-3 |
| Ar-2 | Ar-5 | Ar-4 | Ar-4 |
| Ar-2 | Ar-5 | Ar-4 | Ar-5 |
| Ar-2 | Ar-5 | Ar-4 | Ar-6 |
| Ar-2 | Ar-5 | Ar-5 | Ar-2 |
| Ar-2 | Ar-5 | Ar-5 | Ar-3 |
| Ar-2 | Ar-5 | Ar-5 | Ar-4 |
| Ar-2 | Ar-5 | Ar-5 | Ar-5 |
| Ar-2 | Ar-5 | Ar-5 | Ar-6 |
| Ar-2 | Ar-5 | Ar-6 | Ar-2 |
| Ar-2 | Ar-5 | Ar-6 | Ar-3 |
| Ar-2 | Ar-5 | Ar-6 | Ar-4 |

TABLE 1-6-continued

| R1 | R3 | R4 | R6 |
|---|---|---|---|
| Ar-2 | Ar-5 | Ar-6 | Ar-5 |
| Ar-2 | Ar-5 | Ar-6 | Ar-6 |
| Ar-2 | Ar-6 | Ar-1 | Ar-3 |
| Ar-2 | Ar-6 | Ar-1 | Ar-4 |
| Ar-2 | Ar-6 | Ar-1 | Ar-5 |
| Ar-2 | Ar-6 | Ar-1 | Ar-6 |
| Ar-2 | Ar-6 | Ar-2 | Ar-3 |
| Ar-2 | Ar-6 | Ar-2 | Ar-4 |
| Ar-2 | Ar-6 | Ar-2 | Ar-5 |
| Ar-2 | Ar-6 | Ar-2 | Ar-6 |
| Ar-2 | Ar-6 | Ar-3 | Ar-3 |
| Ar-2 | Ar-6 | Ar-3 | Ar-4 |
| Ar-2 | Ar-6 | Ar-3 | Ar-5 |
| Ar-2 | Ar-6 | Ar-3 | Ar-6 |
| Ar-2 | Ar-6 | Ar-4 | Ar-3 |
| Ar-2 | Ar-6 | Ar-4 | Ar-4 |
| Ar-2 | Ar-6 | Ar-4 | Ar-5 |
| Ar-2 | Ar-6 | Ar-4 | Ar-6 |
| Ar-2 | Ar-6 | Ar-5 | Ar-3 |
| Ar-2 | Ar-6 | Ar-5 | Ar-4 |
| Ar-2 | Ar-6 | Ar-5 | Ar-5 |
| Ar-2 | Ar-6 | Ar-5 | Ar-6 |

TABLE 1-7

| R1 | R3 | R4 | R6 |
|---|---|---|---|
| Ar-2 | Ar-6 | Ar-6 | Ar-2 |
| Ar-2 | Ar-6 | Ar-6 | Ar-3 |
| Ar-2 | Ar-6 | Ar-6 | Ar-4 |
| Ar-2 | Ar-6 | Ar-6 | Ar-5 |
| Ar-2 | Ar-6 | Ar-6 | Ar-6 |
| Ar-3 | Ar-1 | Ar-1 | Ar-3 |
| Ar-3 | Ar-1 | Ar-1 | Ar-4 |
| Ar-3 | Ar-1 | Ar-1 | Ar-5 |
| Ar-3 | Ar-1 | Ar-1 | Ar-6 |
| Ar-3 | Ar-1 | Ar-2 | Ar-3 |
| Ar-3 | Ar-1 | Ar-2 | Ar-4 |
| Ar-3 | Ar-1 | Ar-2 | Ar-5 |
| Ar-3 | Ar-1 | Ar-2 | Ar-6 |
| Ar-3 | Ar-1 | Ar-3 | Ar-3 |
| Ar-3 | Ar-1 | Ar-3 | Ar-4 |
| Ar-3 | Ar-1 | Ar-3 | Ar-5 |
| Ar-3 | Ar-1 | Ar-3 | Ar-6 |
| Ar-3 | Ar-1 | Ar-4 | Ar-3 |
| Ar-3 | Ar-1 | Ar-4 | Ar-4 |
| Ar-3 | Ar-1 | Ar-4 | Ar-5 |
| Ar-3 | Ar-1 | Ar-4 | Ar-6 |
| Ar-3 | Ar-1 | Ar-5 | Ar-3 |
| Ar-3 | Ar-1 | Ar-5 | Ar-4 |
| Ar-3 | Ar-1 | Ar-5 | Ar-5 |
| Ar-3 | Ar-1 | Ar-5 | Ar-6 |
| Ar-3 | Ar-1 | Ar-6 | Ar-3 |
| Ar-3 | Ar-1 | Ar-6 | Ar-4 |
| Ar-3 | Ar-1 | Ar-6 | Ar-5 |
| Ar-3 | Ar-1 | Ar-6 | Ar-6 |
| Ar-3 | Ar-2 | Ar-1 | Ar-4 |
| Ar-3 | Ar-2 | Ar-1 | Ar-5 |
| Ar-3 | Ar-2 | Ar-1 | Ar-6 |
| Ar-3 | Ar-2 | Ar-2 | Ar-3 |
| Ar-3 | Ar-2 | Ar-2 | Ar-4 |
| Ar-3 | Ar-2 | Ar-2 | Ar-5 |
| Ar-3 | Ar-2 | Ar-2 | Ar-6 |
| Ar-3 | Ar-2 | Ar-3 | Ar-3 |
| Ar-3 | Ar-2 | Ar-3 | Ar-4 |
| Ar-3 | Ar-2 | Ar-3 | Ar-5 |
| Ar-3 | Ar-2 | Ar-3 | Ar-6 |
| Ar-3 | Ar-2 | Ar-4 | Ar-3 |
| Ar-3 | Ar-2 | Ar-4 | Ar-4 |
| Ar-3 | Ar-2 | Ar-4 | Ar-5 |
| Ar-3 | Ar-2 | Ar-4 | Ar-6 |
| Ar-3 | Ar-2 | Ar-5 | Ar-3 |
| Ar-3 | Ar-2 | Ar-5 | Ar-4 |
| Ar-3 | Ar-2 | Ar-5 | Ar-5 |
| Ar-3 | Ar-2 | Ar-5 | Ar-6 |

TABLE 1-7-continued

| R1 | R3 | R4 | R6 |
|---|---|---|---|
| Ar-3 | Ar-2 | Ar-6 | Ar-3 |
| Ar-3 | Ar-2 | Ar-6 | Ar-4 |
| Ar-3 | Ar-2 | Ar-6 | Ar-5 |
| Ar-3 | Ar-2 | Ar-6 | Ar-6 |
| Ar-3 | Ar-3 | Ar-1 | Ar-4 |
| Ar-3 | Ar-3 | Ar-1 | Ar-5 |
| Ar-3 | Ar-3 | Ar-1 | Ar-6 |
| Ar-3 | Ar-3 | Ar-2 | Ar-4 |
| Ar-3 | Ar-3 | Ar-2 | Ar-5 |
| Ar-3 | Ar-3 | Ar-2 | Ar-6 |
| Ar-3 | Ar-3 | Ar-3 | Ar-3 |
| Ar-3 | Ar-3 | Ar-3 | Ar-4 |
| Ar-3 | Ar-3 | Ar-3 | Ar-5 |

TABLE 1-8

| R1 | R3 | R4 | R6 |
|---|---|---|---|
| Ar-3 | Ar-3 | Ar-3 | Ar-6 |
| Ar-3 | Ar-3 | Ar-4 | Ar-3 |
| Ar-3 | Ar-3 | Ar-4 | Ar-4 |
| Ar-3 | Ar-3 | Ar-4 | Ar-5 |
| Ar-3 | Ar-3 | Ar-4 | Ar-6 |
| Ar-3 | Ar-3 | Ar-5 | Ar-3 |
| Ar-3 | Ar-3 | Ar-5 | Ar-4 |
| Ar-3 | Ar-3 | Ar-5 | Ar-5 |
| Ar-3 | Ar-3 | Ar-5 | Ar-6 |
| Ar-3 | Ar-3 | Ar-6 | Ar-3 |
| Ar-3 | Ar-3 | Ar-6 | Ar-4 |
| Ar-3 | Ar-3 | Ar-6 | Ar-5 |
| Ar-3 | Ar-3 | Ar-6 | Ar-6 |
| Ar-3 | Ar-4 | Ar-1 | Ar-4 |
| Ar-3 | Ar-4 | Ar-1 | Ar-5 |
| Ar-3 | Ar-4 | Ar-1 | Ar-6 |
| Ar-3 | Ar-4 | Ar-2 | Ar-4 |
| Ar-3 | Ar-4 | Ar-2 | Ar-5 |
| Ar-3 | Ar-4 | Ar-2 | Ar-6 |
| Ar-3 | Ar-4 | Ar-3 | Ar-4 |
| Ar-3 | Ar-4 | Ar-3 | Ar-5 |
| Ar-3 | Ar-4 | Ar-3 | Ar-6 |
| Ar-3 | Ar-4 | Ar-4 | Ar-3 |
| Ar-3 | Ar-4 | Ar-4 | Ar-4 |
| Ar-3 | Ar-4 | Ar-4 | Ar-5 |
| Ar-3 | Ar-4 | Ar-4 | Ar-6 |
| Ar-3 | Ar-4 | Ar-5 | Ar-3 |
| Ar-3 | Ar-4 | Ar-5 | Ar-4 |
| Ar-3 | Ar-4 | Ar-5 | Ar-5 |
| Ar-3 | Ar-4 | Ar-5 | Ar-6 |
| Ar-3 | Ar-4 | Ar-6 | Ar-3 |
| Ar-3 | Ar-4 | Ar-6 | Ar-4 |
| Ar-3 | Ar-4 | Ar-6 | Ar-5 |
| Ar-3 | Ar-4 | Ar-6 | Ar-6 |
| Ar-3 | Ar-5 | Ar-1 | Ar-4 |
| Ar-3 | Ar-5 | Ar-1 | Ar-5 |
| Ar-3 | Ar-5 | Ar-1 | Ar-6 |
| Ar-3 | Ar-5 | Ar-2 | Ar-4 |
| Ar-3 | Ar-5 | Ar-2 | Ar-5 |
| Ar-3 | Ar-5 | Ar-2 | Ar-6 |
| Ar-3 | Ar-5 | Ar-3 | Ar-4 |
| Ar-3 | Ar-5 | Ar-3 | Ar-5 |
| Ar-3 | Ar-5 | Ar-3 | Ar-6 |
| Ar-3 | Ar-5 | Ar-4 | Ar-4 |
| Ar-3 | Ar-5 | Ar-4 | Ar-5 |
| Ar-3 | Ar-5 | Ar-4 | Ar-6 |
| Ar-3 | Ar-5 | Ar-5 | Ar-3 |
| Ar-3 | Ar-5 | Ar-5 | Ar-4 |
| Ar-3 | Ar-5 | Ar-5 | Ar-5 |
| Ar-3 | Ar-5 | Ar-5 | Ar-6 |
| Ar-3 | Ar-5 | Ar-6 | Ar-3 |
| Ar-3 | Ar-5 | Ar-6 | Ar-4 |
| Ar-3 | Ar-5 | Ar-6 | Ar-5 |
| Ar-3 | Ar-5 | Ar-6 | Ar-6 |
| Ar-3 | Ar-6 | Ar-1 | Ar-4 |
| Ar-3 | Ar-6 | Ar-1 | Ar-5 |
| Ar-3 | Ar-6 | Ar-1 | Ar-6 |

TABLE 1-8-continued

| R1 | R3 | R4 | R6 |
|---|---|---|---|
| Ar-3 | Ar-6 | Ar-2 | Ar-4 |
| Ar-3 | Ar-6 | Ar-2 | Ar-5 |
| Ar-3 | Ar-6 | Ar-2 | Ar-6 |

TABLE 1-9

| R1 | R3 | R4 | R6 |
|---|---|---|---|
| Ar-3 | Ar-6 | Ar-3 | Ar-4 |
| Ar-3 | Ar-6 | Ar-3 | Ar-5 |
| Ar-3 | Ar-6 | Ar-3 | Ar-6 |
| Ar-3 | Ar-6 | Ar-4 | Ar-4 |
| Ar-3 | Ar-6 | Ar-4 | Ar-5 |
| Ar-3 | Ar-6 | Ar-4 | Ar-6 |
| Ar-3 | Ar-6 | Ar-5 | Ar-4 |
| Ar-3 | Ar-6 | Ar-5 | Ar-5 |
| Ar-3 | Ar-6 | Ar-5 | Ar-6 |
| Ar-3 | Ar-6 | Ar-6 | Ar-3 |
| Ar-3 | Ar-6 | Ar-6 | Ar-4 |
| Ar-3 | Ar-6 | Ar-6 | Ar-5 |
| Ar-3 | Ar-6 | Ar-6 | Ar-6 |
| Ar-4 | Ar-1 | Ar-1 | Ar-4 |
| Ar-4 | Ar-1 | Ar-1 | Ar-5 |
| Ar-4 | Ar-1 | Ar-1 | Ar-6 |
| Ar-4 | Ar-1 | Ar-2 | Ar-4 |
| Ar-4 | Ar-1 | Ar-2 | Ar-5 |
| Ar-4 | Ar-1 | Ar-2 | Ar-6 |
| Ar-4 | Ar-1 | Ar-3 | Ar-4 |
| Ar-4 | Ar-1 | Ar-3 | Ar-5 |
| Ar-4 | Ar-1 | Ar-3 | Ar-6 |
| Ar-4 | Ar-1 | Ar-4 | Ar-4 |
| Ar-4 | Ar-1 | Ar-4 | Ar-5 |
| Ar-4 | Ar-1 | Ar-4 | Ar-6 |
| Ar-4 | Ar-1 | Ar-5 | Ar-4 |
| Ar-4 | Ar-1 | Ar-5 | Ar-5 |
| Ar-4 | Ar-1 | Ar-5 | Ar-6 |
| Ar-4 | Ar-1 | Ar-6 | Ar-4 |
| Ar-4 | Ar-1 | Ar-6 | Ar-5 |
| Ar-4 | Ar-1 | Ar-6 | Ar-6 |
| Ar-4 | Ar-2 | Ar-1 | Ar-5 |
| Ar-4 | Ar-2 | Ar-1 | Ar-6 |
| Ar-4 | Ar-2 | Ar-2 | Ar-4 |
| Ar-4 | Ar-2 | Ar-2 | Ar-5 |
| Ar-4 | Ar-2 | Ar-2 | Ar-6 |
| Ar-4 | Ar-2 | Ar-3 | Ar-4 |
| Ar-4 | Ar-2 | Ar-3 | Ar-5 |
| Ar-4 | Ar-2 | Ar-3 | Ar-6 |
| Ar-4 | Ar-2 | Ar-4 | Ar-4 |
| Ar-4 | Ar-2 | Ar-4 | Ar-5 |
| Ar-4 | Ar-2 | Ar-4 | Ar-6 |
| Ar-4 | Ar-2 | Ar-5 | Ar-4 |
| Ar-4 | Ar-2 | Ar-5 | Ar-5 |
| Ar-4 | Ar-2 | Ar-5 | Ar-6 |
| Ar-4 | Ar-2 | Ar-6 | Ar-4 |
| Ar-4 | Ar-2 | Ar-6 | Ar-5 |
| Ar-4 | Ar-2 | Ar-6 | Ar-6 |
| Ar-4 | Ar-3 | Ar-1 | Ar-5 |
| Ar-4 | Ar-3 | Ar-1 | Ar-6 |
| Ar-4 | Ar-3 | Ar-2 | Ar-5 |
| Ar-4 | Ar-3 | Ar-2 | Ar-6 |
| Ar-4 | Ar-3 | Ar-3 | Ar-4 |
| Ar-4 | Ar-3 | Ar-3 | Ar-5 |
| Ar-4 | Ar-3 | Ar-3 | Ar-6 |
| Ar-4 | Ar-3 | Ar-4 | Ar-4 |
| Ar-4 | Ar-3 | Ar-4 | Ar-5 |
| Ar-4 | Ar-3 | Ar-4 | Ar-6 |
| Ar-4 | Ar-3 | Ar-5 | Ar-4 |
| Ar-4 | Ar-3 | Ar-5 | Ar-5 |
| Ar-4 | Ar-3 | Ar-5 | Ar-6 |

TABLE 1-10

| R1 | R3 | R4 | R6 |
|---|---|---|---|
| Ar-4 | Ar-3 | Ar-6 | Ar-4 |
| Ar-4 | Ar-3 | Ar-6 | Ar-5 |
| Ar-4 | Ar-3 | Ar-6 | Ar-6 |
| Ar-4 | Ar-4 | Ar-1 | Ar-5 |
| Ar-4 | Ar-4 | Ar-1 | Ar-6 |
| Ar-4 | Ar-4 | Ar-2 | Ar-5 |
| Ar-4 | Ar-4 | Ar-2 | Ar-6 |
| Ar-4 | Ar-4 | Ar-3 | Ar-5 |
| Ar-4 | Ar-4 | Ar-3 | Ar-6 |
| Ar-4 | Ar-4 | Ar-4 | Ar-4 |
| Ar-4 | Ar-4 | Ar-4 | Ar-5 |
| Ar-4 | Ar-4 | Ar-4 | Ar-6 |
| Ar-4 | Ar-4 | Ar-5 | Ar-4 |
| Ar-4 | Ar-4 | Ar-5 | Ar-5 |
| Ar-4 | Ar-4 | Ar-5 | Ar-6 |
| Ar-4 | Ar-4 | Ar-6 | Ar-4 |
| Ar-4 | Ar-4 | Ar-6 | Ar-5 |
| Ar-4 | Ar-4 | Ar-6 | Ar-6 |
| Ar-4 | Ar-5 | Ar-1 | Ar-5 |
| Ar-4 | Ar-5 | Ar-1 | Ar-6 |
| Ar-4 | Ar-5 | Ar-2 | Ar-5 |
| Ar-4 | Ar-5 | Ar-2 | Ar-6 |
| Ar-4 | Ar-5 | Ar-3 | Ar-5 |
| Ar-4 | Ar-5 | Ar-3 | Ar-6 |
| Ar-4 | Ar-5 | Ar-4 | Ar-5 |
| Ar-4 | Ar-5 | Ar-4 | Ar-6 |
| Ar-4 | Ar-5 | Ar-5 | Ar-4 |
| Ar-4 | Ar-5 | Ar-5 | Ar-5 |
| Ar-4 | Ar-5 | Ar-5 | Ar-6 |
| Ar-4 | Ar-5 | Ar-6 | Ar-4 |
| Ar-4 | Ar-5 | Ar-6 | Ar-5 |
| Ar-4 | Ar-5 | Ar-6 | Ar-6 |
| Ar-4 | Ar-6 | Ar-1 | Ar-5 |
| Ar-4 | Ar-6 | Ar-1 | Ar-6 |
| Ar-4 | Ar-6 | Ar-2 | Ar-5 |
| Ar-4 | Ar-6 | Ar-2 | Ar-6 |
| Ar-4 | Ar-6 | Ar-3 | Ar-5 |
| Ar-4 | Ar-6 | Ar-3 | Ar-6 |
| Ar-4 | Ar-6 | Ar-4 | Ar-5 |
| Ar-4 | Ar-6 | Ar-4 | Ar-6 |
| Ar-4 | Ar-6 | Ar-5 | Ar-5 |
| Ar-4 | Ar-6 | Ar-5 | Ar-6 |
| Ar-4 | Ar-6 | Ar-6 | Ar-4 |
| Ar-4 | Ar-6 | Ar-6 | Ar-5 |
| Ar-4 | Ar-6 | Ar-6 | Ar-6 |
| Ar-5 | Ar-1 | Ar-1 | Ar-5 |
| Ar-5 | Ar-1 | Ar-1 | Ar-6 |
| Ar-5 | Ar-1 | Ar-2 | Ar-5 |
| Ar-5 | Ar-1 | Ar-2 | Ar-6 |
| Ar-5 | Ar-1 | Ar-3 | Ar-5 |
| Ar-5 | Ar-1 | Ar-3 | Ar-6 |
| Ar-5 | Ar-1 | Ar-4 | Ar-5 |
| Ar-5 | Ar-1 | Ar-4 | Ar-6 |
| Ar-5 | Ar-1 | Ar-5 | Ar-5 |
| Ar-5 | Ar-1 | Ar-5 | Ar-6 |
| Ar-5 | Ar-1 | Ar-6 | Ar-5 |
| Ar-5 | Ar-1 | Ar-6 | Ar-6 |
| Ar-5 | Ar-2 | Ar-1 | Ar-6 |
| Ar-5 | Ar-2 | Ar-2 | Ar-5 |
| Ar-5 | Ar-2 | Ar-2 | Ar-6 |
| Ar-5 | Ar-2 | Ar-3 | Ar-5 |
| Ar-5 | Ar-2 | Ar-3 | Ar-6 |

TABLE 1-11

| R1 | R3 | R4 | R6 |
|---|---|---|---|
| Ar-5 | Ar-2 | Ar-4 | Ar-5 |
| Ar-5 | Ar-2 | Ar-4 | Ar-6 |
| Ar-5 | Ar-2 | Ar-5 | Ar-5 |
| Ar-5 | Ar-2 | Ar-5 | Ar-6 |
| Ar-5 | Ar-2 | Ar-6 | Ar-5 |
| Ar-5 | Ar-2 | Ar-6 | Ar-6 |
| Ar-5 | Ar-3 | Ar-1 | Ar-6 |
| Ar-5 | Ar-3 | Ar-2 | Ar-6 |
| Ar-5 | Ar-3 | Ar-3 | Ar-5 |
| Ar-5 | Ar-3 | Ar-3 | Ar-6 |
| Ar-5 | Ar-3 | Ar-4 | Ar-5 |
| Ar-5 | Ar-3 | Ar-4 | Ar-6 |
| Ar-5 | Ar-3 | Ar-5 | Ar-5 |
| Ar-5 | Ar-3 | Ar-5 | Ar-6 |
| Ar-5 | Ar-3 | Ar-6 | Ar-5 |
| Ar-5 | Ar-3 | Ar-6 | Ar-6 |
| Ar-5 | Ar-4 | Ar-1 | Ar-6 |
| Ar-5 | Ar-4 | Ar-2 | Ar-6 |
| Ar-5 | Ar-4 | Ar-3 | Ar-6 |
| Ar-5 | Ar-4 | Ar-4 | Ar-5 |
| Ar-5 | Ar-4 | Ar-4 | Ar-6 |
| Ar-5 | Ar-4 | Ar-5 | Ar-5 |
| Ar-5 | Ar-4 | Ar-5 | Ar-6 |
| Ar-5 | Ar-4 | Ar-6 | Ar-5 |
| Ar-5 | Ar-4 | Ar-6 | Ar-6 |
| Ar-5 | Ar-5 | Ar-1 | Ar-6 |
| Ar-5 | Ar-5 | Ar-2 | Ar-6 |
| Ar-5 | Ar-5 | Ar-3 | Ar-6 |
| Ar-5 | Ar-5 | Ar-4 | Ar-6 |
| Ar-5 | Ar-5 | Ar-5 | Ar-5 |
| Ar-5 | Ar-5 | Ar-5 | Ar-6 |
| Ar-5 | Ar-5 | Ar-6 | Ar-5 |
| Ar-5 | Ar-5 | Ar-6 | Ar-6 |
| Ar-5 | Ar-6 | Ar-1 | Ar-6 |
| Ar-5 | Ar-6 | Ar-2 | Ar-6 |
| Ar-5 | Ar-6 | Ar-3 | Ar-6 |
| Ar-5 | Ar-6 | Ar-4 | Ar-6 |
| Ar-5 | Ar-6 | Ar-5 | Ar-6 |
| Ar-5 | Ar-6 | Ar-6 | Ar-5 |
| Ar-5 | Ar-6 | Ar-6 | Ar-6 |
| Ar-6 | Ar-1 | Ar-1 | Ar-6 |
| Ar-6 | Ar-1 | Ar-2 | Ar-6 |
| Ar-6 | Ar-1 | Ar-3 | Ar-6 |
| Ar-6 | Ar-1 | Ar-4 | Ar-6 |
| Ar-6 | Ar-1 | Ar-5 | Ar-6 |
| Ar-6 | Ar-1 | Ar-6 | Ar-6 |
| Ar-6 | Ar-2 | Ar-2 | Ar-6 |
| Ar-6 | Ar-2 | Ar-3 | Ar-6 |
| Ar-6 | Ar-2 | Ar-4 | Ar-6 |
| Ar-6 | Ar-2 | Ar-5 | Ar-6 |
| Ar-6 | Ar-2 | Ar-6 | Ar-6 |
| Ar-6 | Ar-3 | Ar-3 | Ar-6 |
| Ar-6 | Ar-3 | Ar-4 | Ar-6 |
| Ar-6 | Ar-3 | Ar-5 | Ar-6 |
| Ar-6 | Ar-3 | Ar-6 | Ar-6 |
| Ar-6 | Ar-4 | Ar-4 | Ar-6 |
| Ar-6 | Ar-4 | Ar-5 | Ar-6 |
| Ar-6 | Ar-4 | Ar-6 | Ar-6 |
| Ar-6 | Ar-5 | Ar-5 | Ar-6 |
| Ar-6 | Ar-5 | Ar-6 | Ar-6 |
| Ar-6 | Ar-6 | Ar-6 | Ar-6 |

$R^2$ and $R^5$ are each preferably any of hydrogen, an alkyl group, a carbonyl group, an oxycarbonyl group, and an aryl group and preferably hydrogen or an alkyl group in view of thermal stability. In particular, in view of the easiness of obtaining a narrow full width at half maximum in an emission spectrum, $R^2$ and $R^5$ are each more preferably hydrogen.

$R^8$ and $R^9$ are each preferably an alkyl group, an aryl group, a heteroaryl group, fluorine, a fluorine-containing alkyl group, a fluorine-containing heteroaryl group, or a fluorine-containing aryl group. In particular, because of being stable against excitation light and the capability of obtaining higher fluorescence quantum yield, $R^8$ and $R^9$ are each more preferably fluorine or a fluorine-containing aryl group. Furthermore, $R^8$ and $R^9$ are each still more preferably fluorine in view of the easiness of synthesis.

The fluorine-containing aryl group is an aryl group containing fluorine; examples thereof include a fluorophenyl group, a trifluoromethylphenyl group, and pentafluorophenyl group. The fluorine-containing heteroaryl group is a heteroaryl group containing fluorine; examples thereof include a fluoropyridyl group, a trifluoromethylpyridyl group, and trifluoropyridyl group. The fluorine-containing alkyl group is an alkyl group containing fluorine; examples thereof include a trifluoromethyl group and a pentafluoroethyl group.

In General Formula (1), X is preferably C—$R^7$ in view of photostability, when X is C—$R^7$, the substituent $R^7$ has a great influence on the durability of the compound represented by General Formula (1), that is, a temporal reduction in the emission intensity of this compound. Specifically, when $R^7$ is hydrogen, the reactivity of this part is high, and this part and water and oxygen in the air easily react with each other. This phenomenon causes the decomposition of the compound represented by General Formula (1). When $R^7$ is a substituent having a large degree of freedom of the motion of a molecular chain such as an alkyl group, although the reactivity indeed reduces, the compounds flocculate with the lapse of time in the composition, resulting in a reduction in emission intensity caused by concentration quenching. Thus, $R^7$ is preferably a group that is rigid, is small in the degree of freedom of motion, and is difficult to cause flocculation, and specifically preferably any of a substituted or unsubstituted aryl group and a substituted or unsubstituted heteroaryl group.

In view of giving higher fluorescence quantum yield, being more resistant to thermal decomposition, and photostability, X is preferably C—$R^7$ in which $R^7$ is a substituted or unsubstituted aryl group. In view of not impairing emission wavelength, the aryl group is preferably a phenyl group, a biphenyl group, a terphenyl group, a naphthyl group, a fluorenyl group, a phenanthryl group, or an anthracenyl group.

Furthermore, to increase the photostability of the compound represented by General Formula (1), the twist of the carbon-carbon bond between $R^7$ and the pyrromethene skeleton is required to be appropriately reduced, because an excessively large twist causes a reduction in photostability, such as an increase in reactivity against the excitation light. Given these circumstances, $R^7$ is preferably a substituted or unsubstituted phenyl group, a substituted or unsubstituted biphenyl group, a substituted or unsubstituted terphenyl group, or a substituted or unsubstituted naphthyl group, more preferably a substituted or unsubstituted phenyl group, a substituted or unsubstituted biphenyl group, or a substituted or unsubstituted terphenyl group, and particularly preferably a substituted or unsubstituted phenyl group.

R is preferably an appropriately bulky substituent. $R^7$ has bulkiness to some extent, whereby the flocculation of molecules can be prevented. Consequently, the emission efficiency and durability of the compound further improve.

A further preferred example of the bulky substituent is the structure of $R^7$ represented by the following General Formula (2).

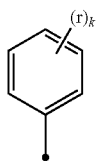

(2)

In General Formula (2), r is selected from the group consisting of hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, and a phosphine oxide group. The symbol k is an integer of 1 to 3. When k is 2 or more, rs may be the same as or different from each other.

In view of the capability of giving higher fluorescence quantum yield, r is preferably a substituted or unsubstituted aryl group. Preferred examples of the aryl group include a phenyl group and a naphthyl group in particular. When r is an aryl group, k in General Formula (2) is preferably 1 or 2, and in view of preventing the flocculation of molecules, k is more preferably 2. Furthermore, when k is 2 or more, at least one of rs is preferably substituted by an alkyl group. Particularly preferred examples of the alkyl group in this case include a methyl group, an ethyl group, and a tert-butyl group in view of thermal stability.

In view of controlling fluorescence wavelength and absorption wavelength and increasing compatibility with the solvent, r is preferably a substituted or unsubstituted alkyl group, a substituted or unsubstituted alkoxy group, or halogen and more preferably a methyl group, an ethyl group, a tert-butyl group, or a methoxy group. In view of dispersibility, r is particularly preferably a tert-butyl group or a methoxy group. The fact that r is a tert-butyl group or a methoxy group is more effective for the prevention of quenching caused by the flocculation of molecules.

As another mode of the compound represented by General Formula (1), at least one of $R^1$ to $R^7$ is preferably an electron withdrawing group. In particular, preferred is (1) at least one of $R^1$ to $R^6$ being an electron withdrawing group, (2) $R^7$ being an electron withdrawing group, or (3) at least one of $R^1$ to $R^6$ being an electron withdrawing group and $R^7$ being an electron withdrawing group. The electron withdrawing group is thus introduced to the pyrromethene skeleton of the compound, whereby the electron density of the pyrromethene skeleton can be greatly reduced. With this reduction in electron density, the stability of the compound against oxygen further improves, and consequently, the durability of the compound can be further improved.

The electron withdrawing group is called also an electron accepting group and is an atomic group that attracts an electron from a substituted atomic group by the inductive effect and/or the resonance effect in the organic electron theory. Examples of the electron withdrawing group include ones having a positive value as a substituent constant (σp (para)) of Hammett's Rule. The substituent constant (σp (para)) of Hammett's Rule can be cited from Kagaku Binran Kiso-Hen Revised 5th Edition (II, p. 380). Although the phenyl group has an example taking a positive value as in the above, the electron withdrawing group does not include the phenyl group in the present invention.

Examples of the electron withdrawing group include —F (σp: +0.20), —Cl (σp: +0.28), —Br (σp: +0.30), —I (σp: +0.30), —$CO_2R^{12}$ (σp: +0.45 when $R^{12}$ is an ethyl group), —$CONH_2$ (σp: +0.38), —$COR^{12}$ (σp: +0.49 when $R^{12}$ is a methyl group), —$CF_3$ (σp: +0.51), —$SO_2R^{12}$ (σp: +0.69 when $R^{12}$ is a methyl group), —$NO_2$ (σp: +0.81). $R^{12}$s each independently represent a hydrogen atom, a substituted or unsubstituted aromatic hydrocarbon group with a ring-forming carbon number of 6 o 30 a substituted or unsubstituted heterocyclic group with a ring-forming carbon number of 5 o 30, a substituted or unsubstituted $C_{1-30}$ alkyl group, or a substituted or unsubstituted $C_{1-30}$ cycloalkyl group. Specific examples of these groups include examples similar to those described above.

Preferred examples of the electron withdrawing group include fluorine, a fluorine-containing aryl group, a fluorine-containing heteroaryl group, a fluorine-containing alkyl group, a substituted or unsubstituted acyl group, a substituted or unsubstituted ester group, a substituted or unsubstituted amide group, a substituted or unsubstituted sulfonyl group, and a cyano group; this is because they are resistant to chemical decomposition.

More preferred examples of the electron withdrawing group include a fluorine-containing alkyl group, a substituted or unsubstituted acyl group, a substituted or unsubstituted ester group, and a cyano group; this is because they prevent concentration quenching, leading to an effect of improving fluorescence quantum yield. A particularly preferred electron withdrawing group is a substituted or unsubstituted ester group.

One particularly preferred example of the compound represented by General Formula (1) is a case in which all $R^1$, $R^3$, $R^4$, and $R^6$, which may be the same as or different from each other, are substituted or unsubstituted alkyl groups and further X is C—$R^7$ in which $R^7$ is a group represented by General Formula (2). In this case, $R^7$ is particularly preferably the group represented by General Formula (2) in which r is contained as a substituted or unsubstituted phenyl group.

Another particularly preferred example of the compound represented by General Formula (1) is a case in which all $R^1$, $R^3$, $R^4$, and $R^6$, which may be the same as or different from each other, are selected from Ar-1 to Ar-6 described above and further X is C—$R^7$ in which $R^7$ is the group represented by General Formula (2). In this case, $R^7$ is more preferably the group represented by General Formula (2) in which r is contained as a tert-butyl group or a methoxy group and particularly preferably the group represented by General Formula (2) in which r is contained as a methoxy group.

The following shows examples of the compound represented by General Formula (1); this compound is not limited to these examples.

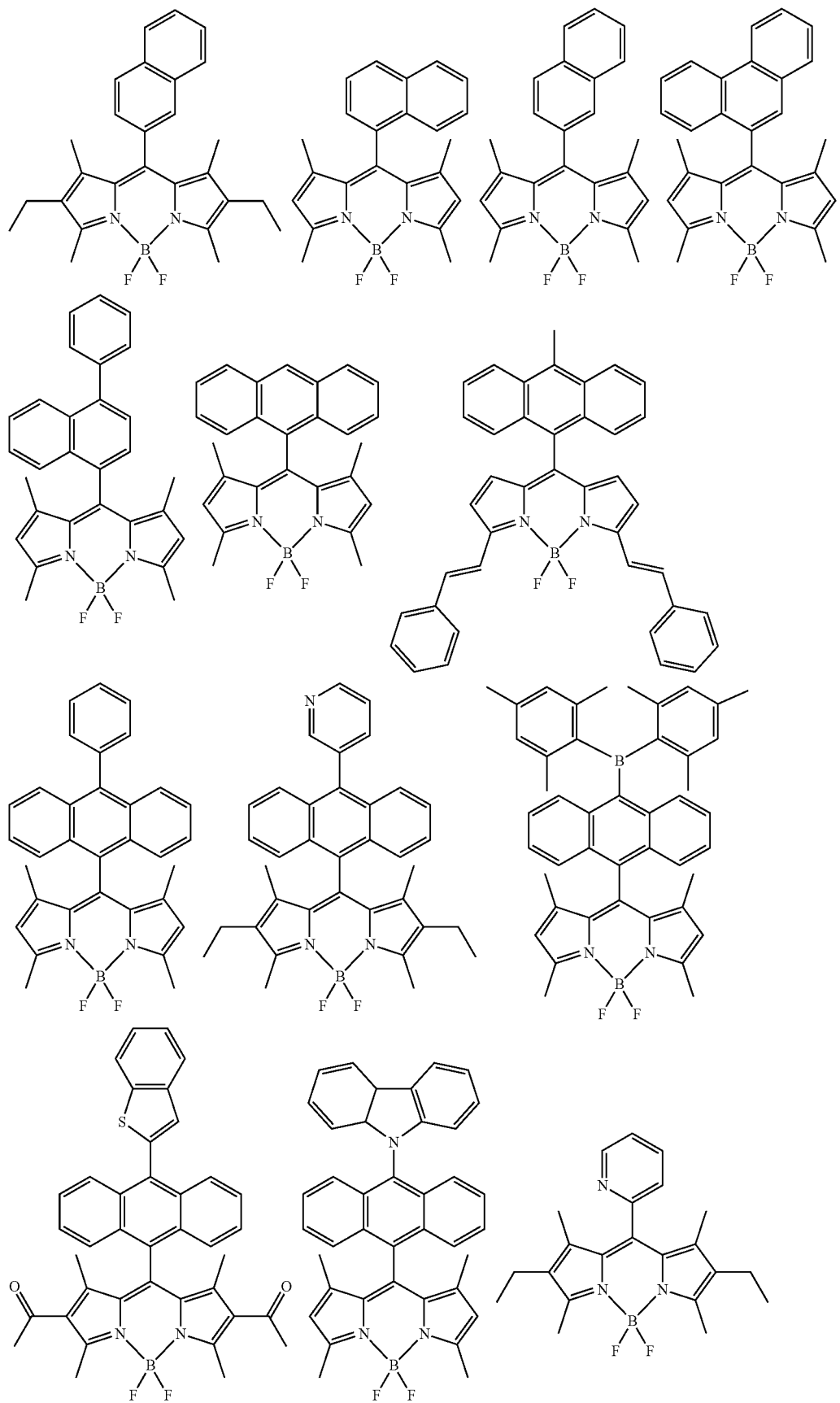

-continued
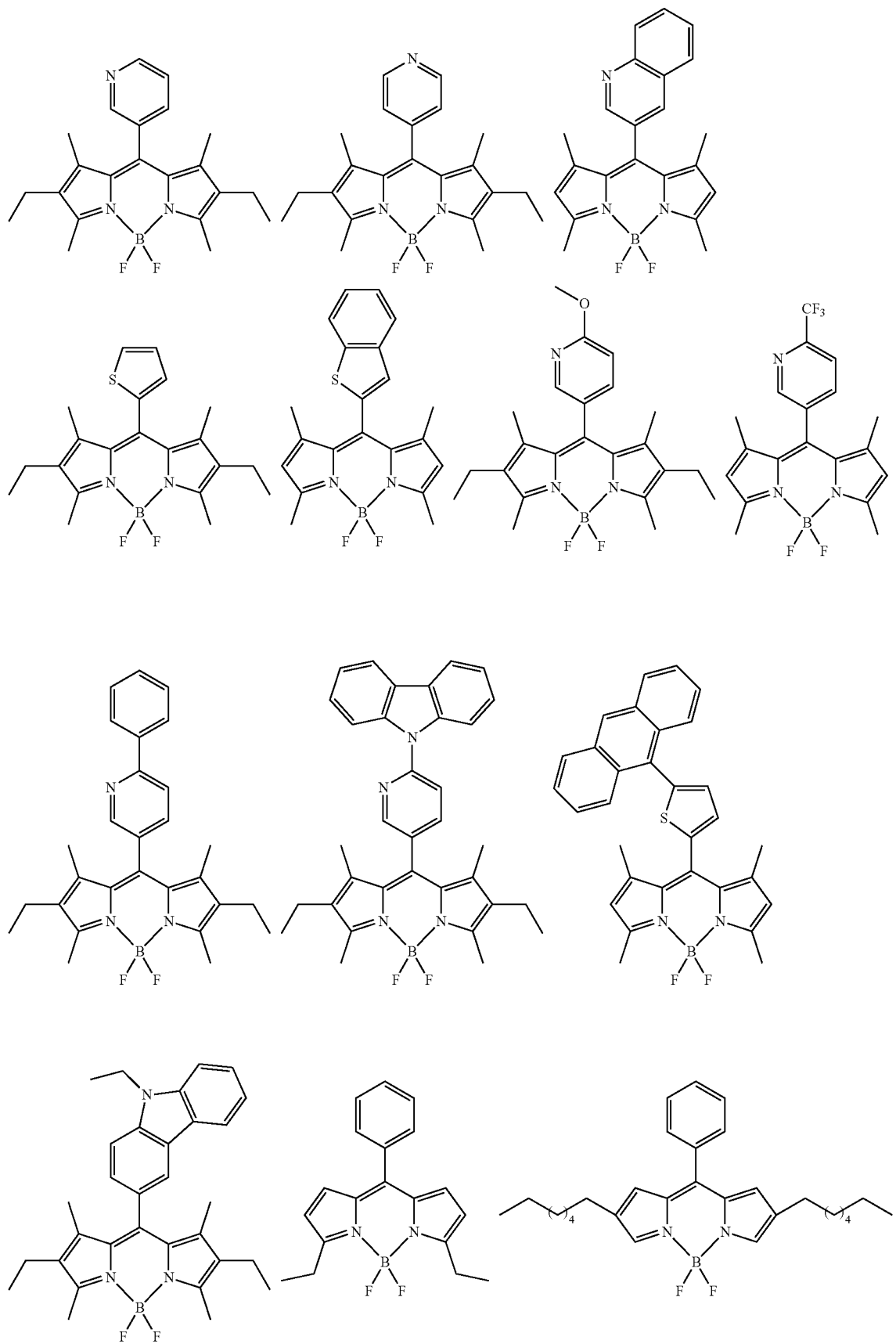

-continued
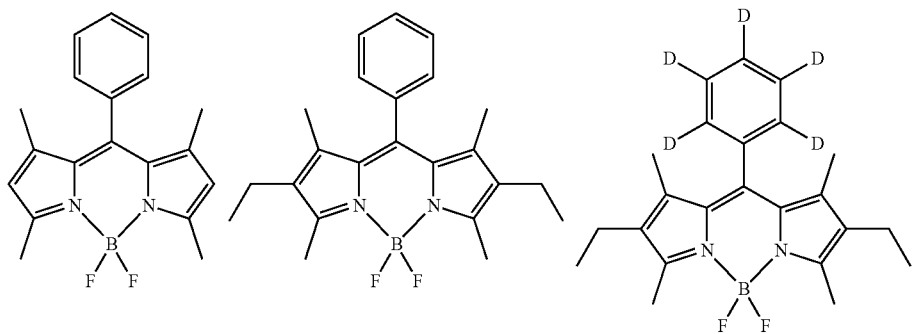
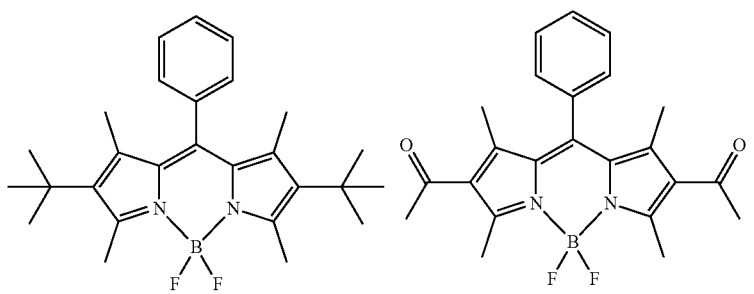
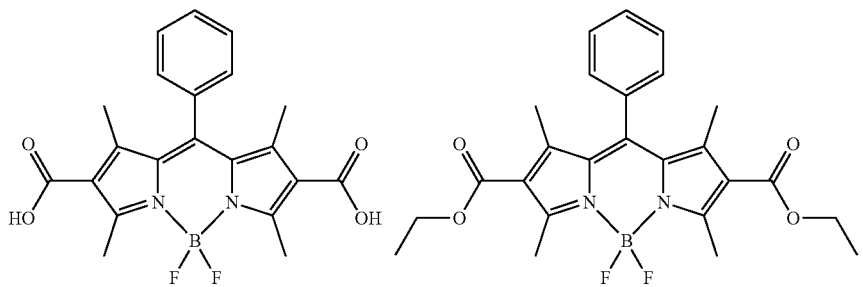
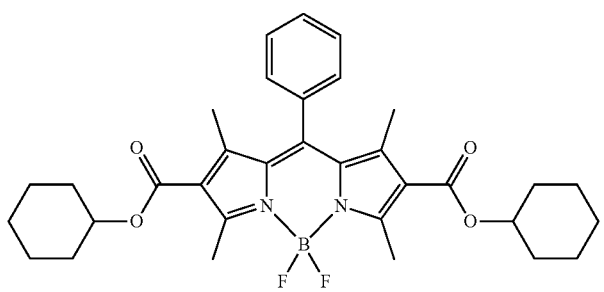
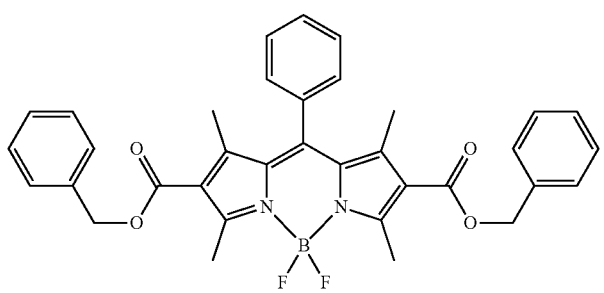

-continued
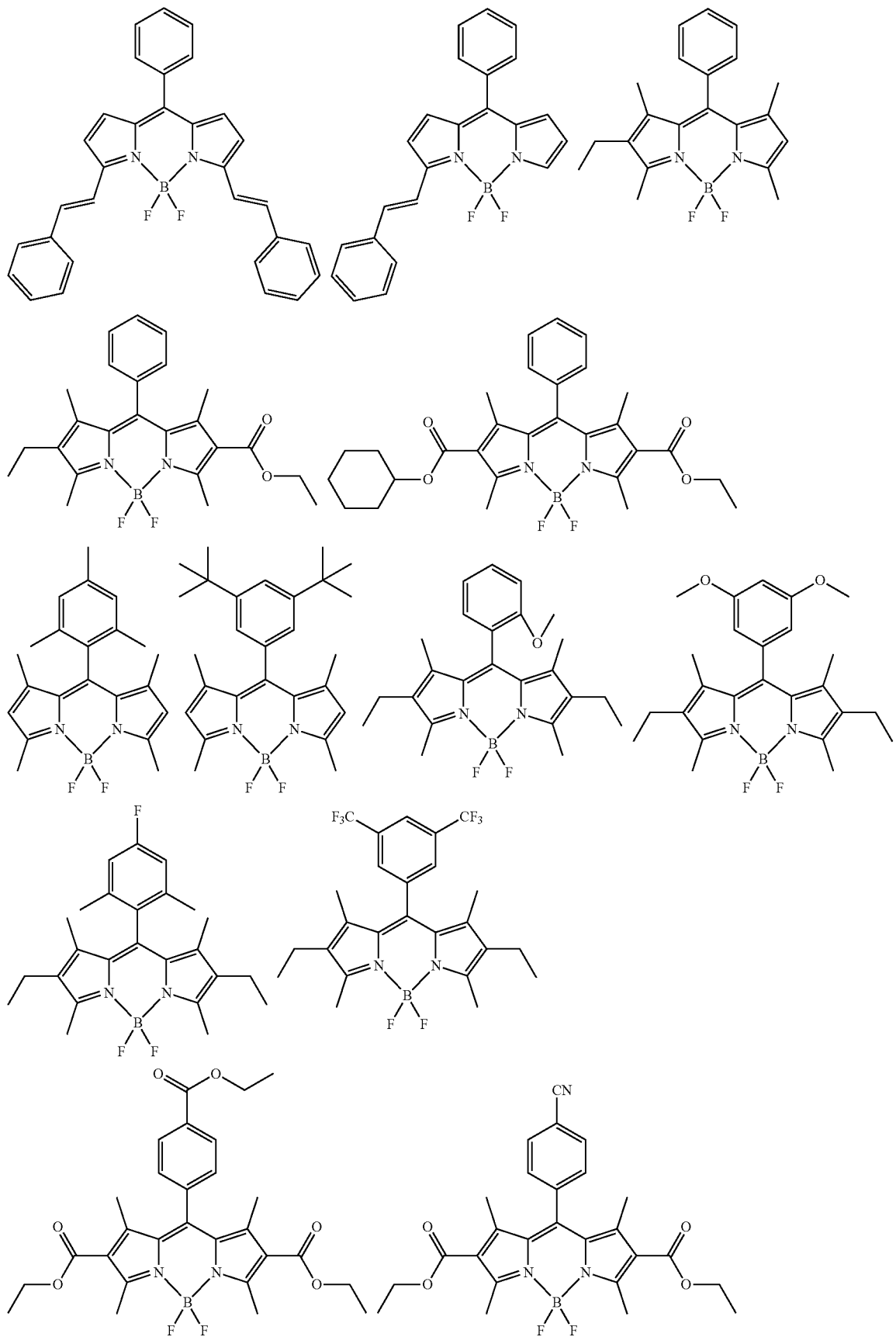

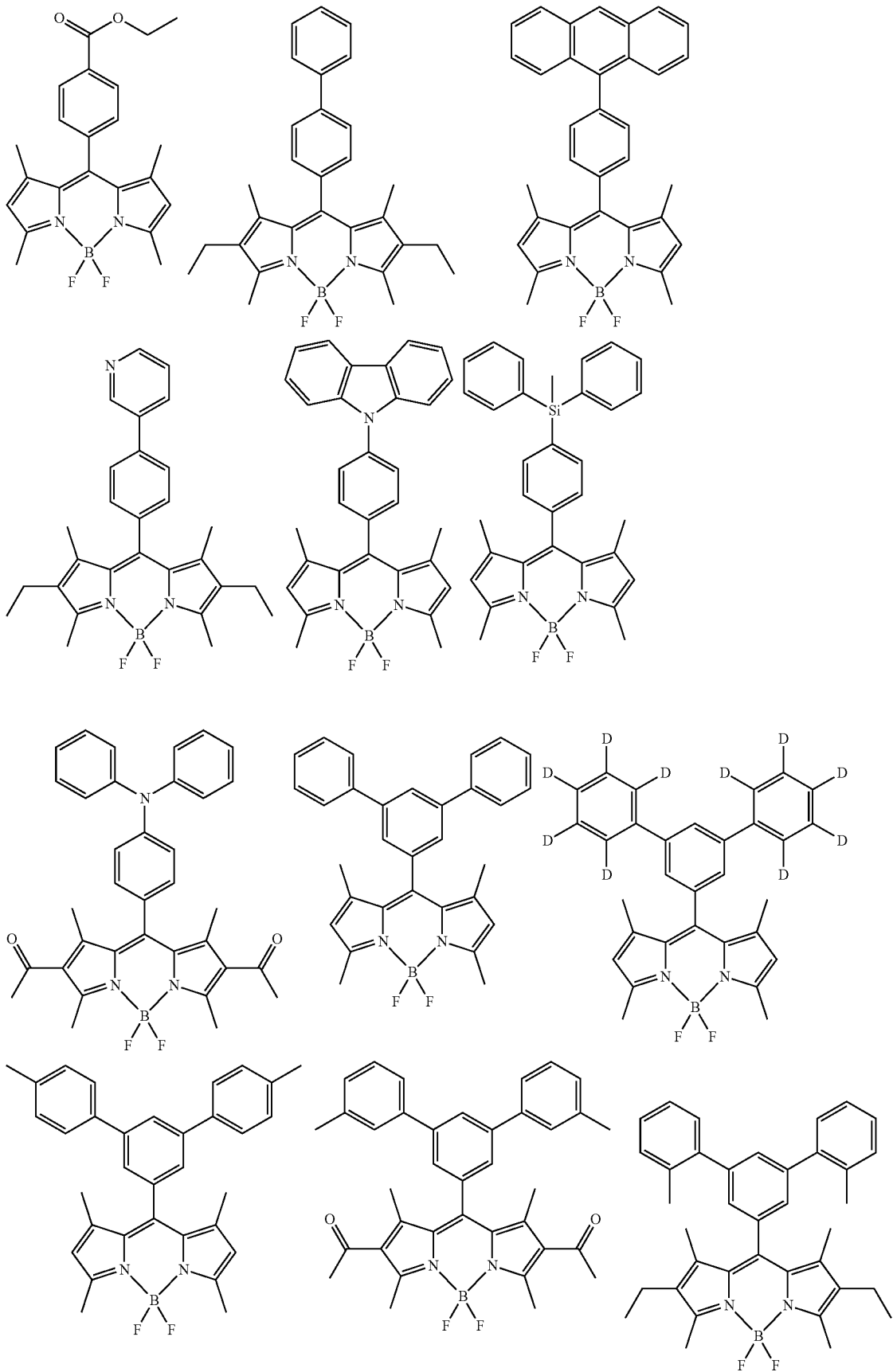

-continued
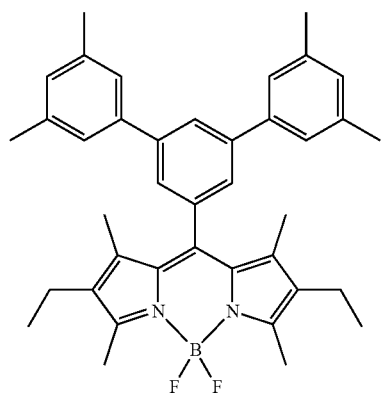
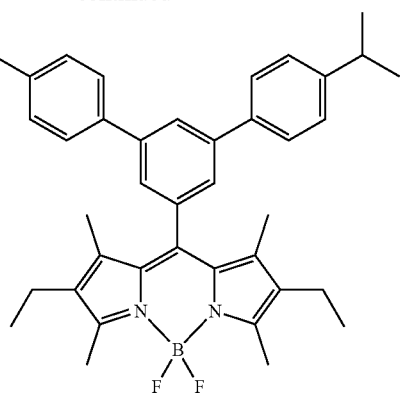
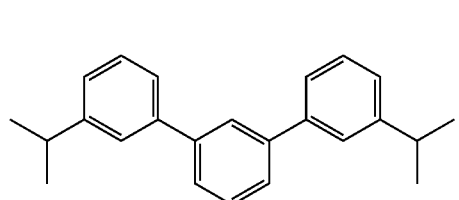
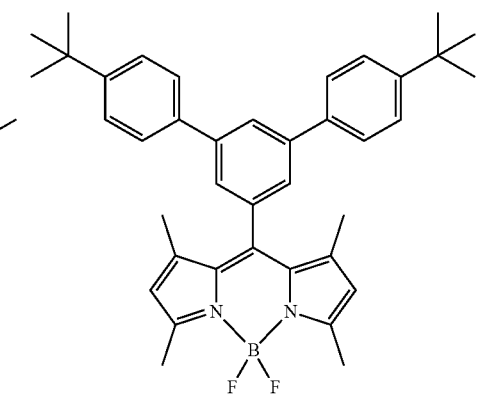
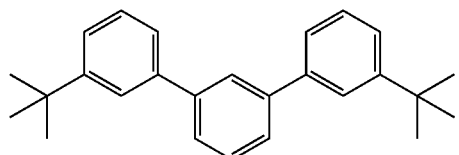
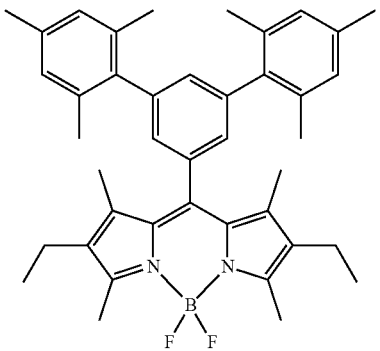
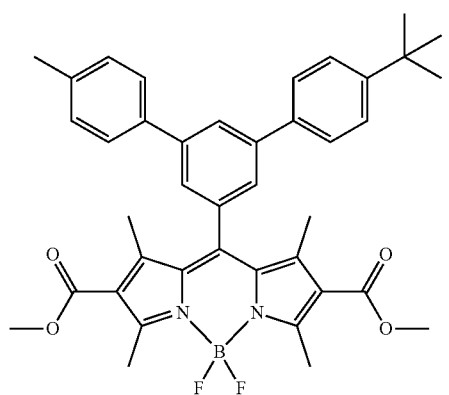
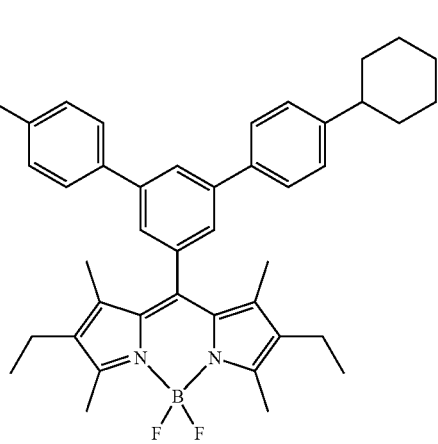

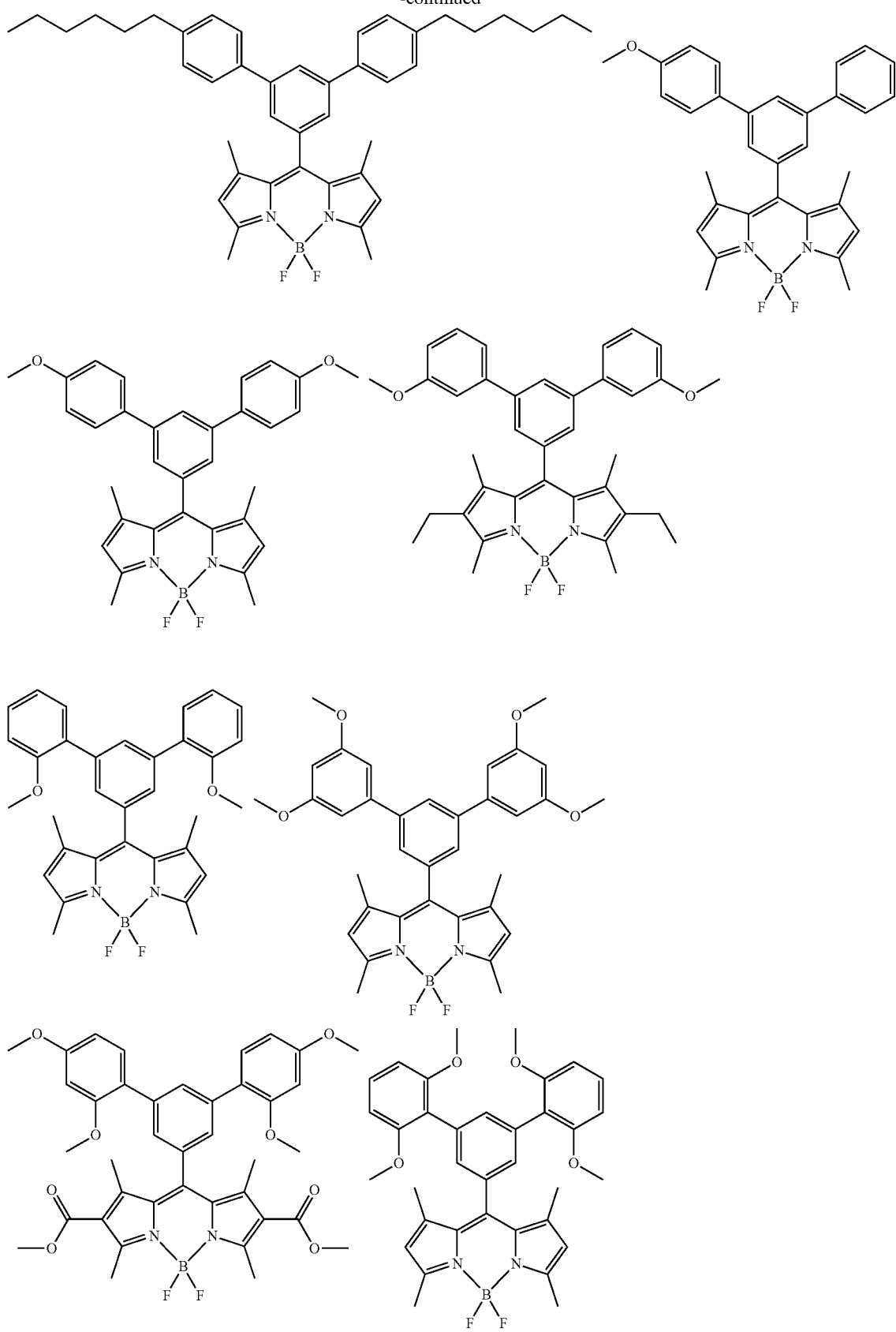

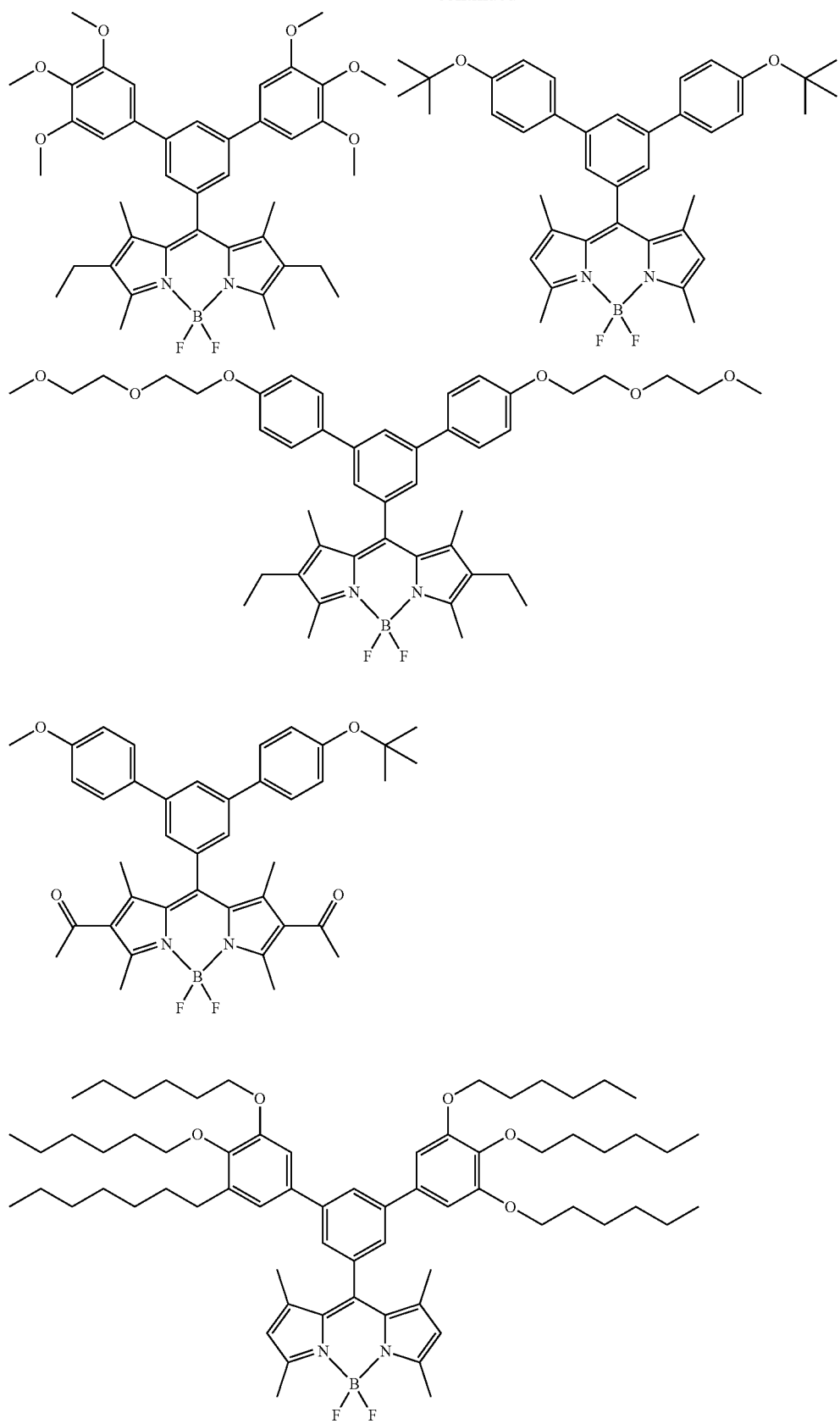

-continued
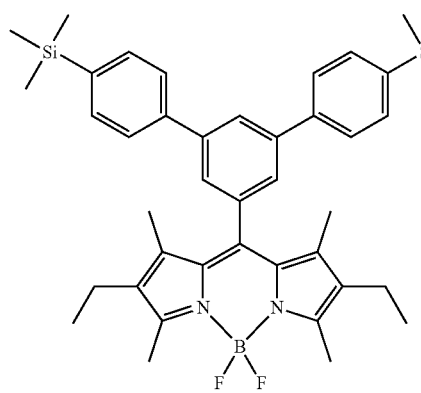 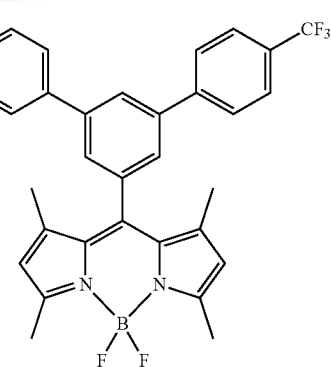
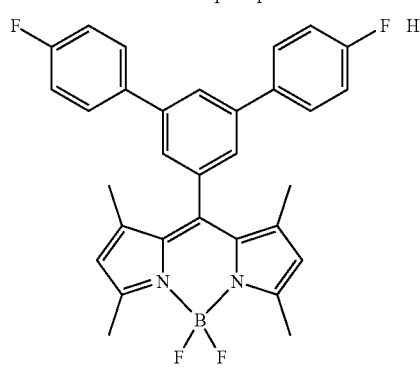 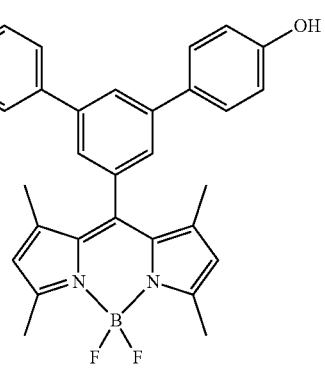
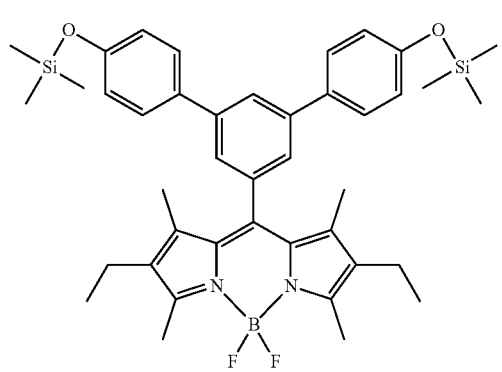 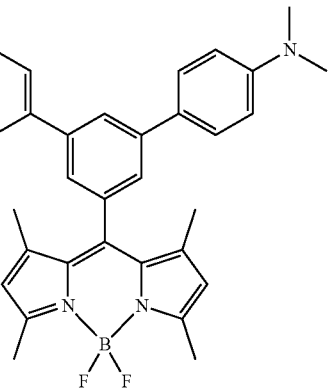
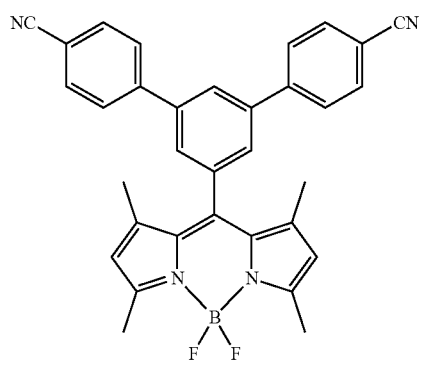 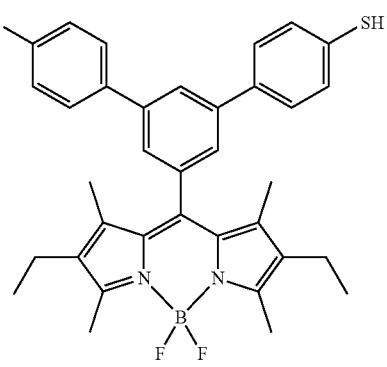

-continued
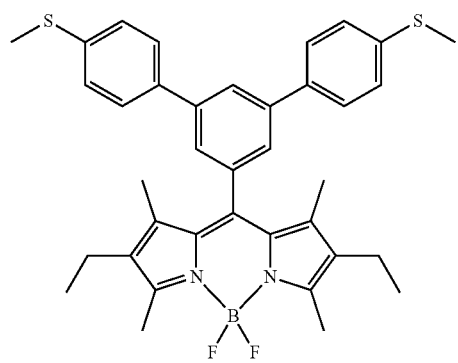
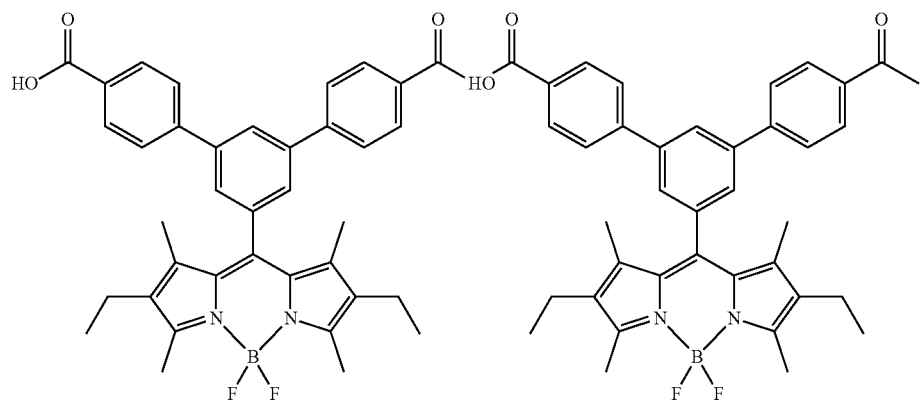
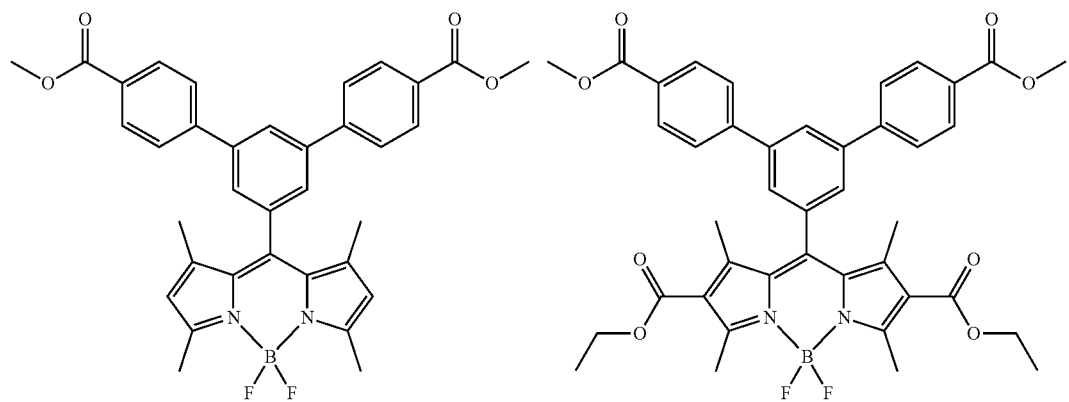
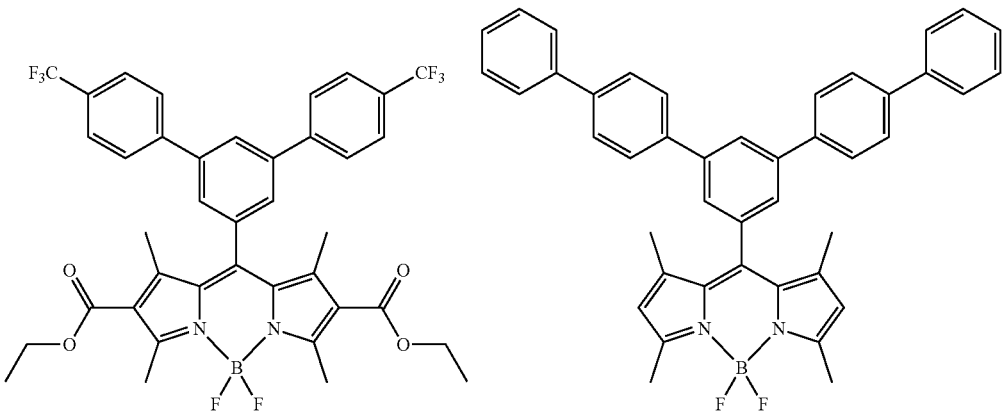

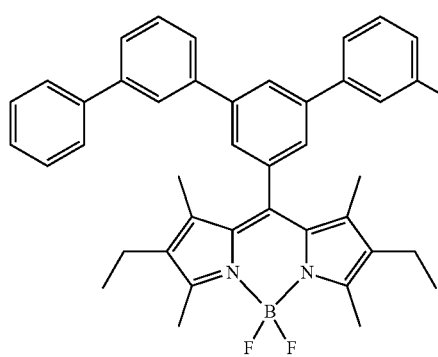
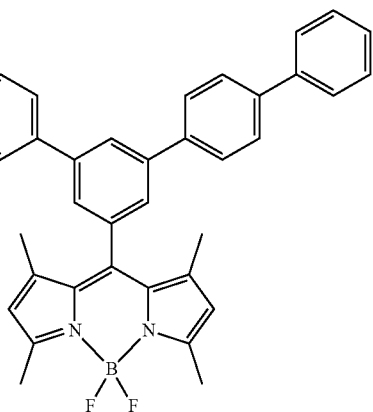
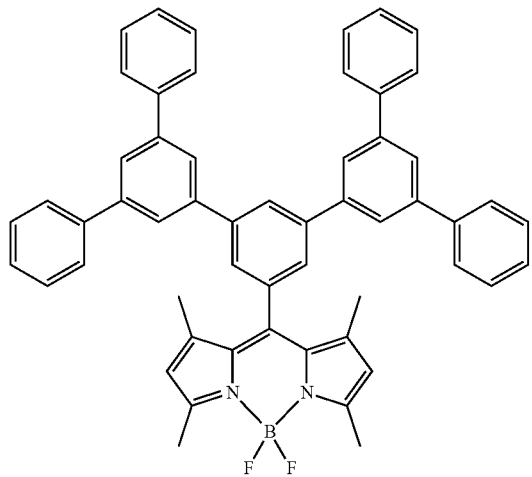
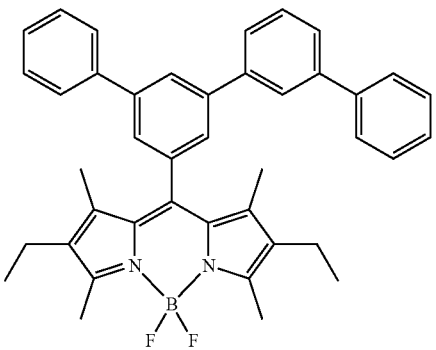
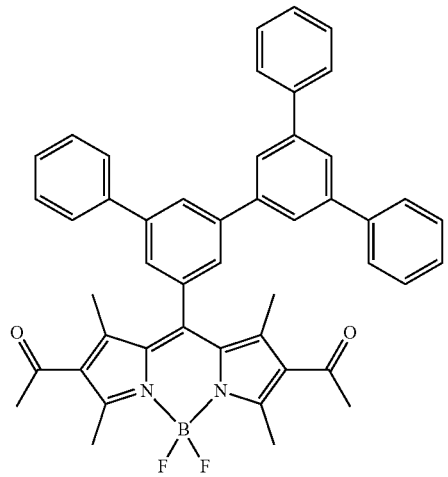
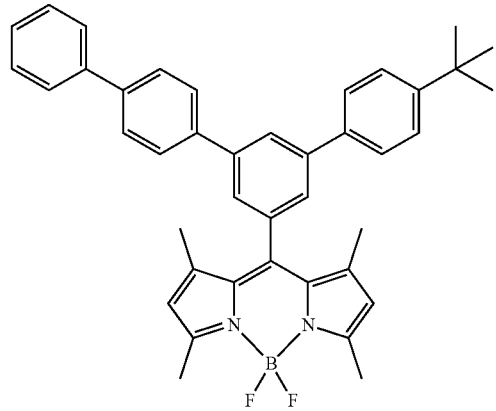

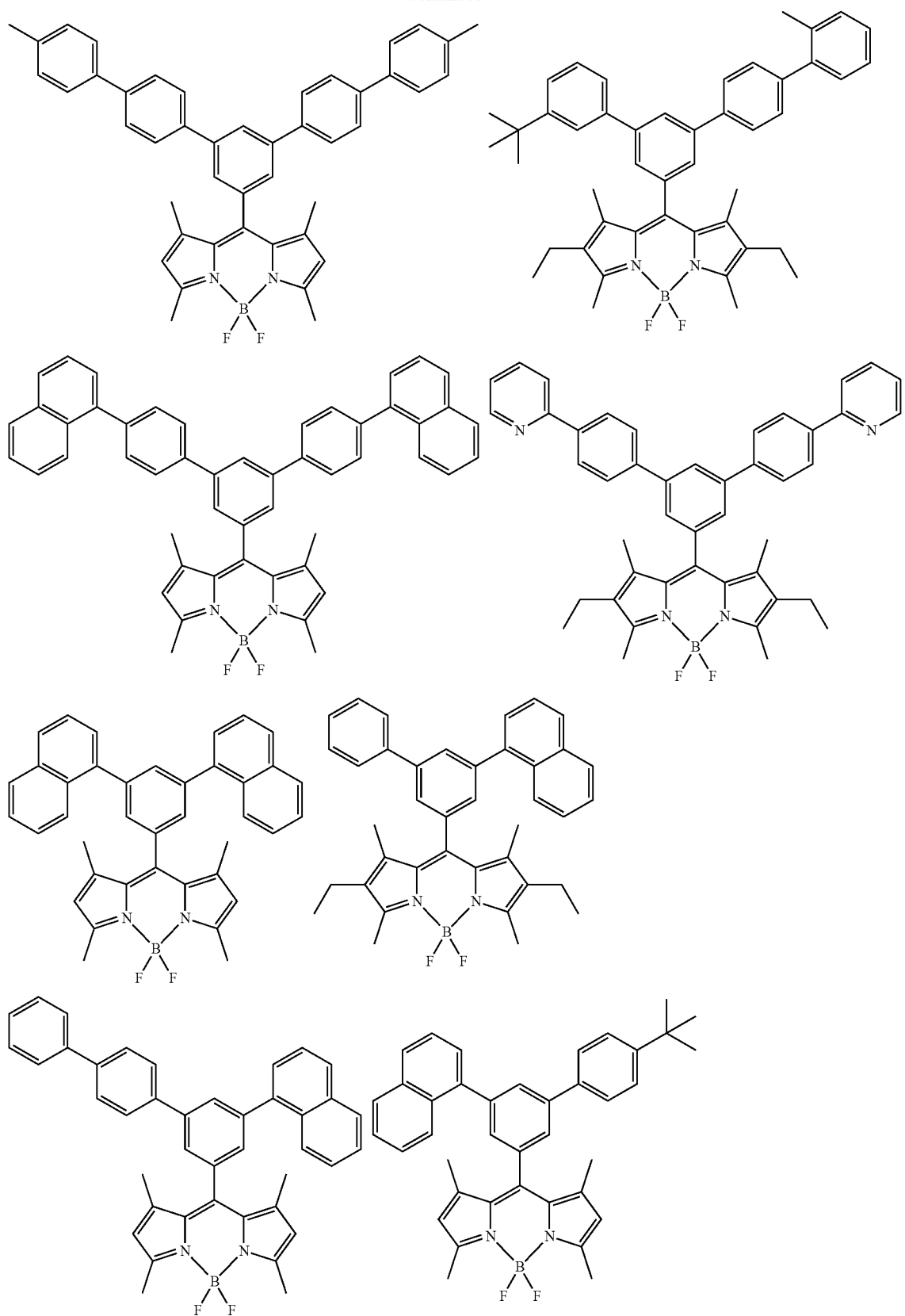

-continued
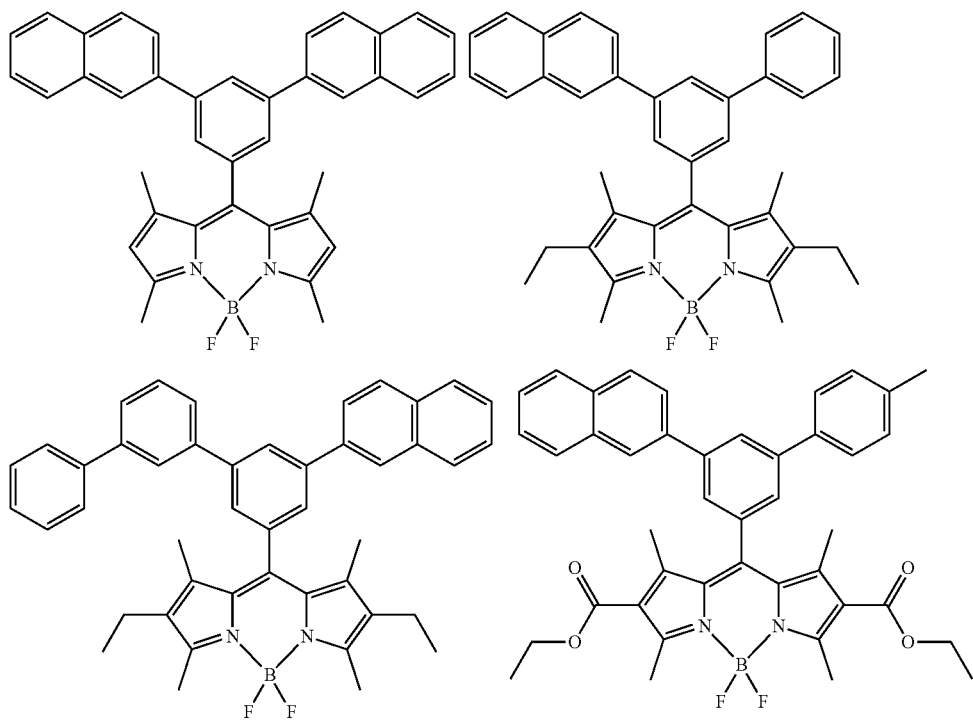
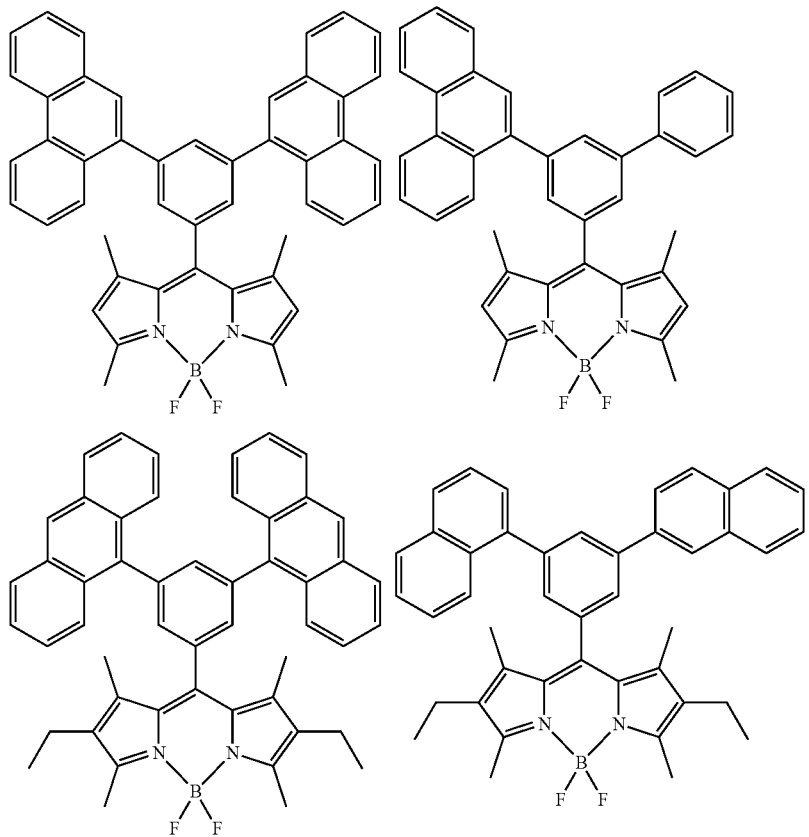

-continued
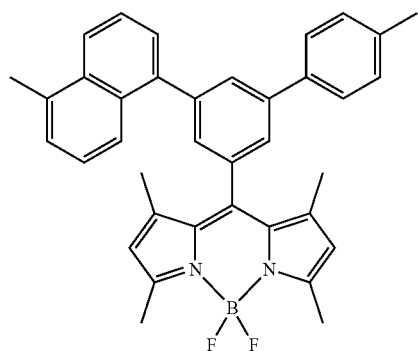
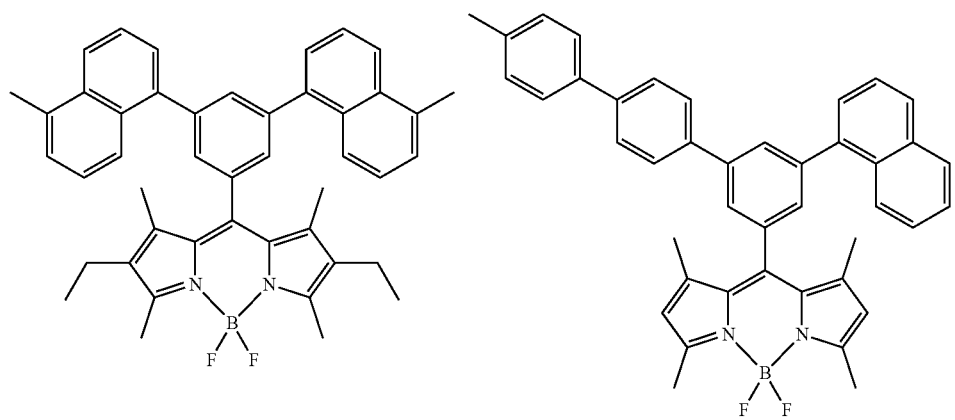
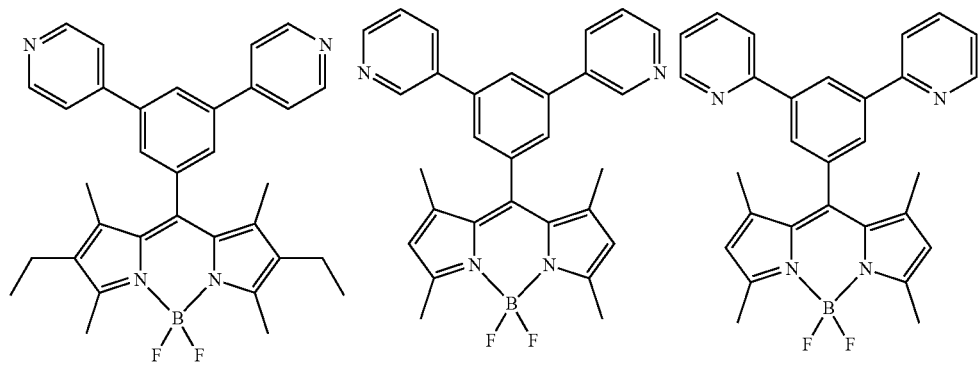
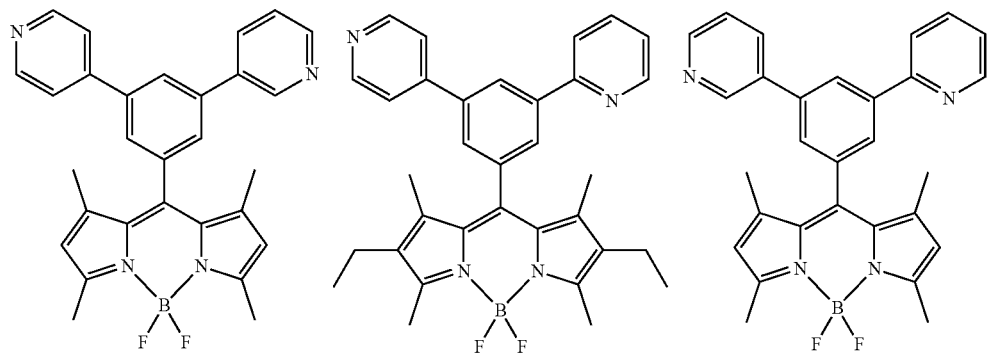

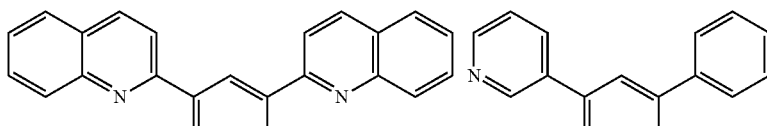
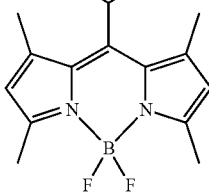 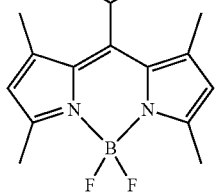
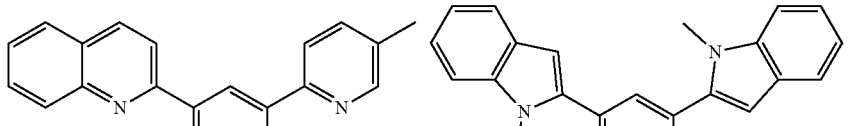
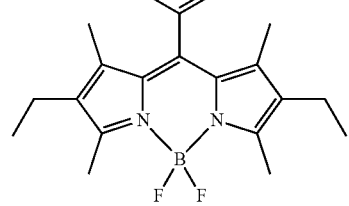 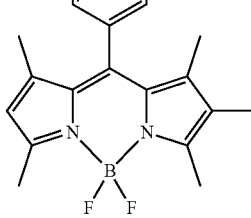
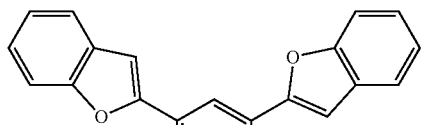 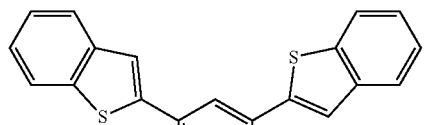
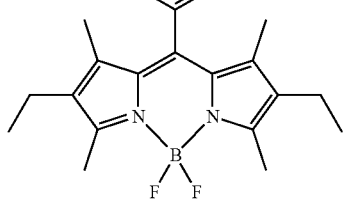 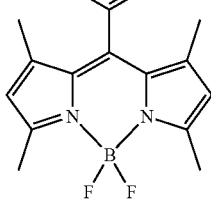
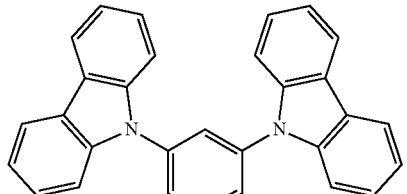 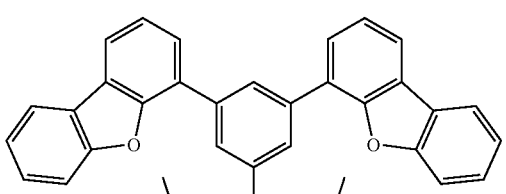
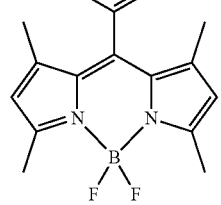 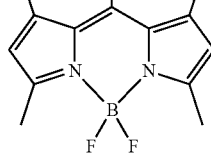

-continued
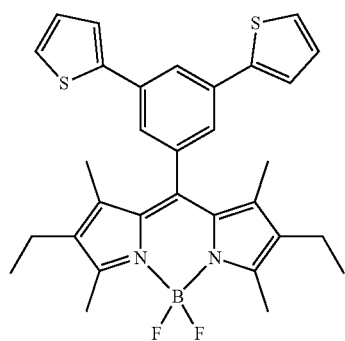
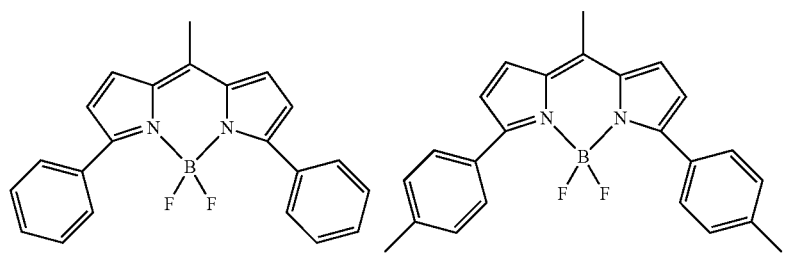
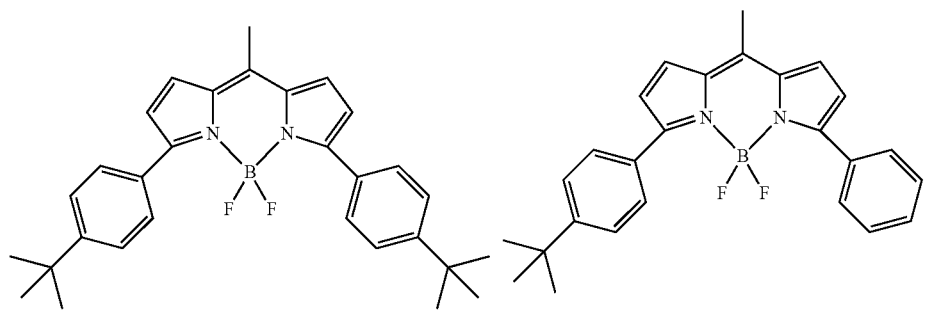
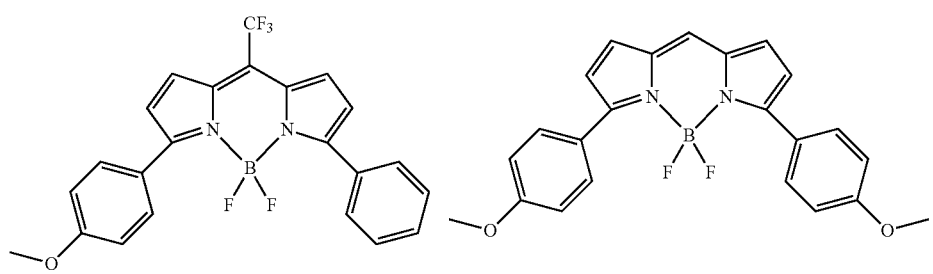
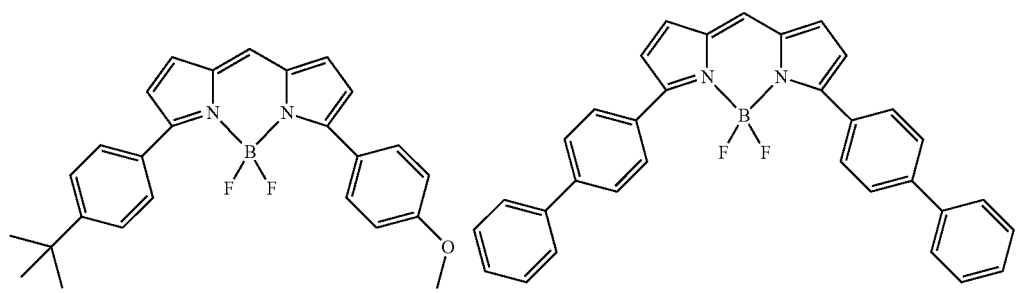

-continued
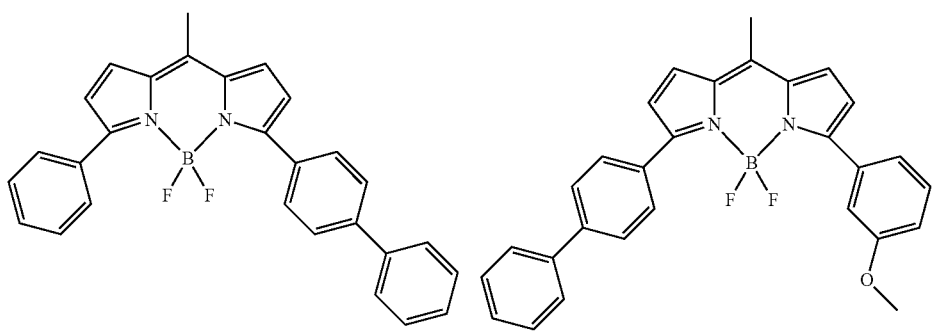
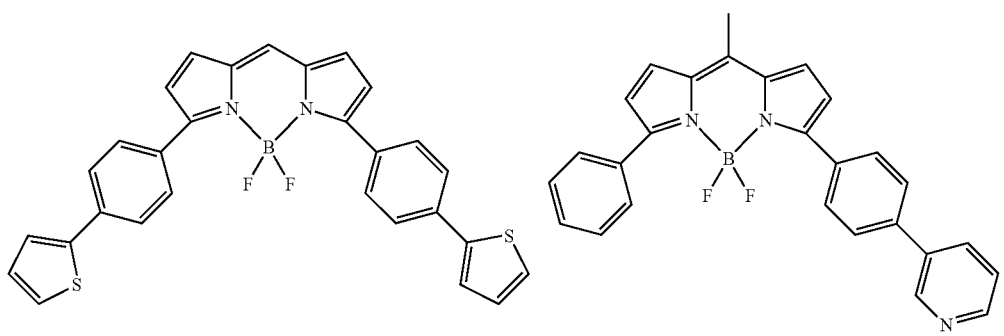
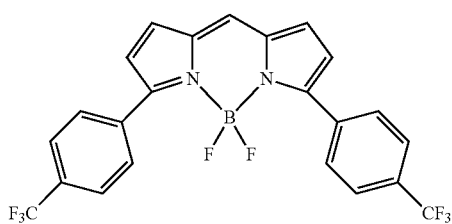
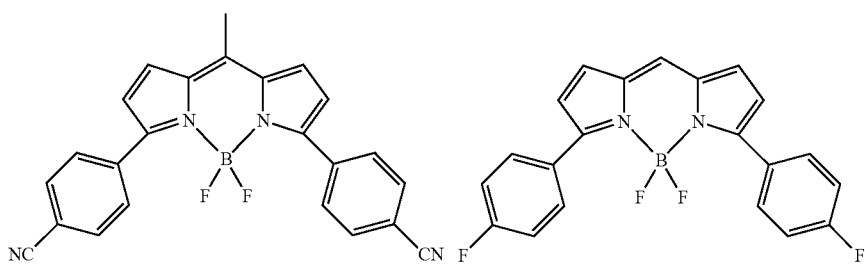
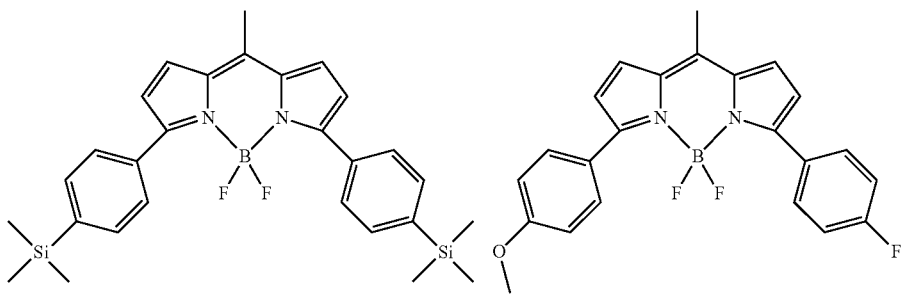

61
-continued
62
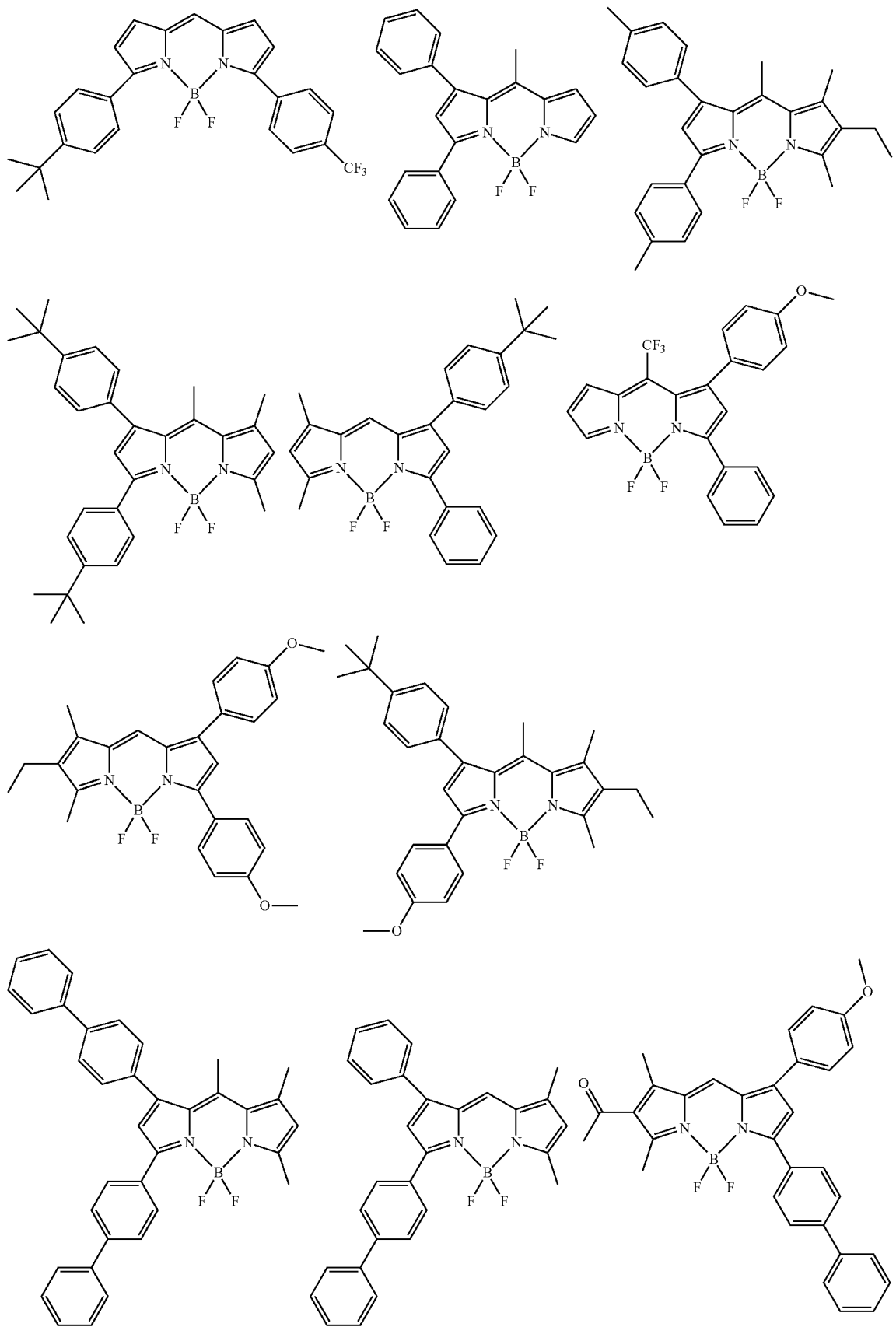

-continued
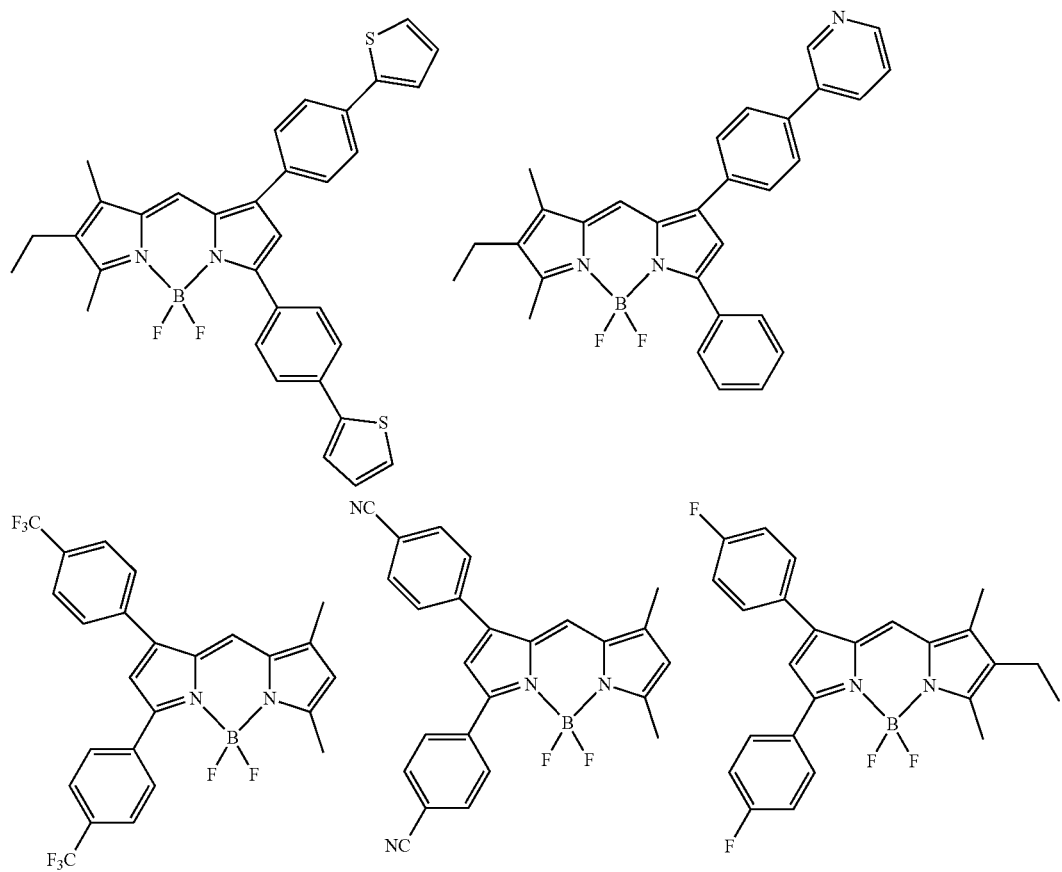
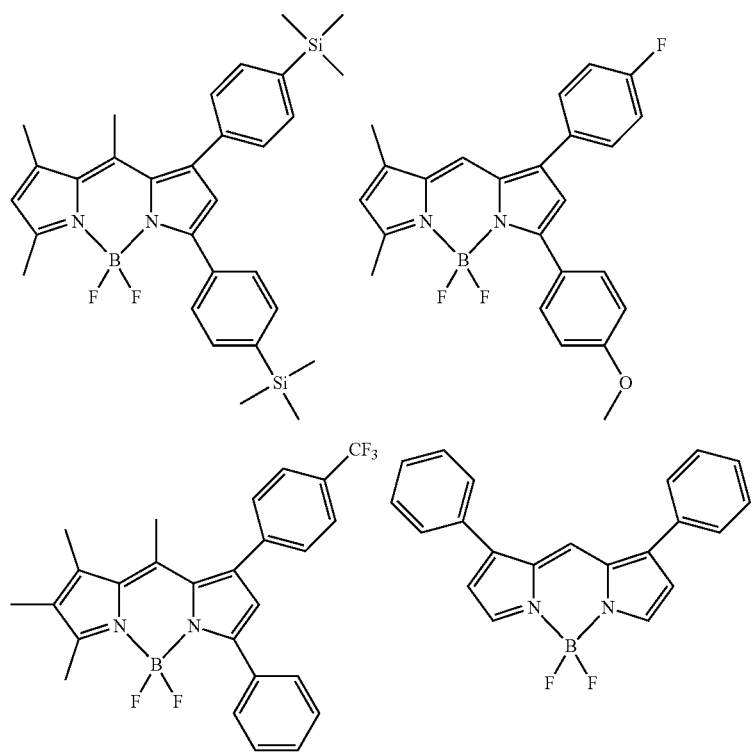

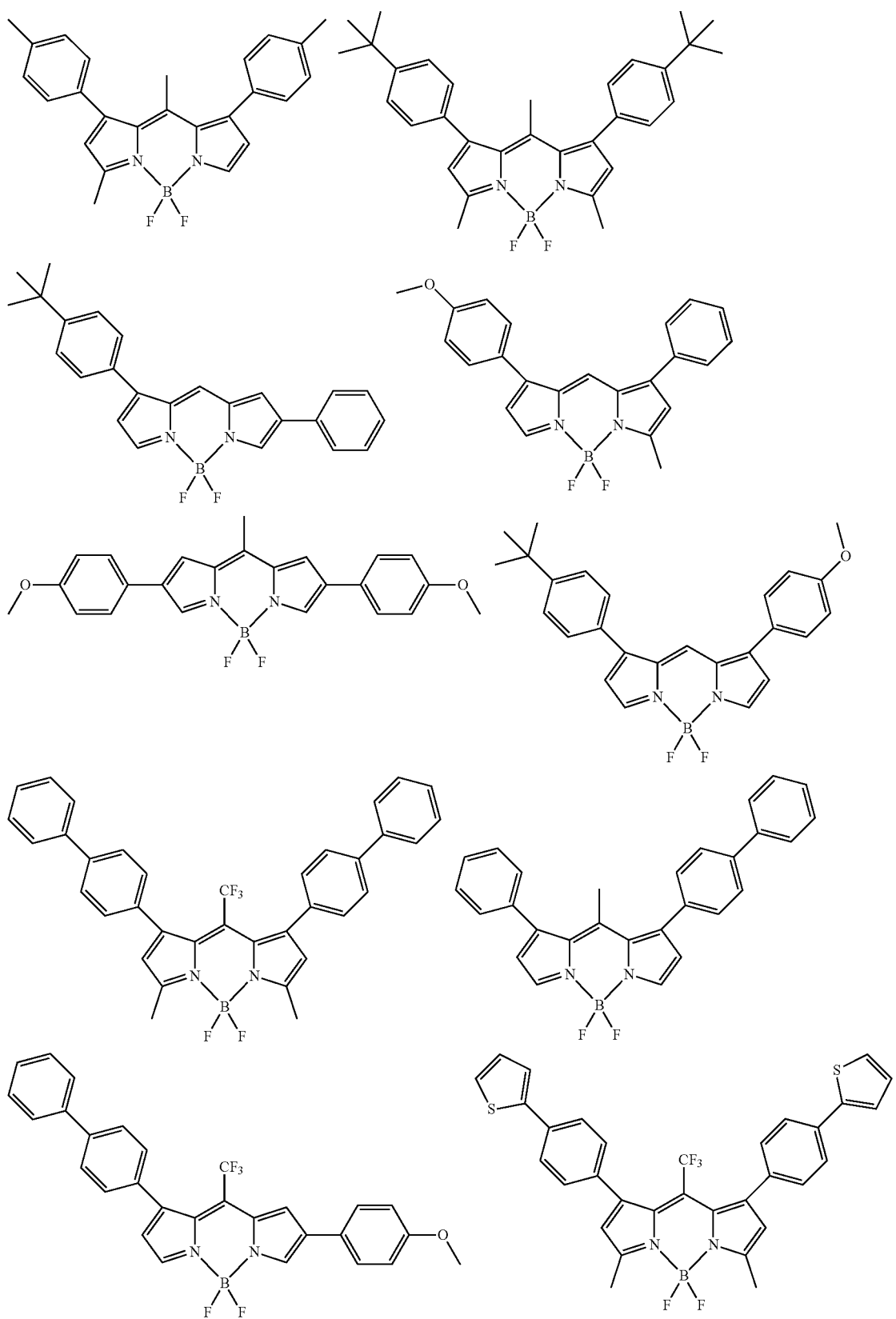

-continued
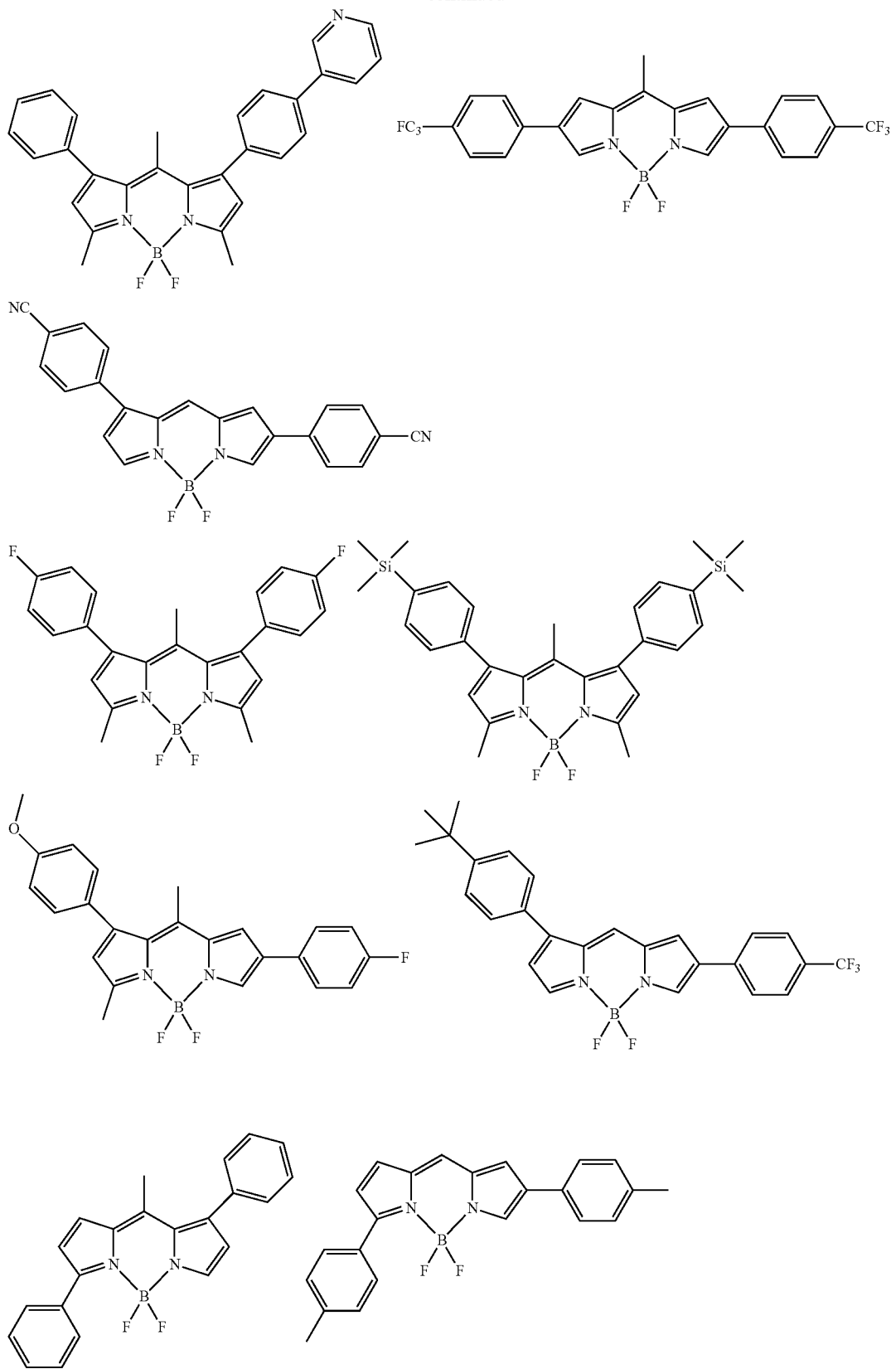

-continued
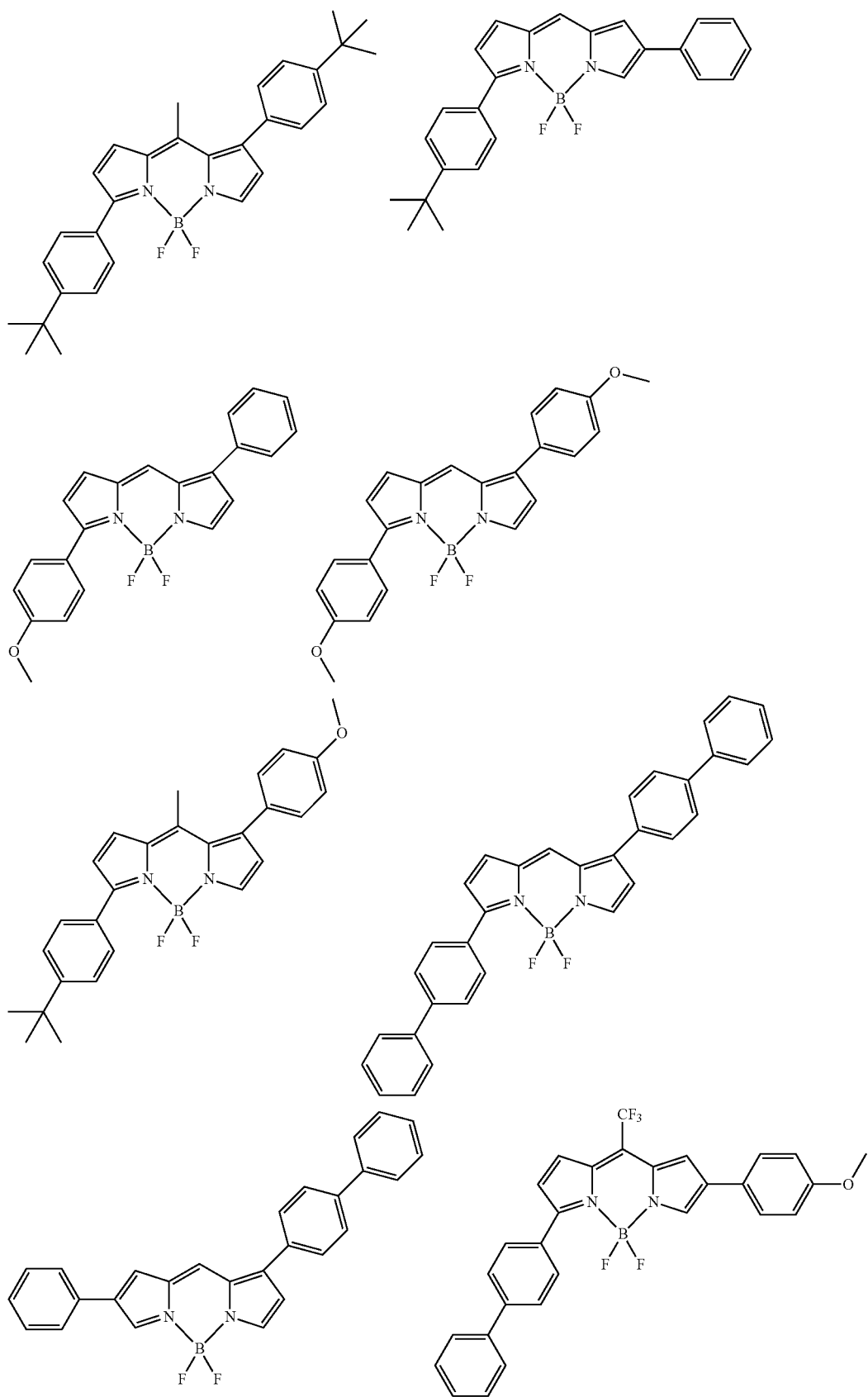

-continued
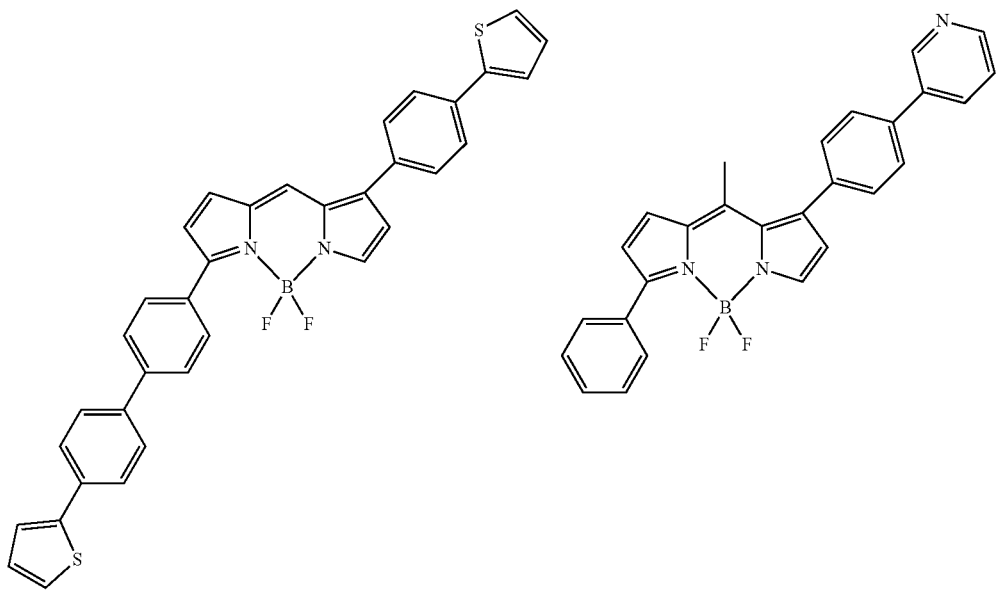
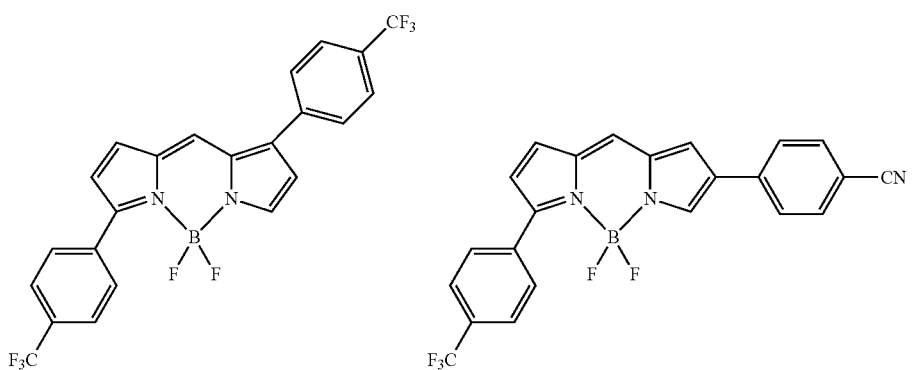
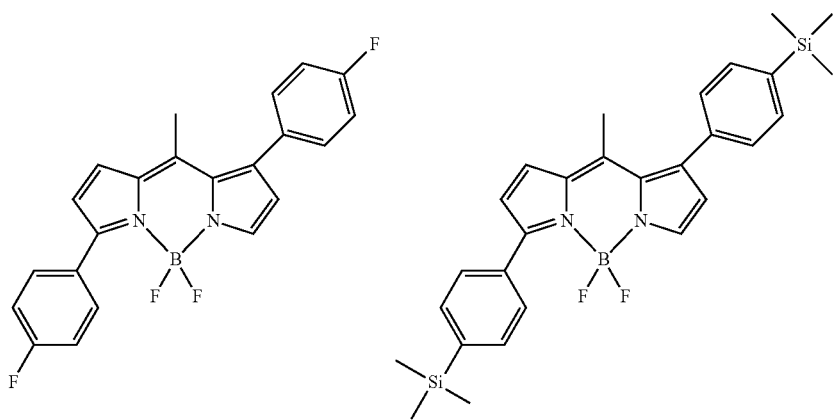

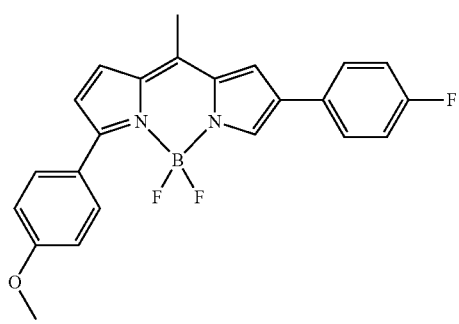
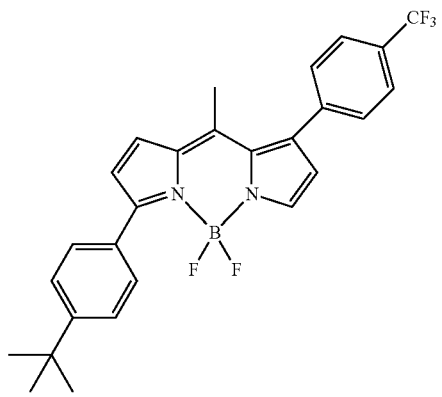
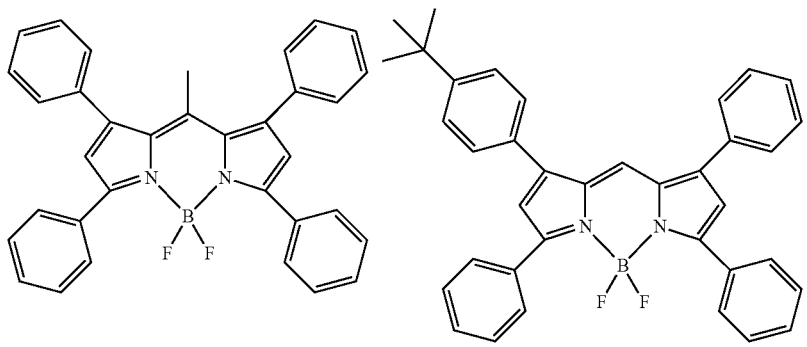
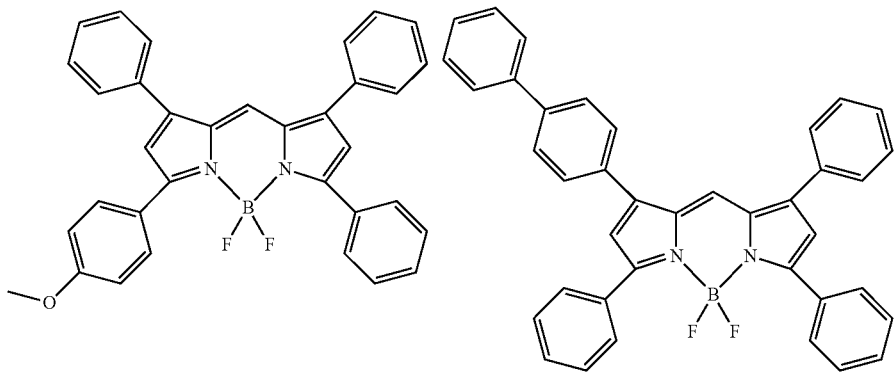
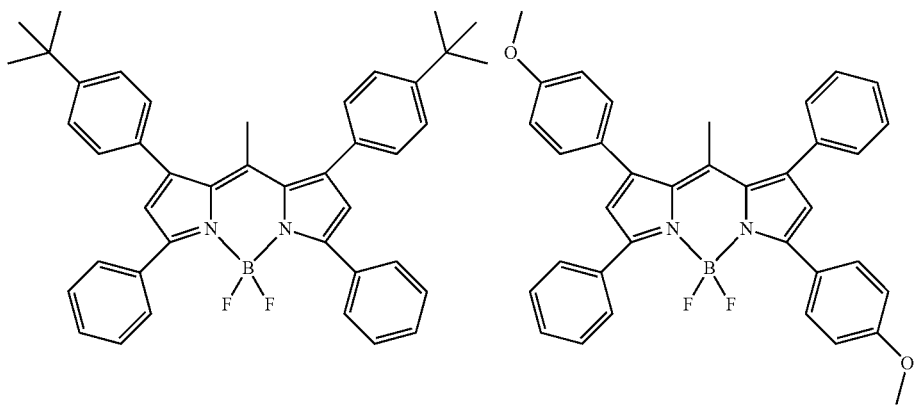

75
76
-continued
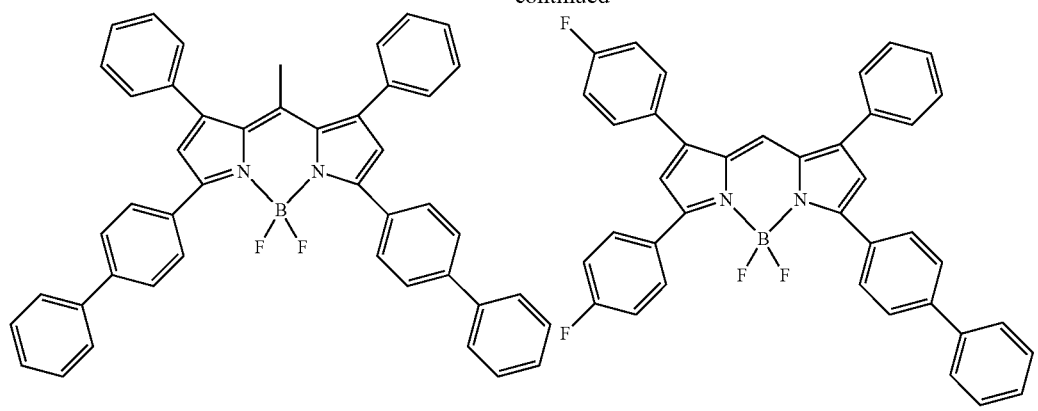

-continued
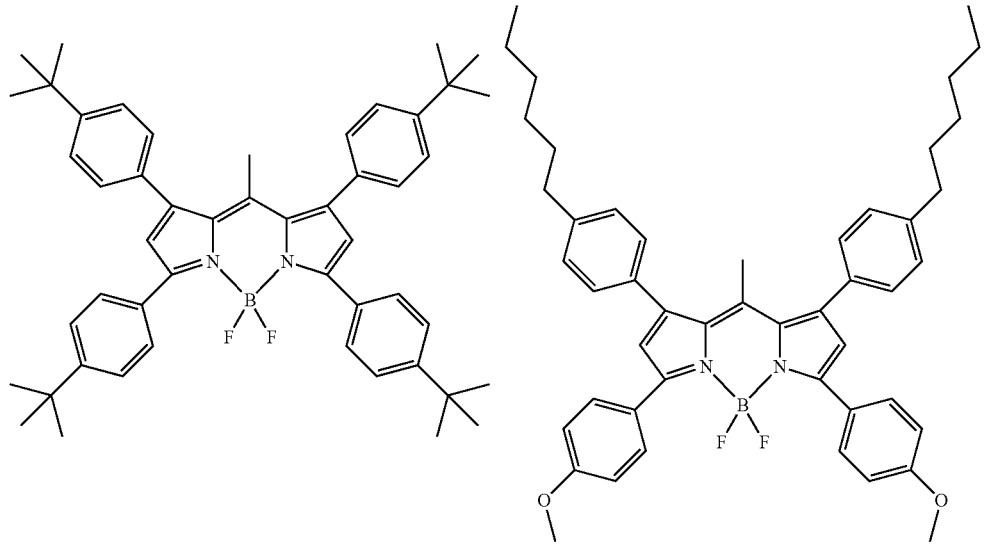
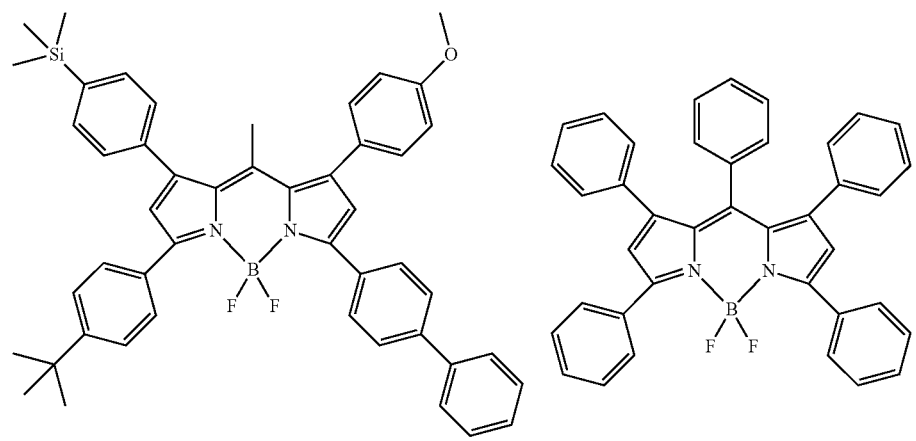
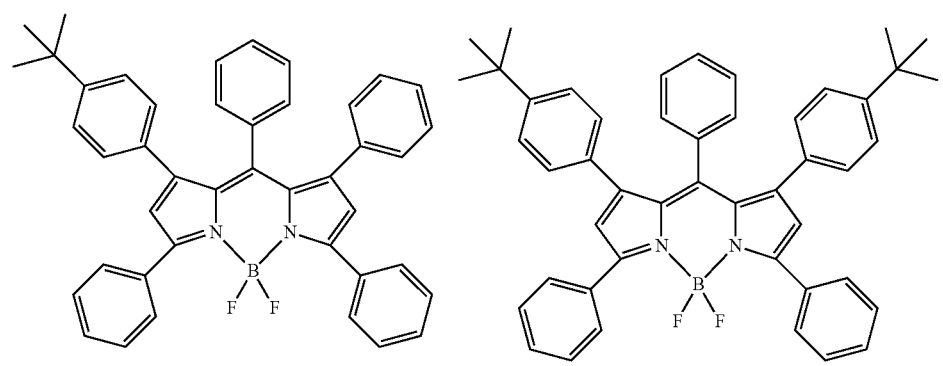

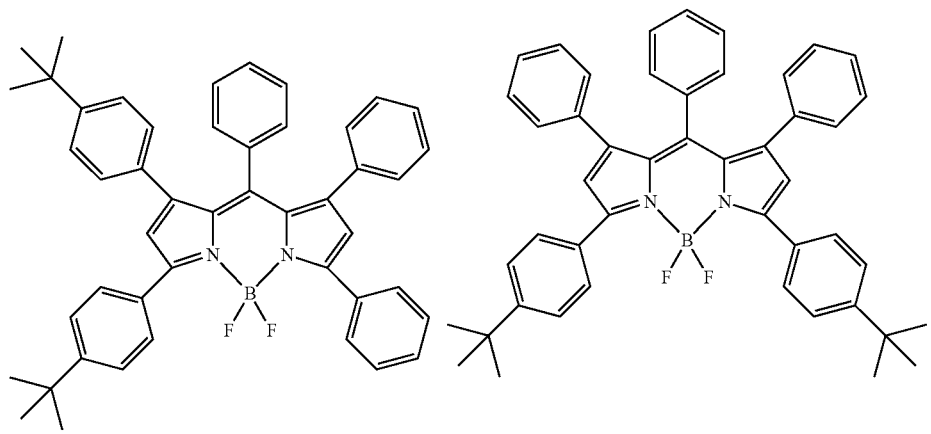
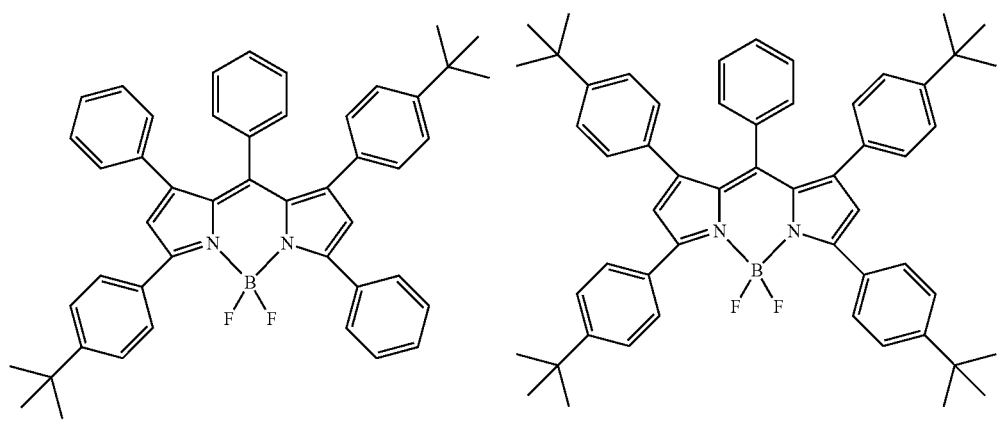
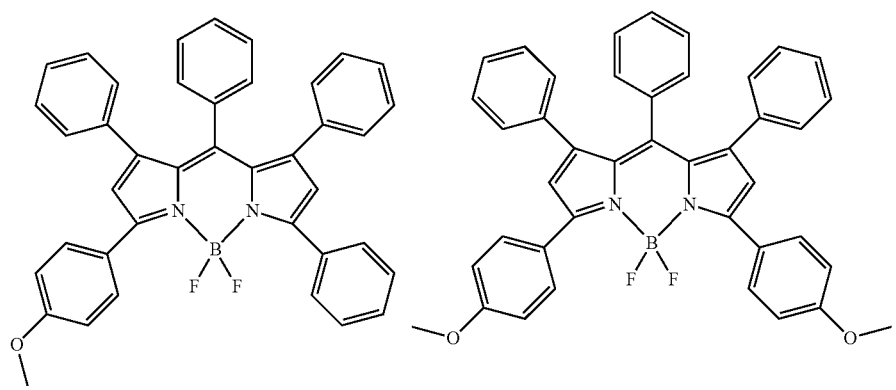
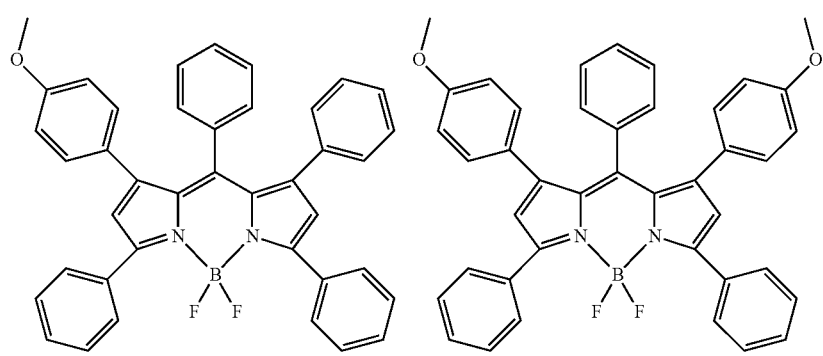

-continued
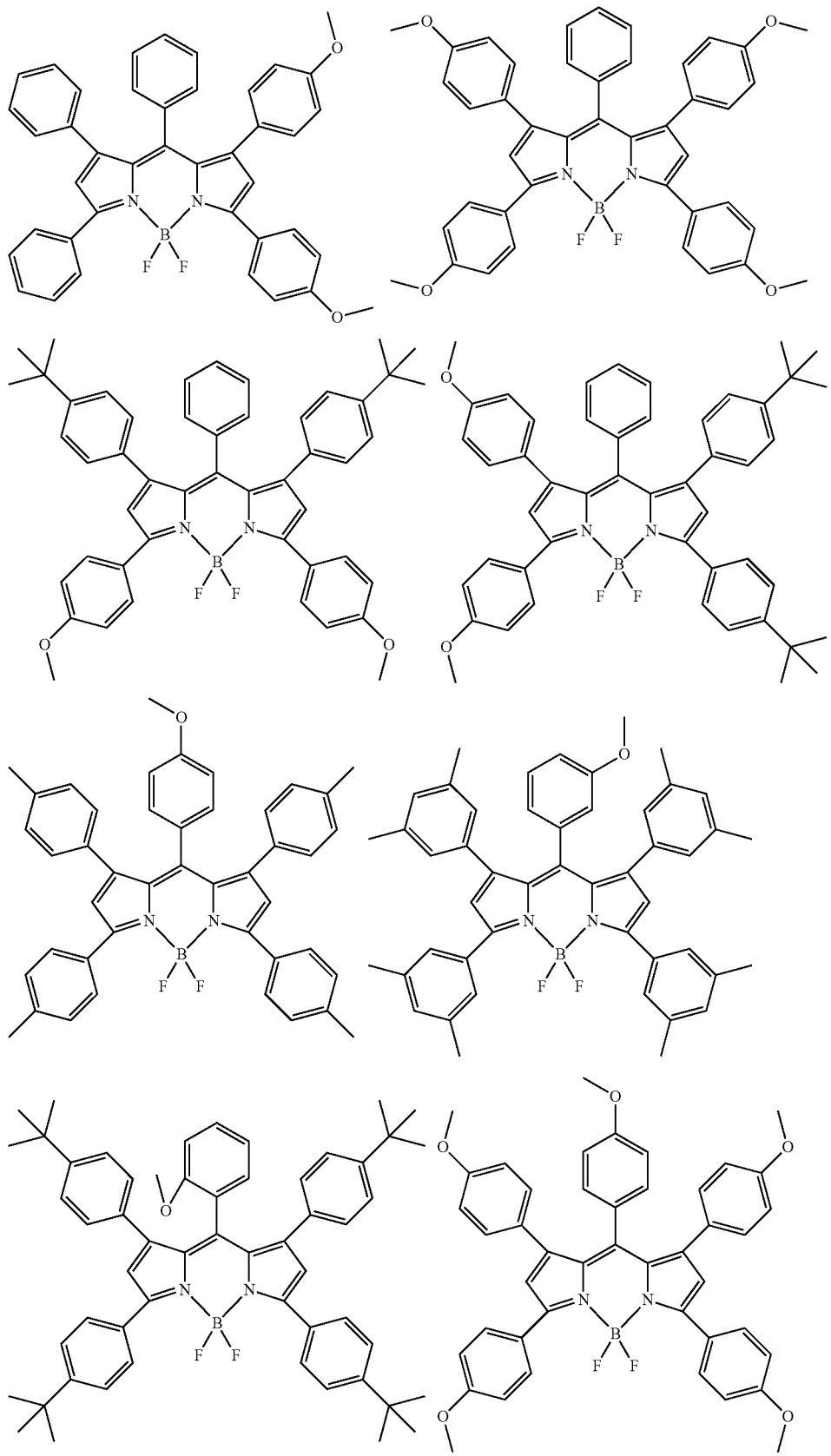

-continued
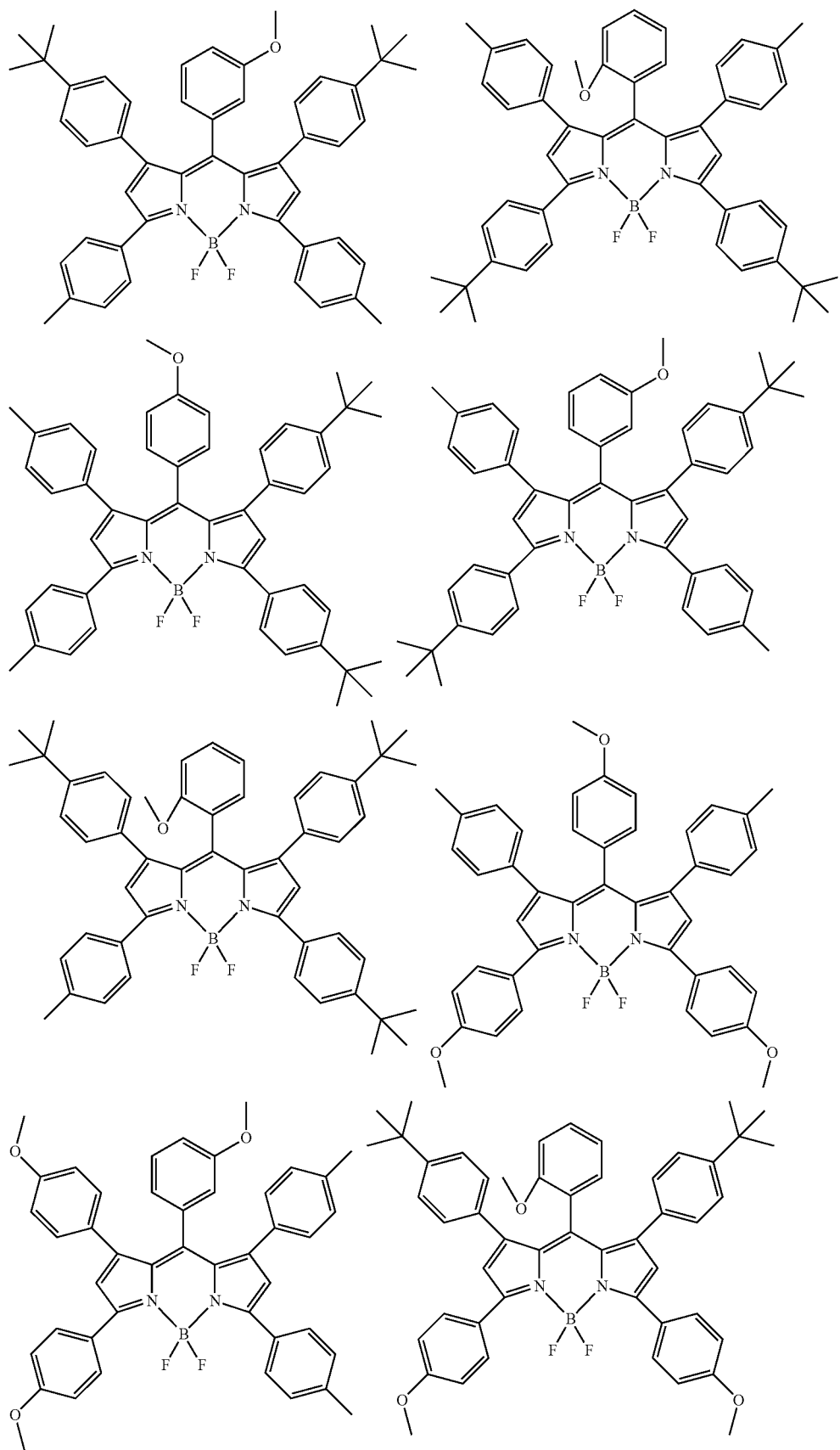

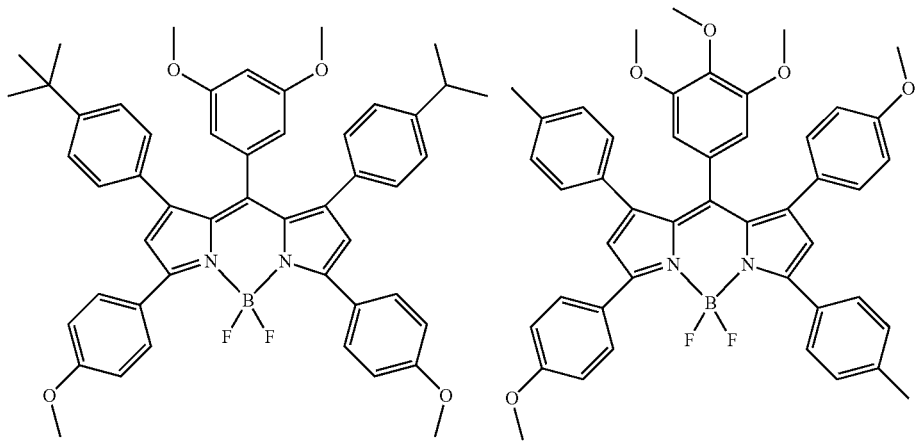
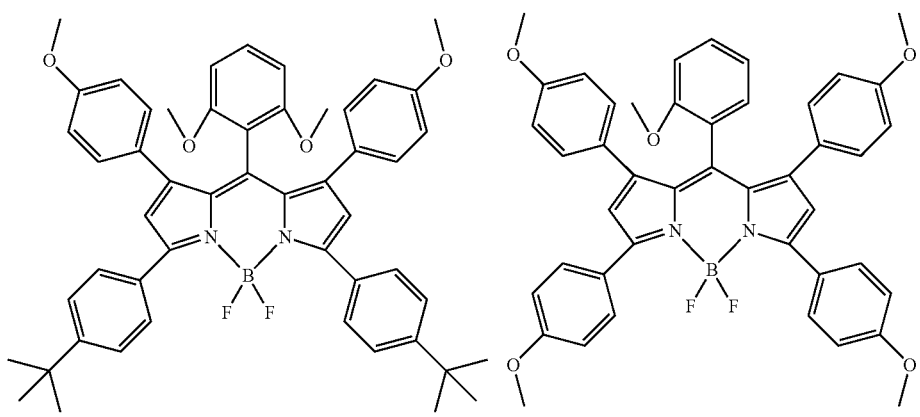
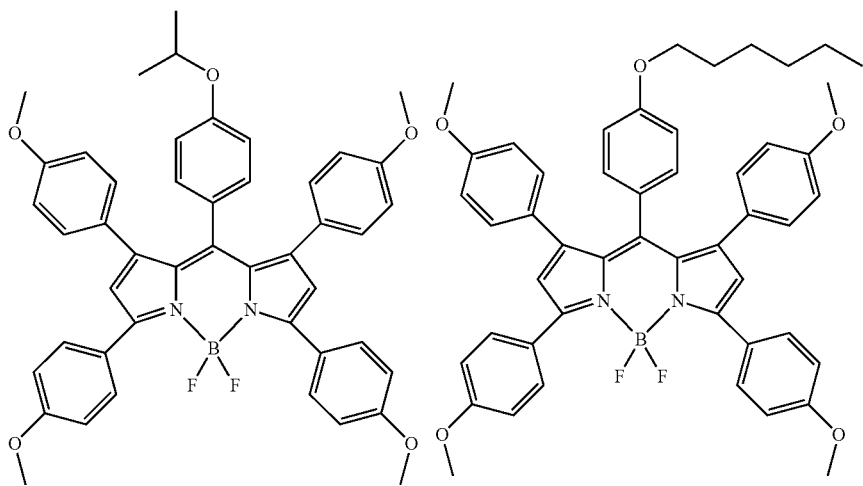

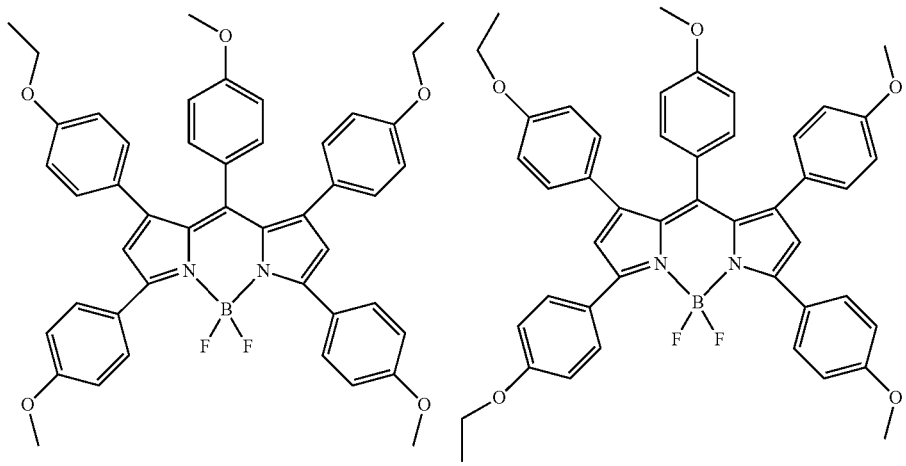
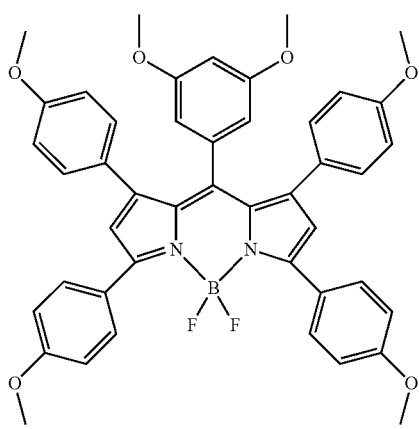
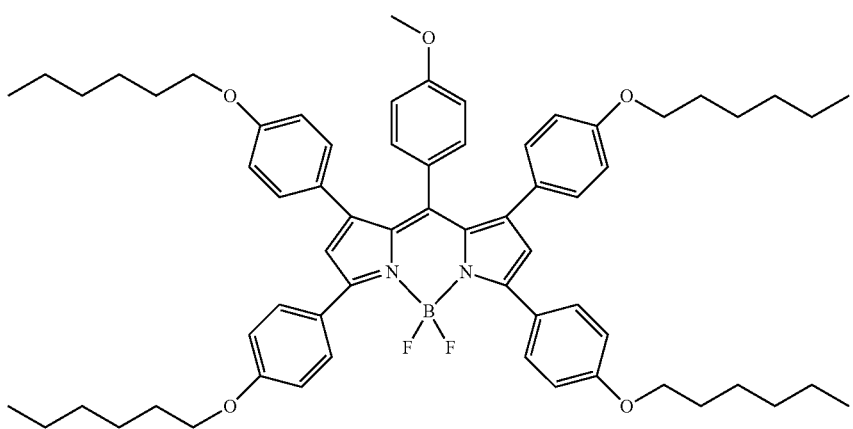

89
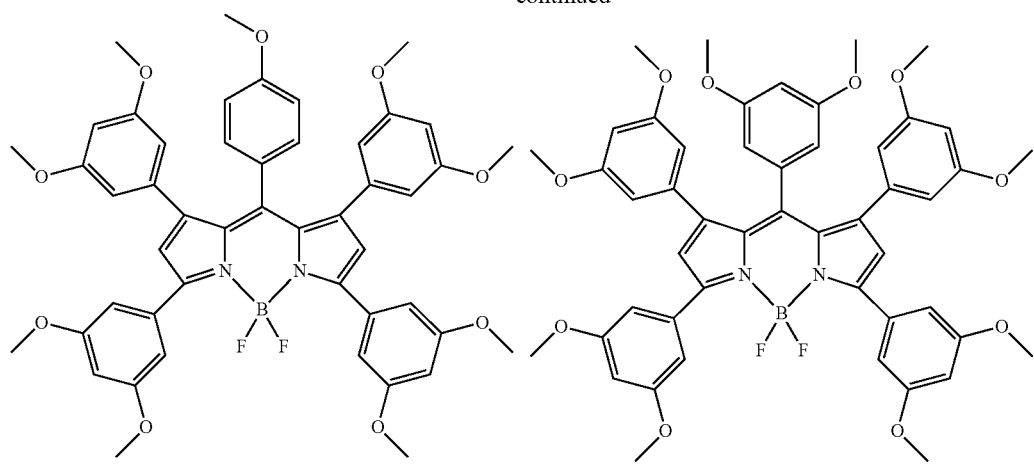
90
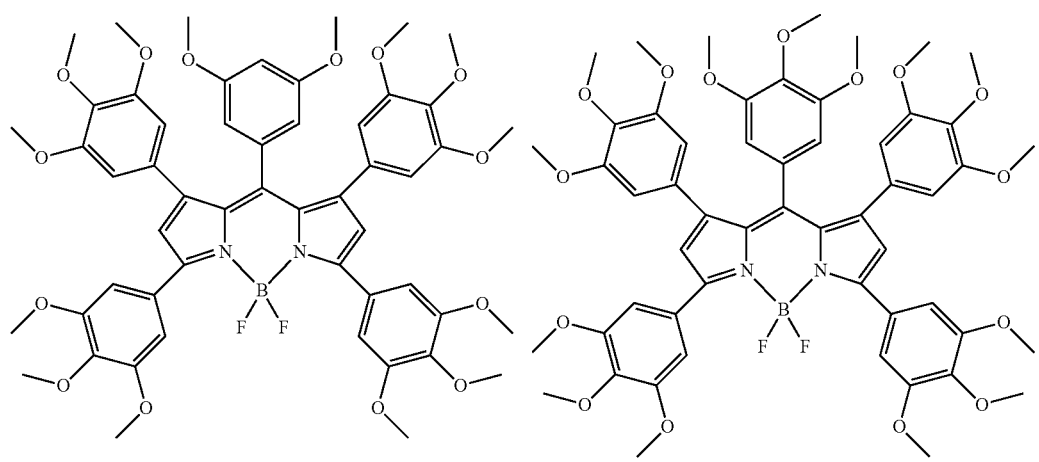
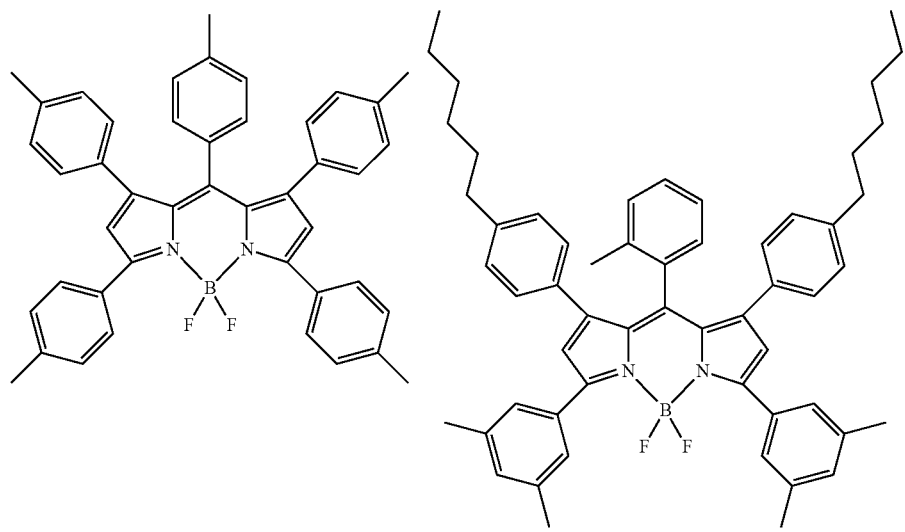

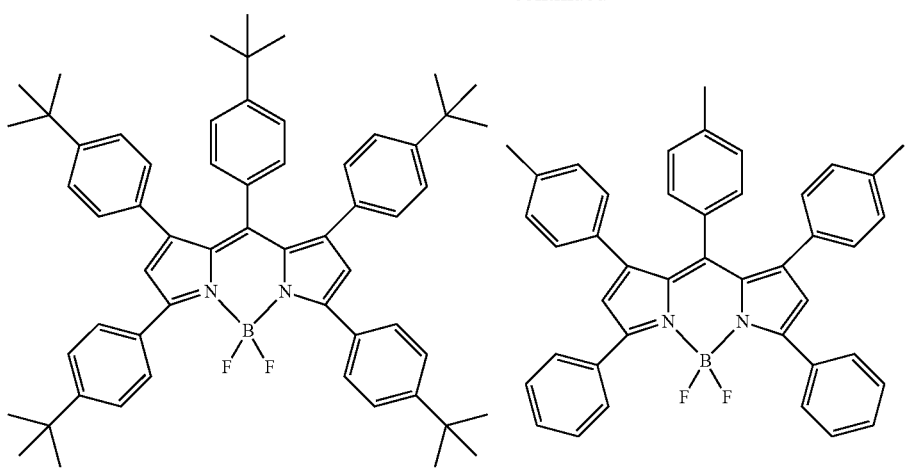
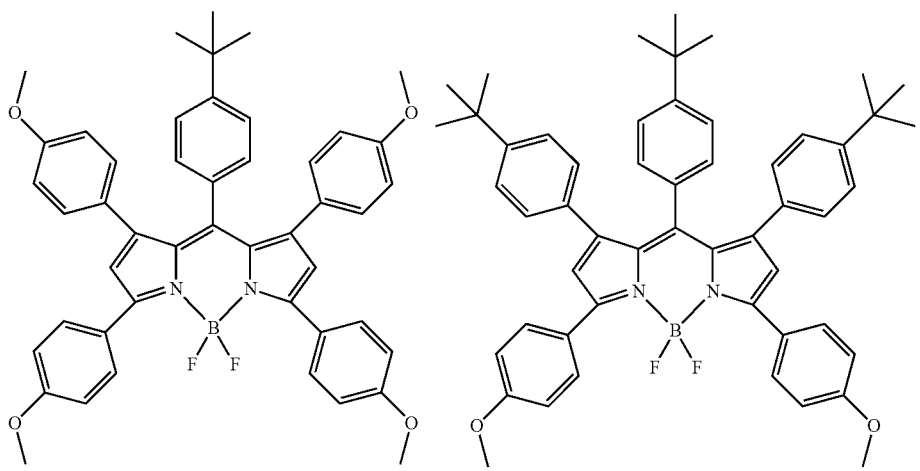
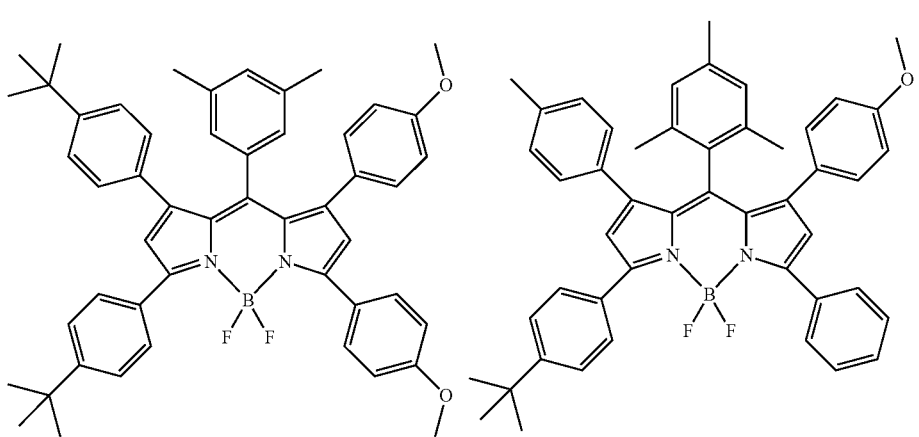

-continued
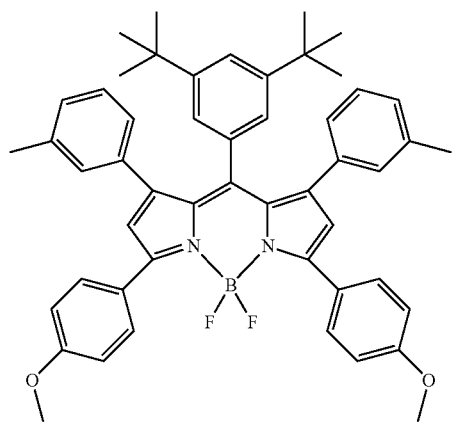
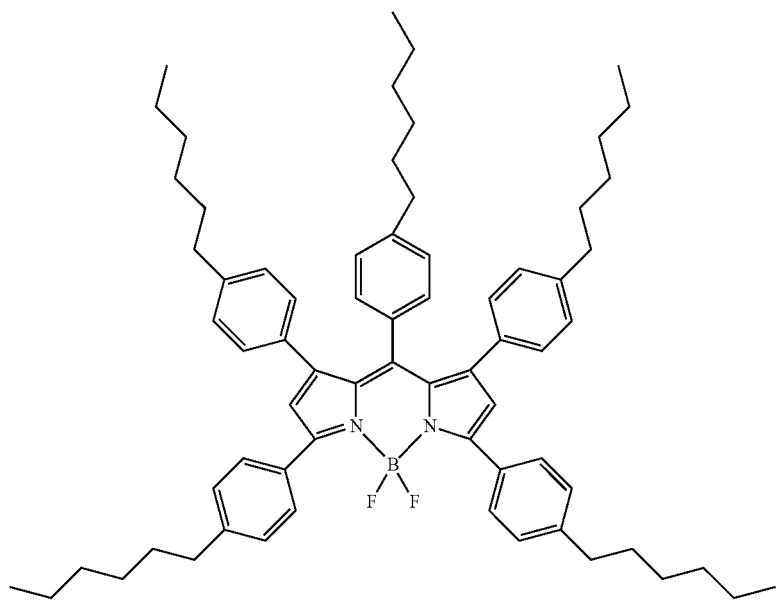
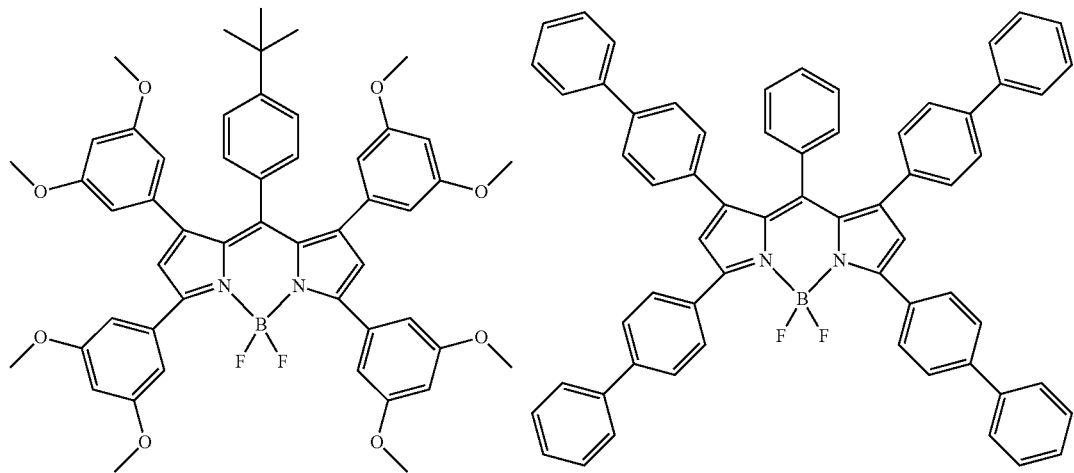

95
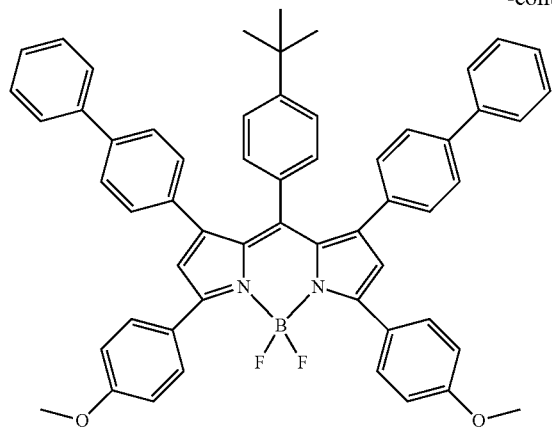
96
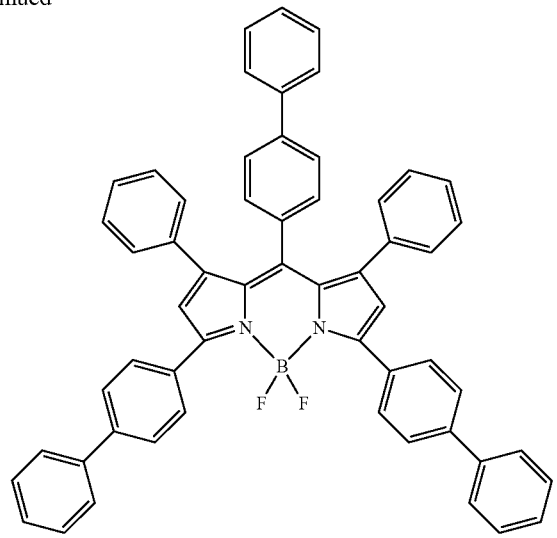
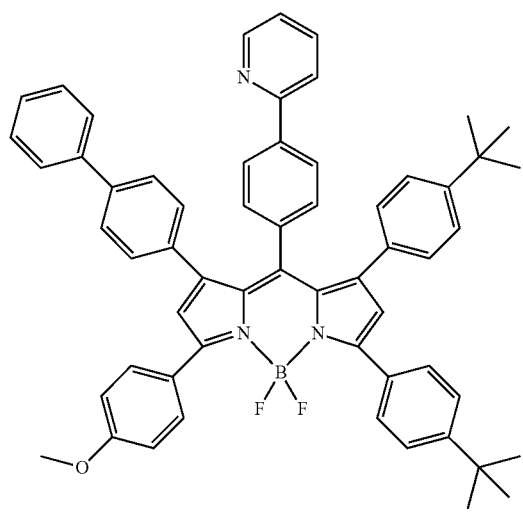
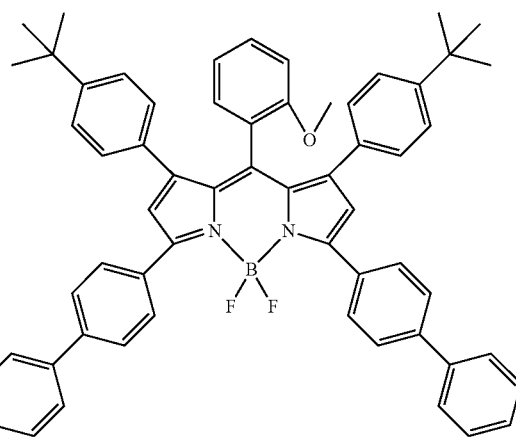
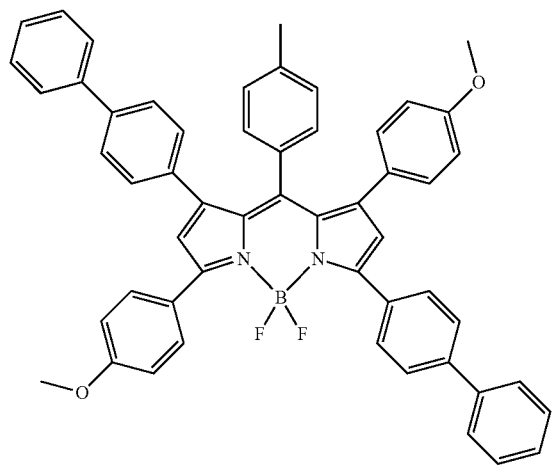

-continued
97 98
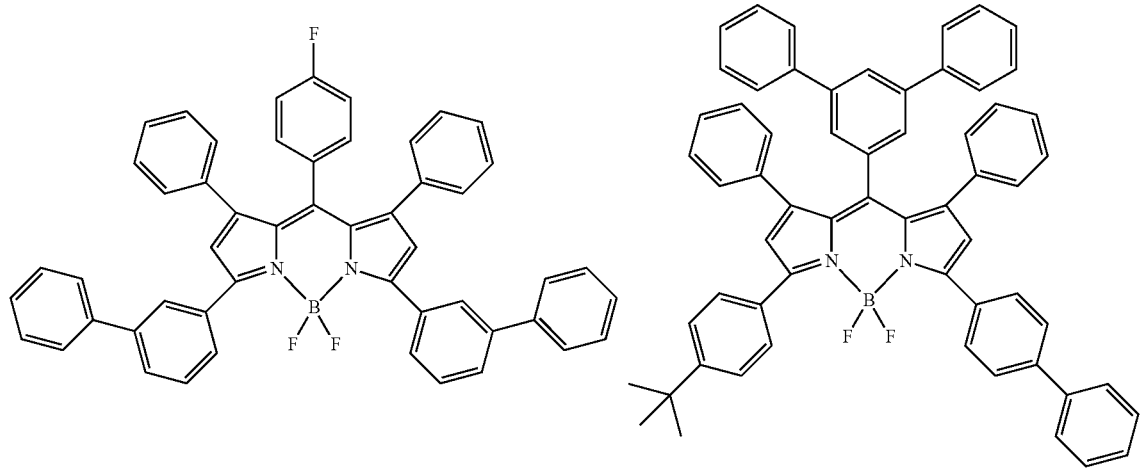
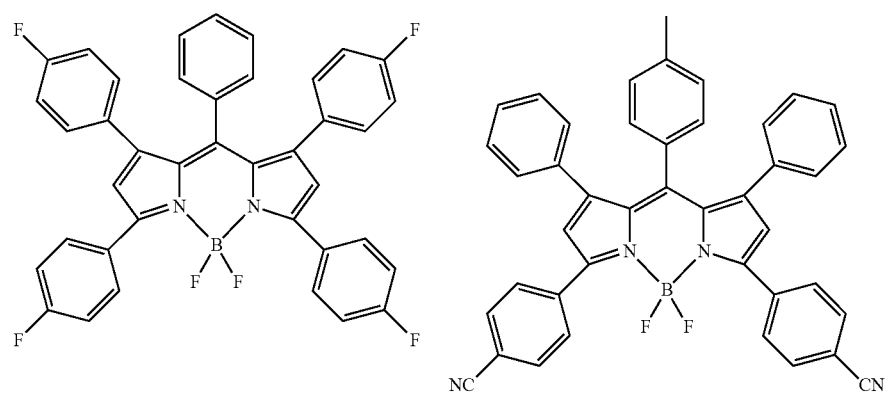
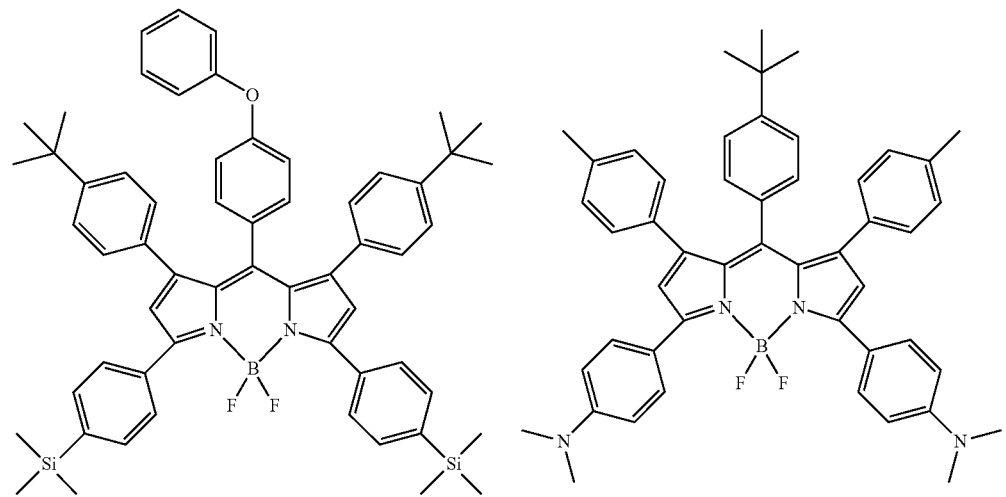

99                                                                100
-continued
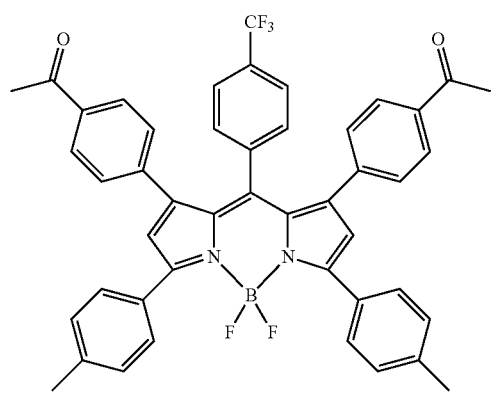
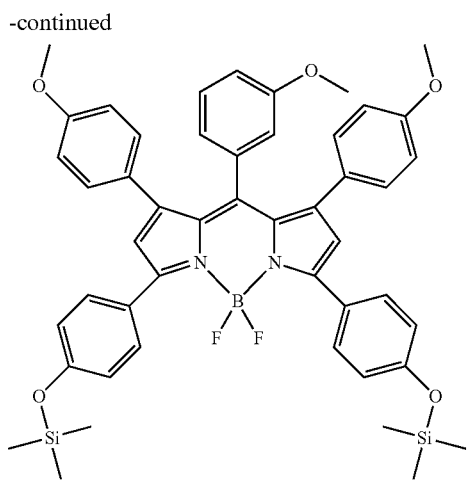
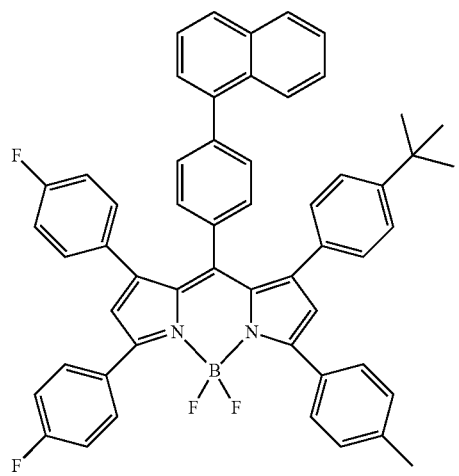
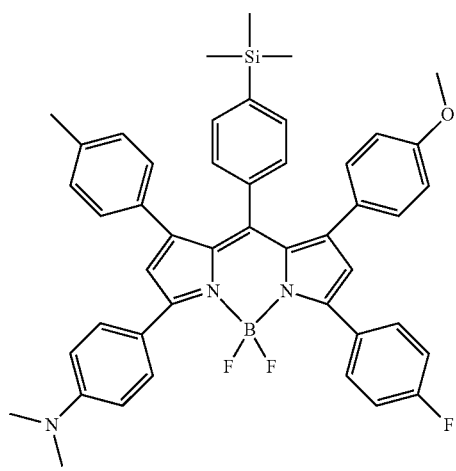
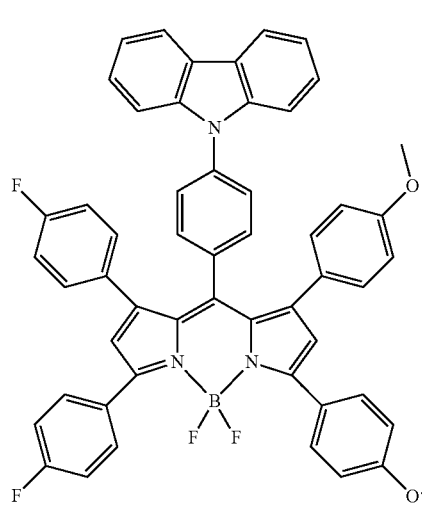
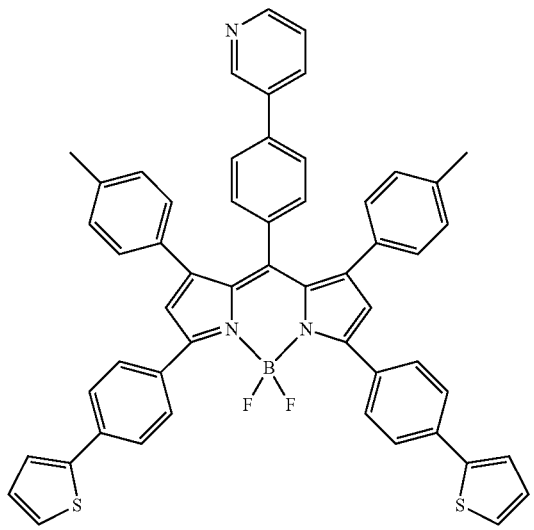

-continued
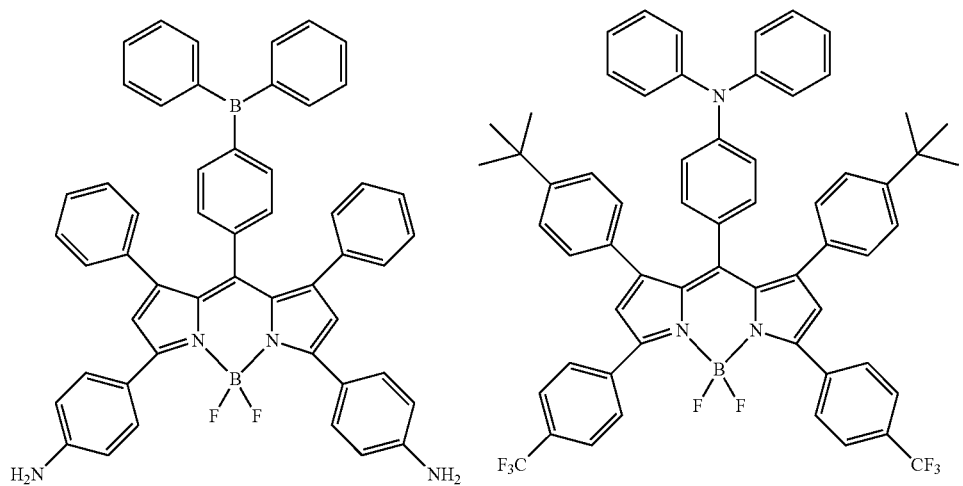
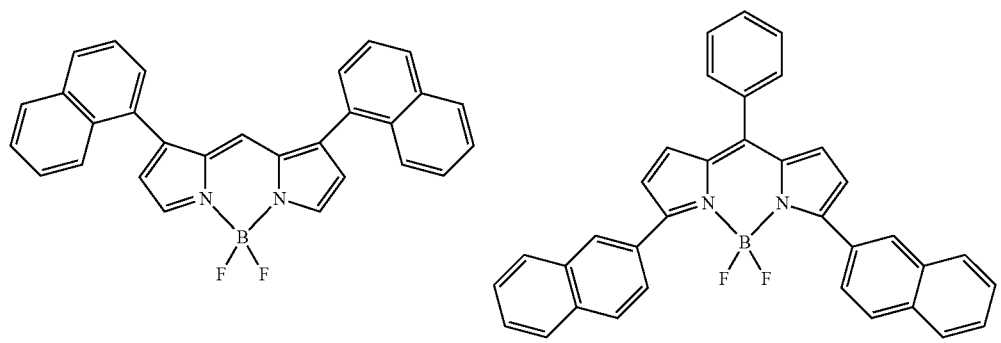
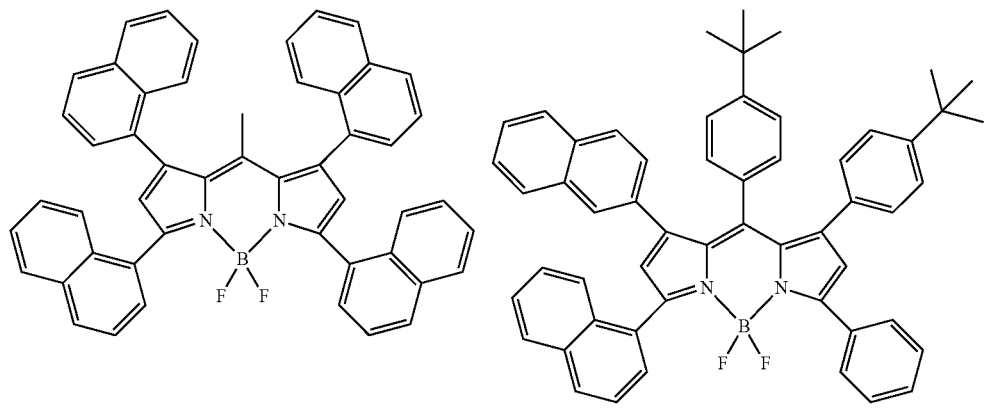
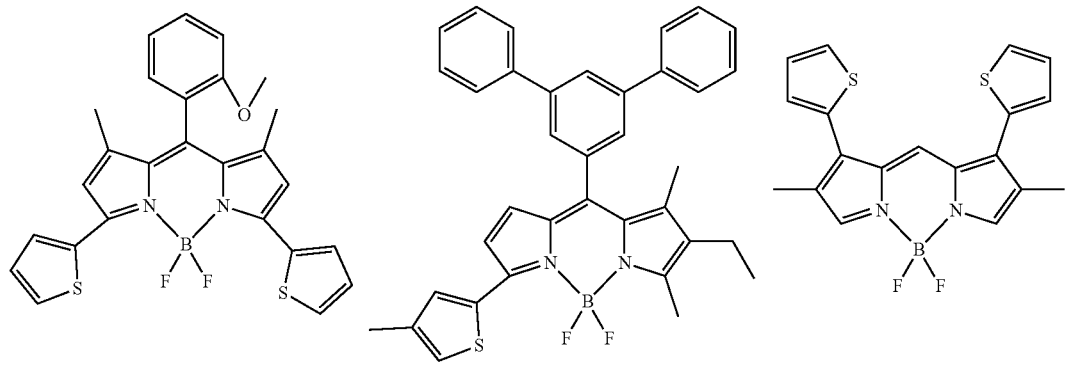

103 104
-continued
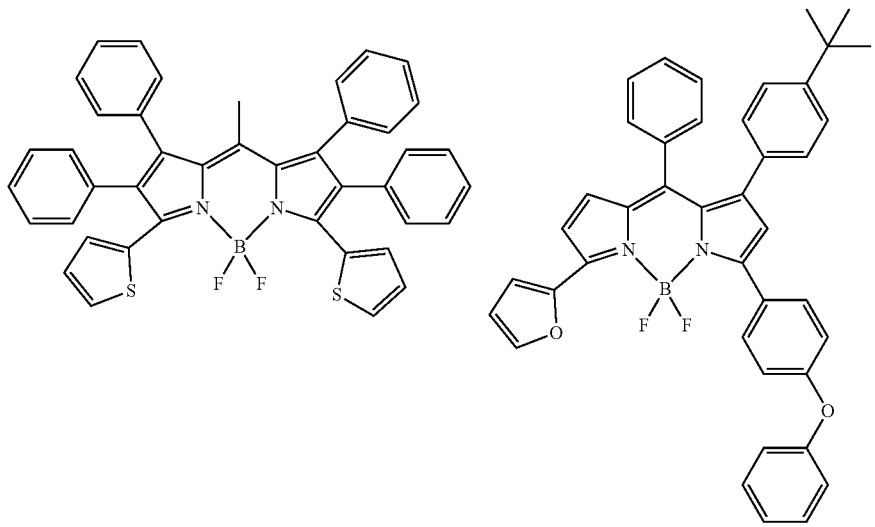
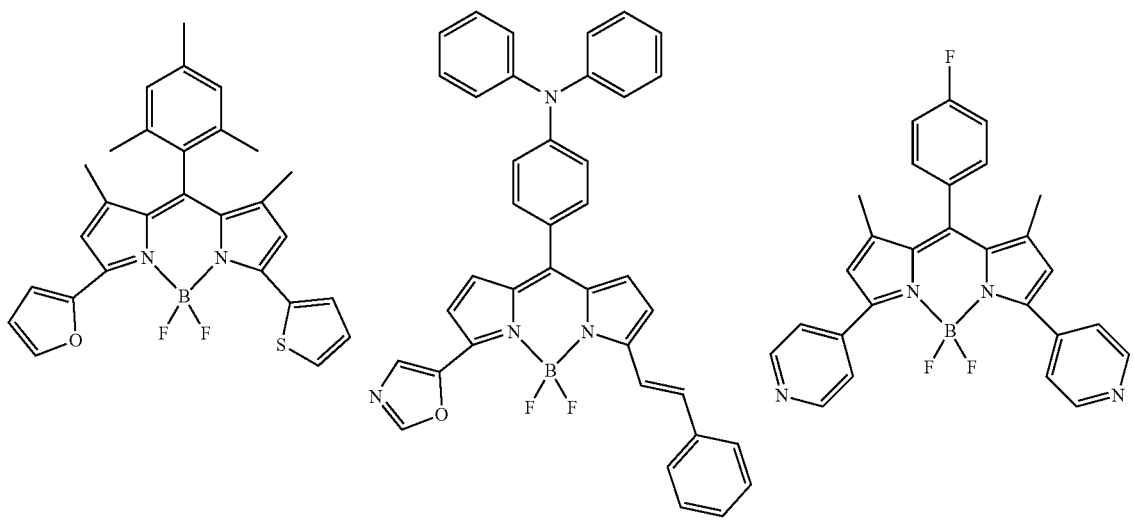
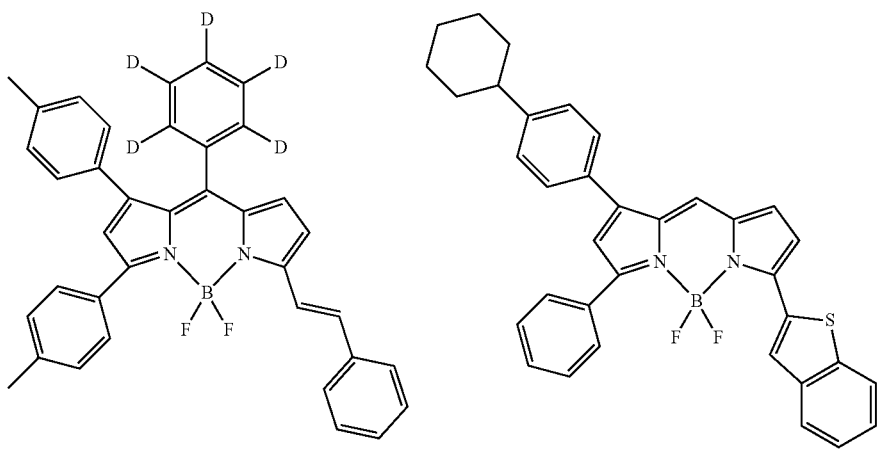

-continued
105
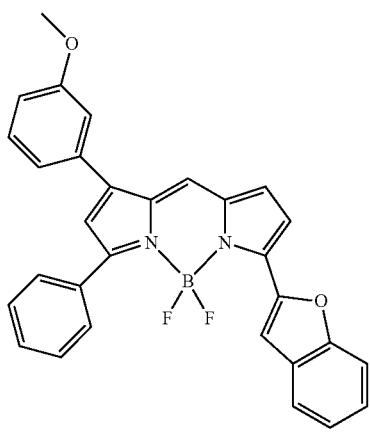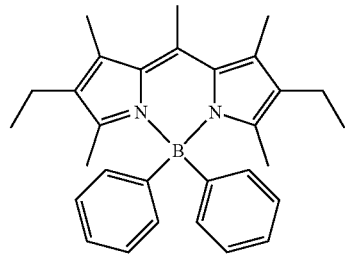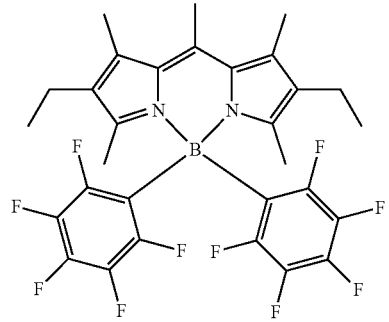
106
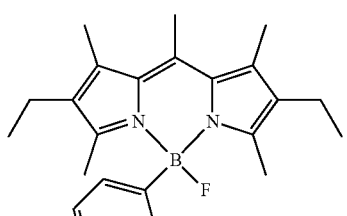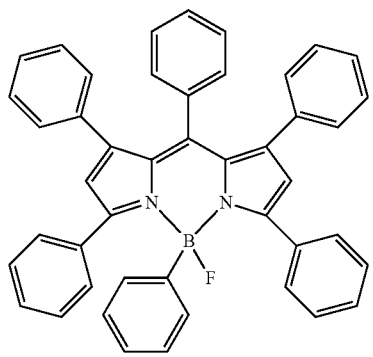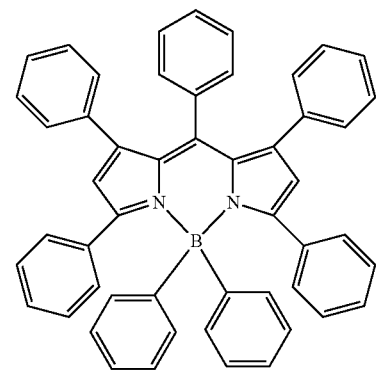
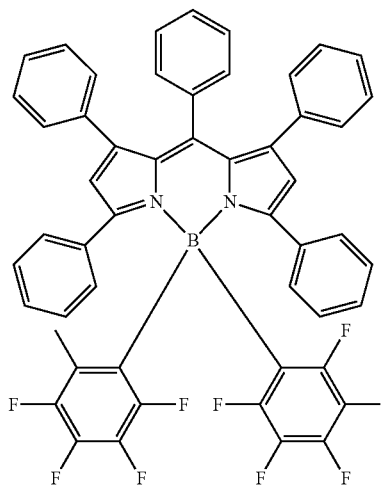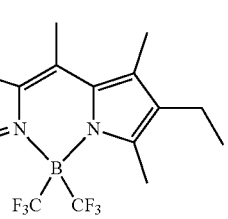
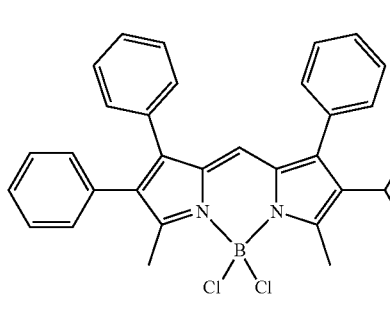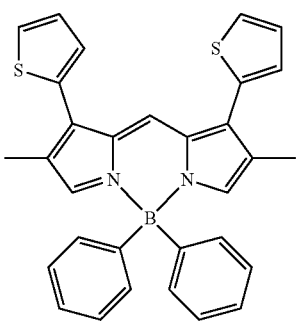

-continued
107 108
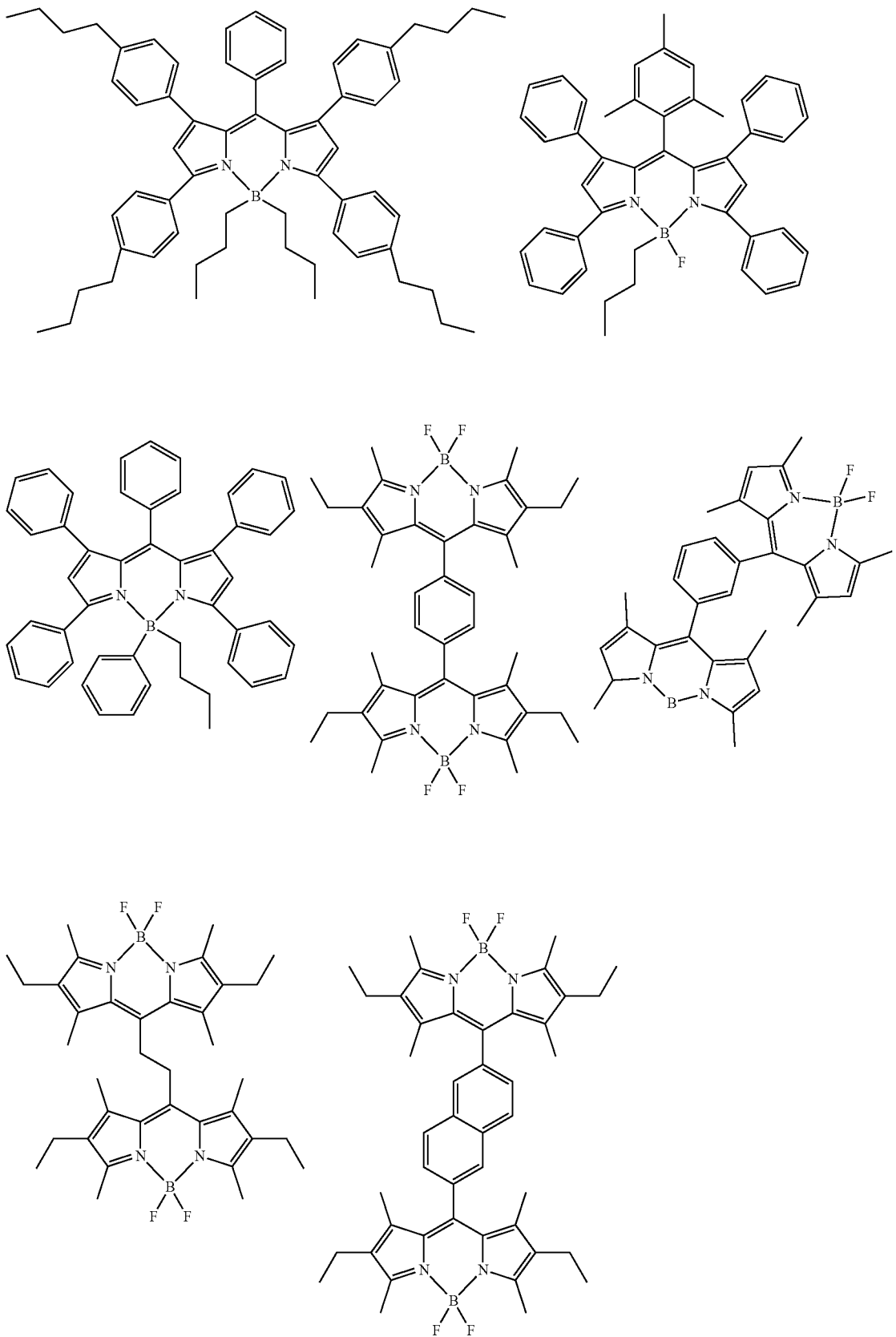

-continued
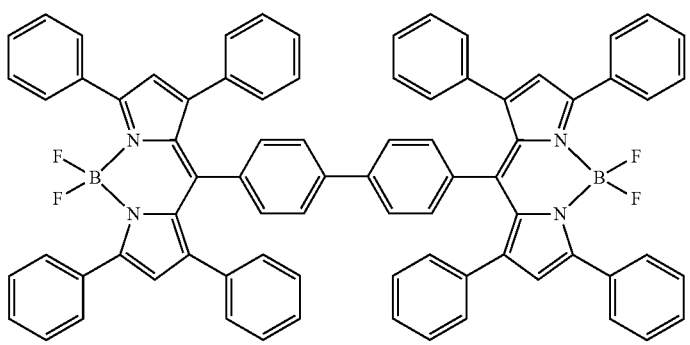
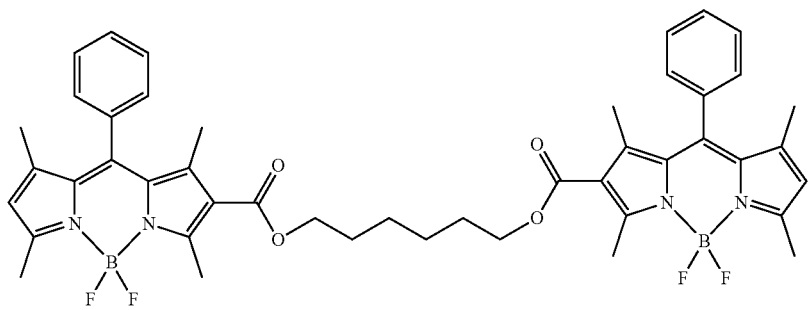
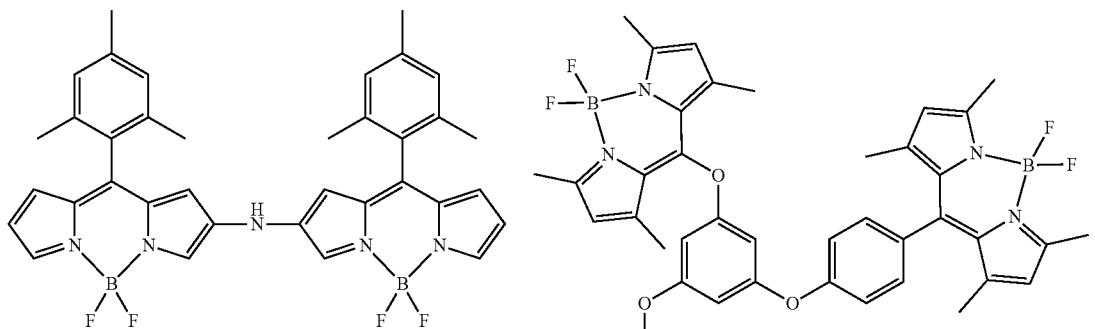
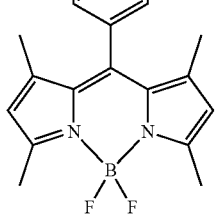
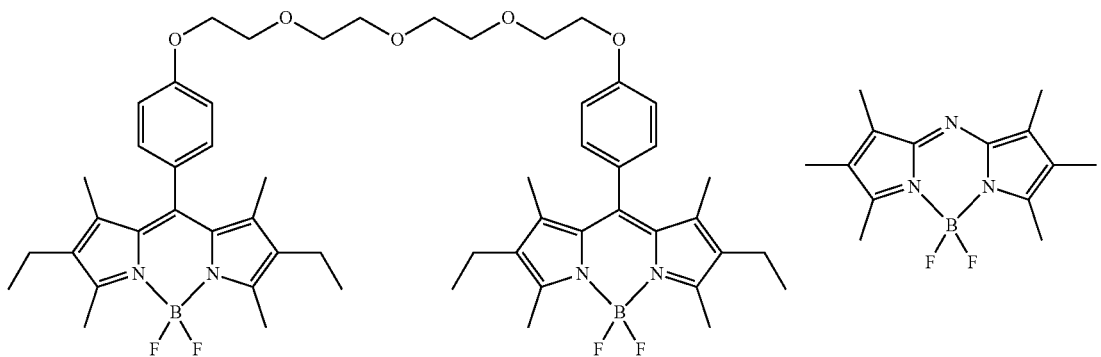

-continued
111
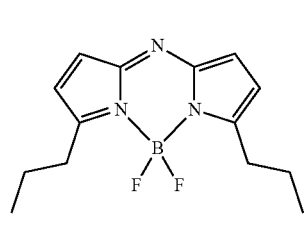 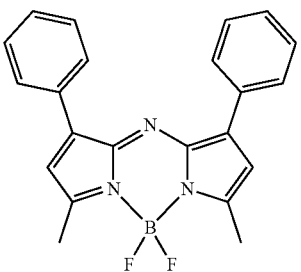
112
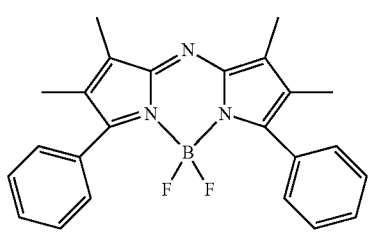
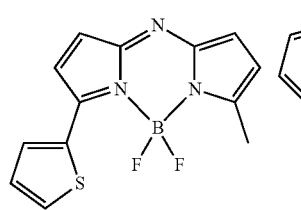 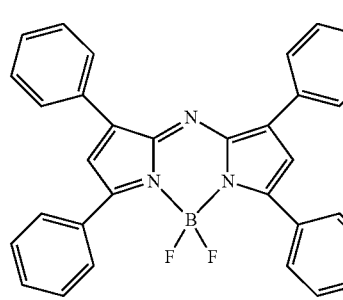 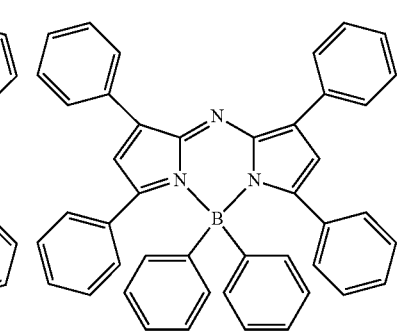
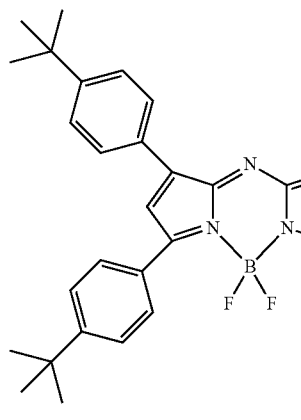 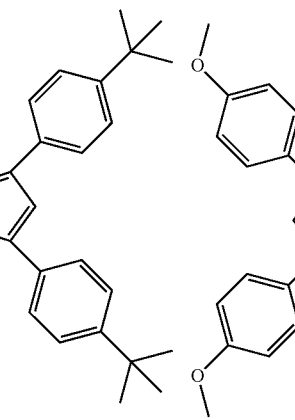 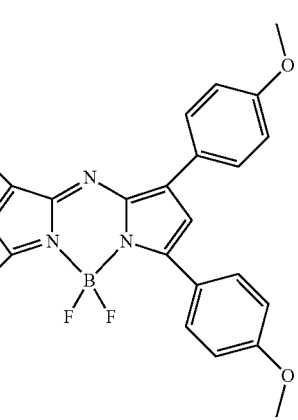
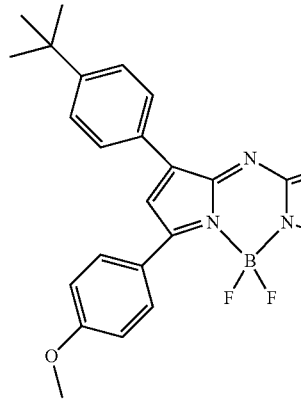 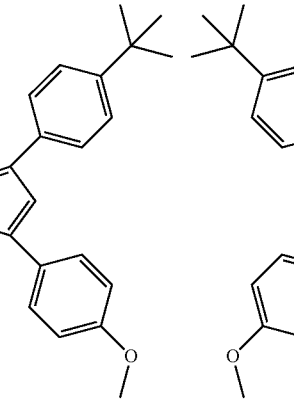 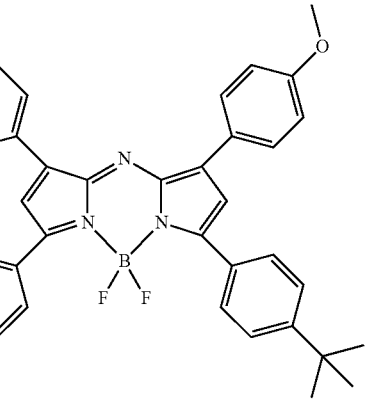

113 114
-continued
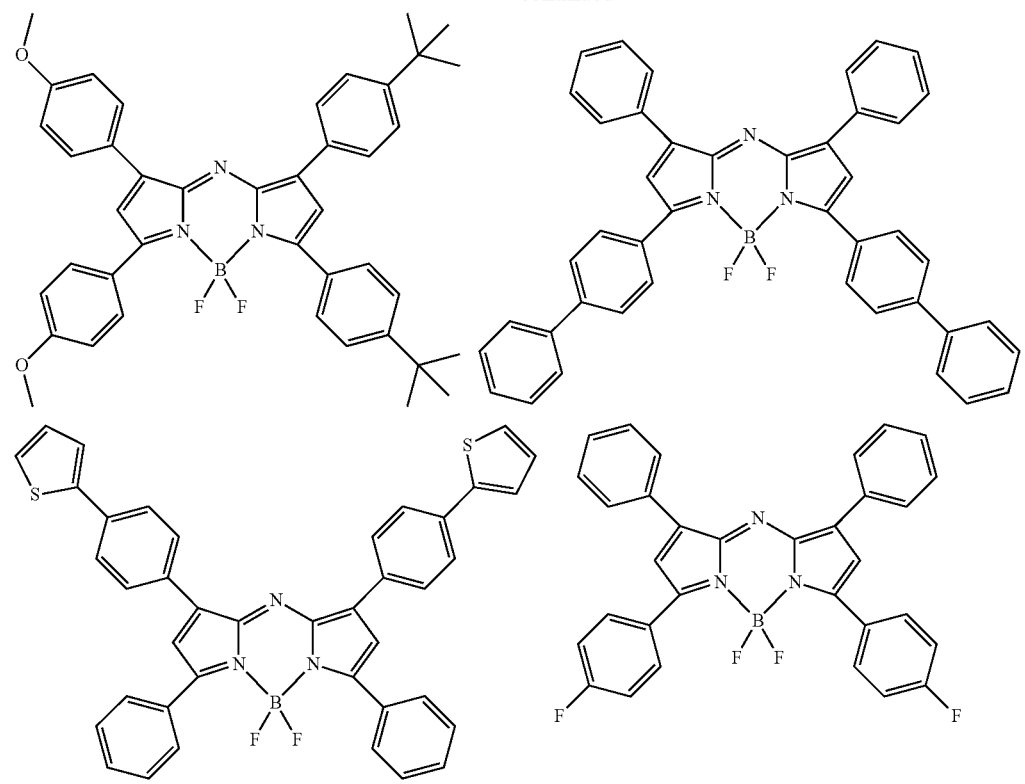
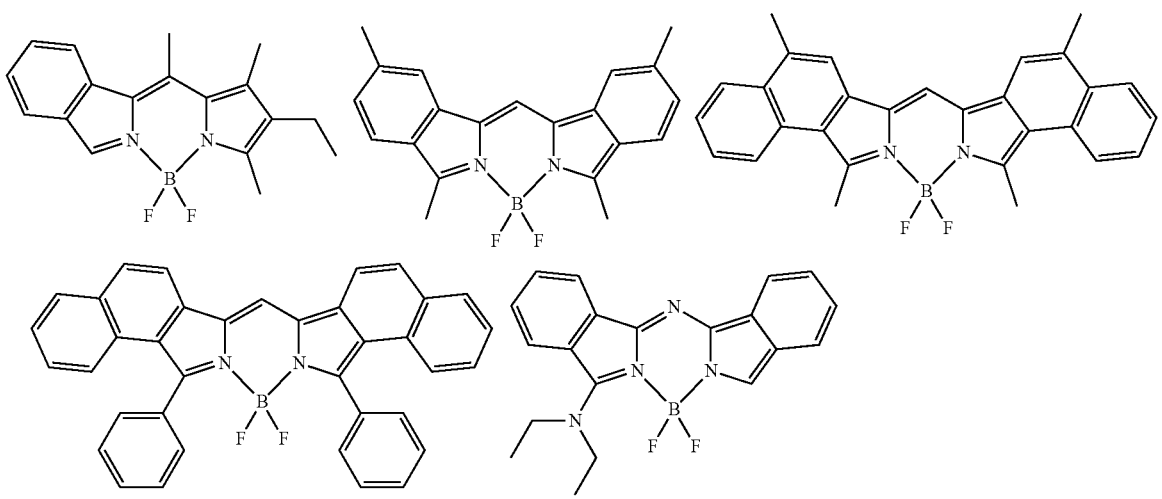
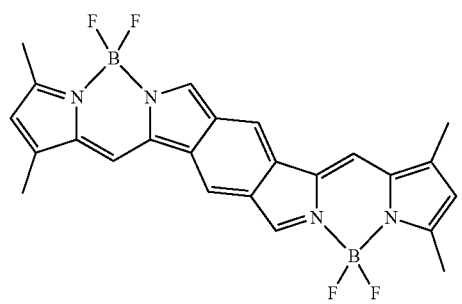

The compound represented by General Formula (1) can be manufactured by a method described in Japanese Translation of PCT Application No. H08-509471 and Japanese Laid-open Patent Publication No. 2000-208262, for example. In other words, a pyrromethene compound and a metal salt are reacted with each other in the presence of a base to obtain a target pyrromethene-based metal complex.

For the synthesis of a pyrromethene-boron fluoride complex, methods described in J. Org. Chem., vol. 64, No. 21, pp. 7813-7819 (1999), Angew. Chem., Int. Ed. Engl., vol. 36, pp. 1333-1335 (1997), and the like are referred to, whereby the compound represented by General Formula (1) can be manufactured.

Examples of the methods include a method that heats a compound represented by the following General Formula (3) and a compound represented by the following General Formula (4) in 1,2-dichloroethane in the presence of phosphoryl chloride and reacts them with a compound represented by the following General Formula (5) in 1,2-dichloroethane in the presence of triethylamine, thereby obtaining the compound represented by General Formula (1). However, the present invention is not limited to this method. $R^1$ to $R^9$ are similar to those described above. J represents halogen.

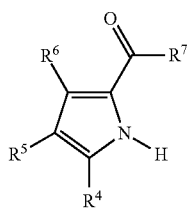

(3)

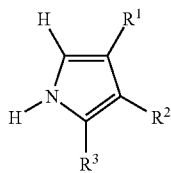

(4)

(5)

Furthermore, in introducing an aryl group or a heteroaryl group, there is a method that forms a carbon-carbon bond using a coupling reaction between a halogenated derivative and boronic acid or an esterified boronic acid derivative; the present invention is not limited to this method. Similarly, in introducing an amino group or a carbazolyl group, there is a method that forms a cartoon-nitrogen bond using a coupling reaction between a halogenated derivative and an amine or a carbazole derivate in the presence of a metallic catalyst such as palladium, for example; the present invention is not limited to this method.

Layer (A) can contain other compounds as appropriate as needed apart from the compound represented by General Formula (1). To further increase energy transfer efficiency to the compound represented by General Formula (1) from the excitation light, assist dopants such as rubrene may be contained, for example. When any light emission color other than the light emission color of the compound represented by General Formula (1) is desired to be added, desired organic light-emitting materials can be added, for example, compounds such as coumarin-based dyes, perylene-based dyes, phthalocyanine-based dyes, stilben-based dyes, cyanine-based dyes, polyphenylene-based dyes, rhodamine-based dyes, pyridine-based dyes, pyrromethene-based dyes, porphyrin dyes, oxazine-based dyes, and pyrazine-based dyes. Apart from these organic light-emitting materials, known light-emitting materials such as inorganic fluorescent bodies, fluorescent pigments, fluorescent dyes, and quantum dots can be added in combination.

The following shows examples of the organic light-emitting material other than the compound represented by General Formula (1); the present invention is not limited particularly to these examples.

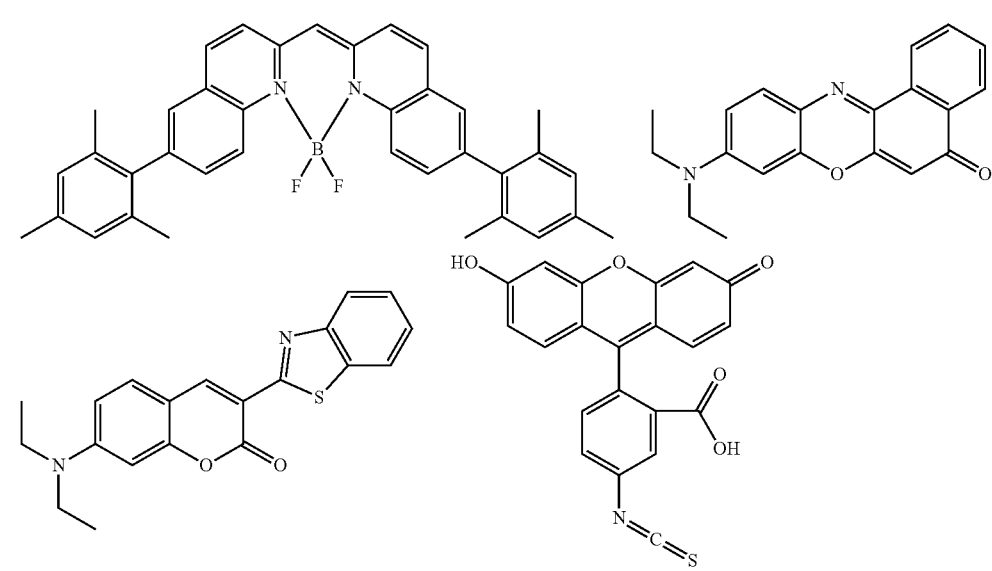

117 118
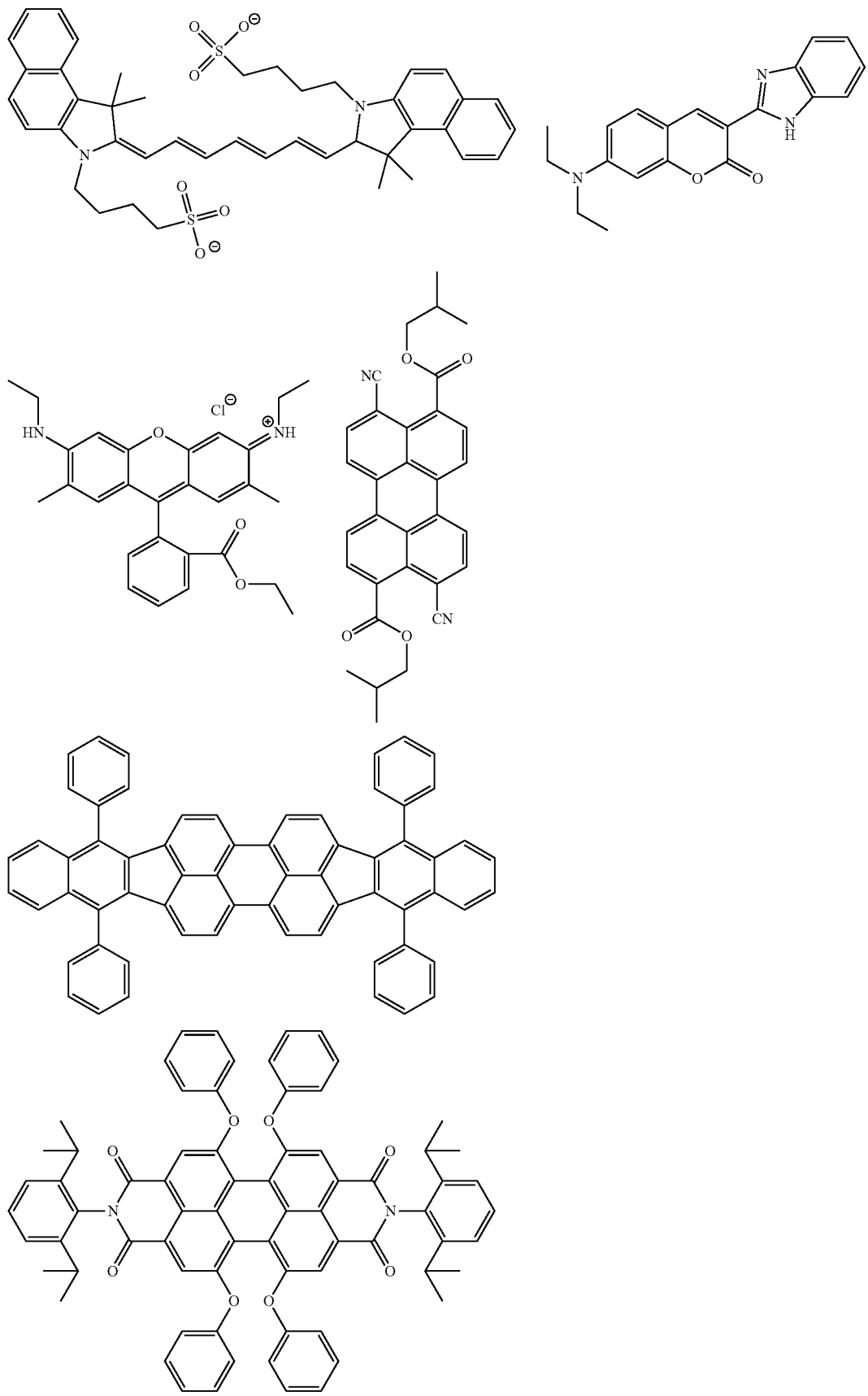

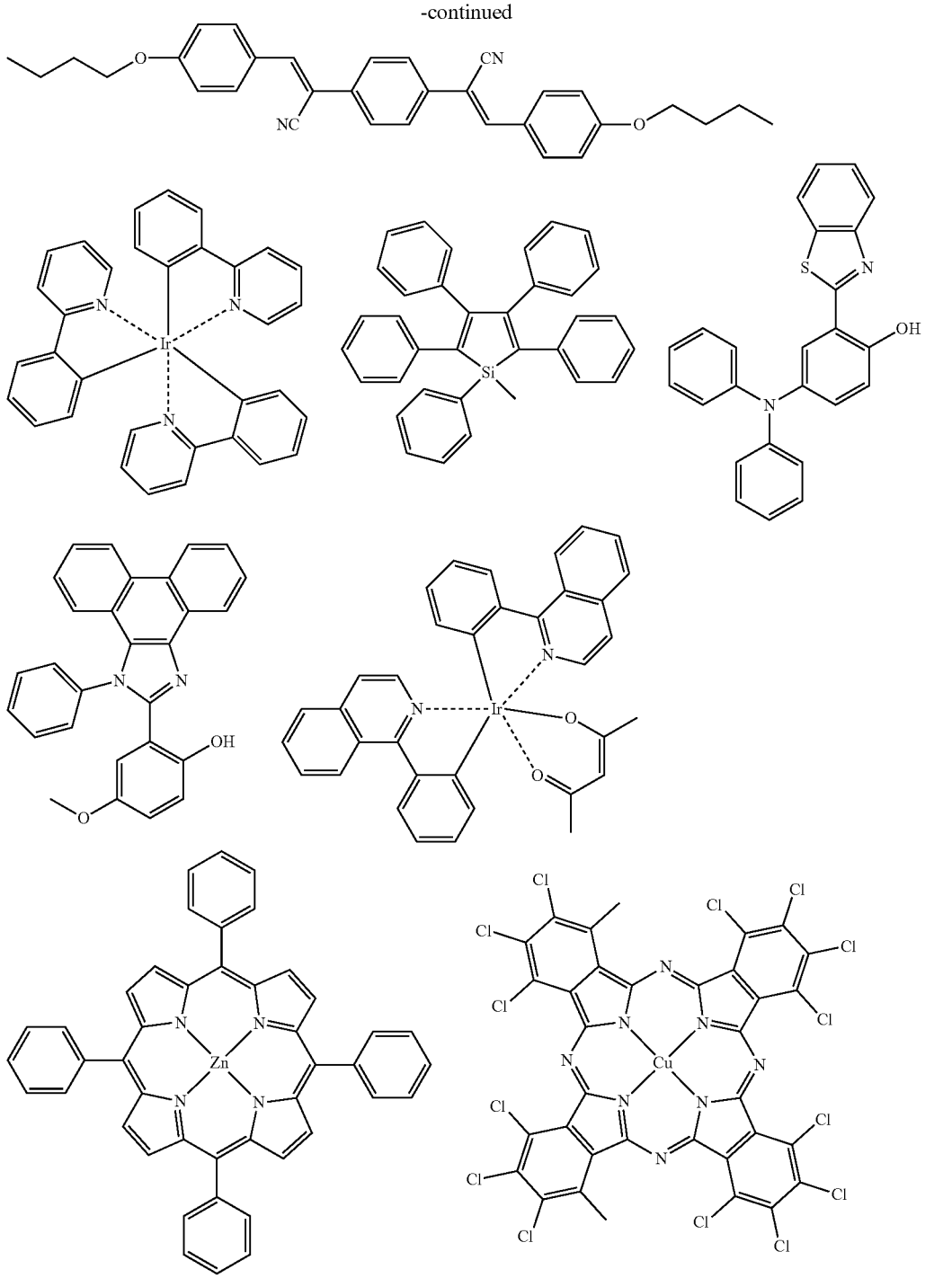

Layer (A) preferably contains a light-emitting material (hereinafter, referred to as Light-Emitting Material (a)) that exhibits light emission with a peak wavelength observed in a region of 500 nm or more and 580 nm or less by using excitation light in a wavelength range of 430 nm or more and 500 nm or less. In the following, the light emission with a peak wavelength in the region of 500 nm or more and 580 nm or less is referred to as "green light emission." In general, excitation light with higher energy is likely to cause the decomposition of materials; the excitation light in the wavelength range of 430 nm or more and 500 nm or less has relatively low excitation energy and thus does not cause the decomposition of Light-Emitting Material (a) in Layer (A) to obtain the green light emission with favorable color purity.

Layer (A) preferably contains Light-Emitting Material (a) that exhibits light emission with a peak wavelength of 500 nm or more and 580 nm or less by using the excitation light in the wavelength range of 430 nm or more and 500 nm or less and a light-emitting material, (hereinafter, referred to as Light-Emitting Material (b)) that exhibits light emission with a peak wavelength observed in a region of 580 nm or more and 750 nm or less by being excited by either one or both of the excitation light in the wavelength range of 430 nm or more and 500 nm or less and light emission from Light-Emitting Material (a). In the following, the light emission with a peak wavelength observed in the region of 580 nm or more and 750 nm or less is referred to as "red light emission."

Part of the excitation light in the wavelength range of 430 nm or more and 500 nm or less partially passes through the color conversion film according to the embodiment of the present invention, and when a blue LED with a sharp emission peak is used, sharp emission spectra are exhibited in the respective colors of blue, green, and red, and white light with favorable color purity can be obtained. Consequently, in displays in particular, a larger color gamut with more vivid colors can be efficiently made. In lighting use, light emission characteristics in the green region and the red region in particular are improved compared with a white LED in which a blue LED and a yellow fluorescent body are combined with each other, which is currently in the mainstream, thus improving color rendering and achieving a favorable white light source.

Preferred examples of Light-Emitting Material (a) include coumarin derivatives such as coumarin 6, coumarin 7, and coumarin 153; cyanine derivatives such as indocyanine green; fluorescein derivatives such as fluorescein, fluorescein isothiocyanate, and carboxyfluorescein diacetate; phthalocyanine derivatives such as phthalocyanine green, perylene derivatives such as diisobutyl-4,10-dicyanoperylene-3,9-dicarboxylate; pyrromethene derivatives; stilben derivatives; oxazine derivatives; naphthalimide derivatives; pyrazine derivatives; benzimidazole derivatives; benzoxazole derivatives; benzothiazole derivatives; imidazopyridine derivatives; azole derivatives; compounds having a condensed aryl ring such as anthracene and derivatives thereof; aromatic amine derivatives; and organic metal complex compounds. However, Light-Emitting Material (a) is not limited particularly to these examples.

Among these compounds, pyrromethene derivatives give high fluorescence quantum yield, are favorable in durability, and are thus particularly preferred compounds; among them, the compound represented by General Formula (1) exhibits light emission with high color purity and is thus preferred.

Preferred examples of Light-Emitting Material (b) include cyanine derivatives such as 4-dicyanomehylene-2-methyl-6-(p-dimethylaminostyryl)-4H-pyran; rhodamine derivatives such as rhodamine B, rhodamine 6G, rhodamine 101, and sulforhodamine 101; pyridine derivatives such as 1-ethyl-2-(4-(p-dimethylaminophenyl)-1,3-butadienyl)-pyridinium-perchlorate; perylene derivatives such as N,N'-bis(2,6-diisopropylphenyl)-1,6,7,12-tetraphenoxyperylene-3,4:9,10-bis(dicarboimide); porphyrin derivatives; pyrromethene derivatives; oxazine derivatives; pyrazine derivatives; compounds having a condensed aryl ring such as naphthacene and dibenzodiindenoperylene and derivatives thereof; and organic metal complex compounds. However, Light-Emitting Material (b) is not limited particularly to these examples.

Among these compounds, pyrromethene derivatives give high fluorescence quantum yield, are favorable in durability, and are thus particularly preferred compounds; among them, the compound represented by General Formula (1) exhibits light emission with high color purity and is thus preferred.

To reduce an overlap of the emission spectra to improve color reproducibility, the full width at half maximum of the emission spectra of the respective colors of blue, green, and red are preferably small. In particular, being small in the full width at half maximum of the emission spectra of green light and red light is effective in improving color reproducibility. The full width at half maximum of the light emission of the organic light-emitting material of Layer (A) is preferably 120 nm or less, more preferably 100 nm or less, further preferably 80 nm or less, and particularly preferably 60 nm or less. In particular, the full width at half maximum of Light-Emitting Material (a) is further preferably 40 nm or less and particularly preferably 30 nm or less.

The shape of the emission spectra of the light-emitting material of the respective colors, which is not limited to a particular shape, is preferably a single peak, because excitation energy can be efficiently used, and color purity is high. The single peak refers to absence of a peak having intensity 5% or more of the intensity of a peak with the highest intensity in an emission spectrum.

The content of the organic light-emitting material of Layer (A), which depends on the molar extinction coefficient, the fluorescence quantum yield, and the absorption intensity at an excitation wavelength of the compound and the thickness and the transmittance of a film, is usually $1.0 \times 10^{-4}$ part by weight to 30 parts by weight, further preferably $1.0 \times 10^{-3}$ part by weight to 10 parts by weight, and particularly preferably $1.0 \times 10^{-2}$ part by weight to 5 parts by weight relative to 100 parts by weight of the binder resin.

When Layer (A) contains both Light-Emitting Material (a) that exhibits the green light emission and Light-Emitting Material (b) that exhibits the red light emission, part of the green light emission is converted into the red light emission, and a content $w_a$ of Light-Emitting Material (a) and a content $w_b$ of Light-Emitting Material (b) preferably have a relation of $w_a \geq w_b$; the content ratio of the materials is $w_a:w_b=1,000:1$ to 1:1, further preferably 500:1 to 2:1, and particularly preferably 200:1 to 3:1, where $w_a$ and $w_b$ are weight percentages relative to the weight of the binder resin Component (B).

(A-2, Binder Resin)

The binder resin of Layer (A) of the present invention is mixed with the organic light-emitting material and the like to form a continuous phase and may be a material that is excellent in shaping processability, transparency, heat resistance, and the like. Examples of the binder resin include known ones such as photocurable resist materials having a reactive vinyl group such as acrylic acid-based, methacrylic acid-based, vinyl polycinnamate-based, or cyclized rubber-based one, epoxy resins, silicone resins (including organopolysiloxane cured objects (cross-linked objects) such as silicone rubbers and silicone gels), urea resins, fluorine resins, polycarbonate resins, acrylic resins, urethane resins, melamine resins, polyvinyl resins, polyamide resins, phenol resins, polyvinyl alcohol resins, polyvinyl butyral resins, cellulose resins, aliphatic ester resins, aromatic ester resins, aliphatic polyolefin resins, and aromatic polyolefin resins. The binder resin may be a copolymerized resin of these resins. These resins are designed as appropriate, whereby the binder resin useful for the color conversion film according to the embodiment of the present invention is obtained.

Among these resins, in view of transparency, heat resistance, and the like, epoxy resins, silicone resins, acrylic resins, polyester resins, or mixtures thereof are suitably used. Because of the easiness of the process of sheeting, thermosetting resins and photocurable resins are also suitably used. In view of heat resistance, silicone resins are particularly preferred. Among the silicone resins, addition reaction curable silicone compositions are preferred as the binder resin. The addition reaction curable silicone compositions cure at room temperature or by being heated at 50° C. to 200° C. and are excellent in transparency, heat resistance, and adhesiveness.

The addition reaction curable silicone compositions are formed by a hydrosilylation reaction between a compound containing an alkenyl group bonding to a silicon atom and a compound having a hydrogen atom bonding to a silicon atom as an example. Examples the material include ones formed by the hydrosilylation reaction between the compound containing an alkenyl group bonding to a silicon atom such as vinyltrimethoxysilane, vinyltriethoxysilane, allyltrimethoxysilane, propenyltrimethoxysilane, norbornenyltrimethoxysilane, or octenyltrimethoxysilane and the compound having a hydrogen atom bonding to a silicon atom such as methylhydrogenpolysiloxane, dimethylpolysiloxane-CO-methylhydrogenpolysiloxane, ethylhydrogenpolysiloxane, methylhydrogenpolysiloxane-CO-methylphenylpolysiloxane. In addition, known ones such as those described in Japanese Patent Application Laid-open No. 2010-159411, for example, can be used.

Silicone sealants for general LED use, which are commercially available, can also be used. Specific examples thereof include OE-6630A/B and OE-6336A/B manufactured by Dow Corning Toray Co., Ltd. and SCR-1012A/B and SCR-1016A/B manufactured by Shin-Etsu Chemical Co., Ltd.

In a composition for preparing Layer (A) according to the embodiment of the present invention, a hydrosilylation reaction retarder such as acetylene alcohol is preferably blended as another component in order to inhibit curing at room temperature to lengthen pot life. The composition for preparing Layer (A) may be blended with fine particles such as fumed silica, glass powder, and quartz powder, inorganic fillers or pigments such as titanium oxide, zirconium oxide, barium titanate, and zinc oxide, fire retardants, heat-resistant agents, antioxidants, dispersants, solvents, adhesiveness imparting agents such as silane coupling agents and titanium coupling agents, or the like as needed to the extent that the effect of the present invention is not impaired.

In particular, in view of the surface flatness of the color conversion layer, a low molecular weight polydimethylsiloxane component, silicone oil, or the like is preferably added to the composition for preparing Layer (A). Such a component is preferably added in an amount of 100 to 2,000 ppm and is further preferably added in an amount of 500 to 1,000 ppm relative to the entire composition.

(A-3, Other Components)

Layer (A) may contain antioxidants, processing-and-thermal stabilizers, lightfast stabilizers such as ultraviolet absorbers, dispersants and leveling agents for stabilizing coatings, plasticizers, cross-linking agents such as epoxy compounds, curing agents such as amines, acid anhydrides, and imidazoles, adhesive assistants such as silane coupling agents as a modifier for sheet surface, and inorganic particles such as silica particles and silicone fine particles and silane coupling agents as a color conversion material settling inhibitor, apart from the organic light-emitting material and the binder resin.

In order not to hinder the light from the light source and the light emission of the light-emitting material, these additives are preferably small in an extinction coefficient in the visible range. Specifically, a molar extinction coefficient $\varepsilon$ is preferably 1,000 or less, more preferably 500 or less, further preferably 200 or less, and particularly preferably 100 or less in the entire wavelength range of 400 nm or more and 800 nm or less.

Examples of the antioxidants include, but are not limited to, phenol-based antioxidants such as 2,6-di-tert-butyl-p-cresol and 2,6-di-tert-butyl-4-ethylphenol. These antioxidants may be contained singly or in combination.

Examples of the processing-and-thermal stabilizers include, but are not limited to, phosphorous-based stabilizers such as tributyl phosphite, tricyclohexyl phosphite, triethyl phosphine, and diphenylbutyl phosphine. These stabilizers may be contained singly or in combination.

Examples of the lightfast stabilizers include, but are not limited to, benzotriazoles such as 2-(5-methyl-2-hydroxyphenyl)benzotriazole and 2-[2-hydroxy-3,5-bis($\alpha$, $\alpha$-dimethylbenzyl)phenyl]-2H-benzotriazole. These lightfast stabilizers may be contained singly or in combination.

For the lightfast stabilizers, compounds having a role as a singlet oxygen quencher can also be suitably used. The singlet oxygen quencher is a material that traps singlet oxygen produced from oxygen molecules activated through optical energy and deactivates the singlet oxygen. The singlet oxygen quencher coexisting in the composition can prevent the light-emitting material from degrading by the singlet oxygen.

It is known that the singlet oxygen is produced by the occurrence of electron and energy exchange between a triplet excited state of dye such as rose bengal or methylene blue and an oxygen molecule in the ground state. In Layer (A), the contained organic light-emitting material is excited by the excitation light and emits light with a wavelength different from that of the excitation light to perform light color conversion. This excitation-emission cycle is repeated, and interaction between produced excited species and oxygen contained in the composition increases the probability of the singlet oxygen being produced. Consequently, the probability of collision of the organic light-emitting material and the singlet oxygen also increases, and the degradation of the organic light-emitting material is likely to proceed. Organic light-emitting materials are susceptible to the influence of the singlet oxygen compared with inorganic light-emitting materials. The compound represented by General Formula (1) in particular is higher in reactivity with the singlet oxygen than compounds having a condensed aryl ring such as perylene or derivatives thereof and thus receives a large influence on durability by the singlet oxygen. Given these circumstances, the produced singlet oxygen is quickly deactivated by the singlet oxygen quencher, whereby the durability of the compound represented by General Formula (1) excellent in quantum, yield and color purity can be improved.

Examples of the compounds having a role as a singlet oxygen quencher include, but are not limited to, specific tertiary amines, catechol derivatives, and nickel compounds. These lightfast stabilizers may be contained singly or in combination.

The tertiary amines refer to compounds having a structure in which all the N—H bonds of ammonia are replaced with N—C bonds. The substituent on the nitrogen atom is selected from an alkyl group, a cycloalkyl group, a heterocyclic group, an alkenyl group, a cycloalkenyl group, an alkynyl group, an aryl group, a heteroaryl group, an aldehyde group, a carbonyl group, a carboxy group, an oxycarbonyl group, a carbamoyl group, and a condensed ring and an aliphatic ring formed between adjacent substituents. These substituents may be further substituted by the substituents described above.

The substituent on the nitrogen atom of the tertiary amines is preferably a substituted or unsubstituted alkyl group, a substituted or unsubstituted cycloalkyl group, a substituted or unsubstituted aryl group, or a substituted or unsubstituted heteroaryl group in view of photostability and more preferably a substituted or unsubstituted alkyl group, a substituted or unsubstituted cycloalkyl group, or a substituted or unsubstituted aryl group.

The aryl group in this case is preferably a phenyl group or a naphthyl group and more preferably a phenyl group because it does not hinder the light from the light source and the light emission of the light-emitting material. An increased number of aryl groups on the nitrogen atom causes concern about an increase in light absorption in the visible range, and among the three substituents on the nitrogen atom, the number of the aryl groups is preferably two or less and more preferably one or less. When at least one of the three substituents on the nitrogen atom is a substituted or unsubstituted alkyl group, the singlet oxygen can be trapped more efficiently, which is preferred. In particular, two or more of the three substituents are preferably substituted or unsubstituted alkyl groups.

Preferred examples of the tertiary amine include, but are not limited to, triethylamine, 1,4-diazabicyclo[2.2.2]octane, tri-n-butylamine, N,N-diethylaniline, 2,2,6,6-tetramethylpiperidine, bis(1,2,2,6,6-pentamethyl-4-piperidyl) sebacate, and 1,2,2,6,6-pentamethyl-4-piperidyl methacrylate.

The catechol derivatives refer to compounds having two or more hydroxy groups on a benzene ring including isomers such as resorcinol and hydroquinone. These compounds can trap the singlet oxygen more efficiently than phenol derivatives, in which one hydroxy group is on the benzene ring.

The substituent on the benzene ring is selected from hydrogen, an alkyl group, a cycloalkyl group, a heterocyclic group, an alkenyl group, a cycloalkenyl group, an alkynyl group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, a phosphine oxide group, and a condensed ring and an aliphatic ring formed between adjacent substituents other than a hydroxy group. These substituents may be further substituted by the substituents described above.

Among them, preferred are a substituted or unsubstituted alkyl group, a substituted or unsubstituted cycloalkyl group, a substituted or unsubstituted aryl group, a substituted or unsubstituted heteroaryl group, or halogen in view of photostability, and more preferred are a substituted or unsubstituted alkyl group, a substituted or unsubstituted cycloalkyl group, a substituted or unsubstituted aryl group, or halogen. Furthermore, because of being less in discoloration after reaction with the singlet oxygen quencher, more preferred are a substituted or unsubstituted alkyl group, a substituted or unsubstituted cycloalkyl group, or halogen. Particularly preferred is a substituted or unsubstituted alkyl group.

As to the position of the hydroxy groups on the benzene ring, at least two hydroxy groups are preferably adjacent to each other. This is because the compound is more resistant to photooxidation than resorcinol (1,3-substituted) and hydroquinone (1,4-substituted). Also after being oxidized, light absorption in the visible range is small, and the discoloration of the composition can be prevented.

Preferred examples of the catechol derivatives include, but are not limited to, 4-tert-butylbenzene-1,2-diol and 3,5-di-tert-butylbenzene-1,2-diol.

The nickel compounds are compounds containing nickel; examples thereof include, but are not limited to, inorganic salts such as nickel chloride, complexes such as bis(acetylacetonate)nickel, and salts of organic acids such as nickel carbamate. The organic acids refer to organic compounds having a carboxy group, a sulfonyl group, a phenolic hydroxy group, or a thiol group. Among them, in view of uniformly being dispersed in the composition, preferred are complexes and salts of organic acids.

Examples of nickel complexes and nickel salts of organic acids suitably used as the singlet oxygen quencher include, but are not limited to, acetylacetonate-based nickel complexes, bisdithio-α-diketone-based nickel complexes, dithiolate-based nickel complexes, aminothiolate-based nickel complexes, thiocatechol-based nickel complexes, salicylaldehydeoxime-based nickel complexes, thiobisphenolate-based nickel complexes, indoaniline-based nickel compounds, carboxylic acid-based nickel salts, sulfonic acid-based nickel salts, phenol-based nickel salts, carbamic acid-based nickel salts, and dithiocarbamic acid-based nickel salts.

Among them, at least one of nickel salts of organic acids, acetylacetonate-based nickel complexes, and thiobisphenolate-based nickel complexes are preferred. In view of the easiness of synthesis and being low in price, nickel salts of organic acids are preferred. Furthermore, because of being small in molar extinction coefficient in the visible range and not absorbing the light emission of the light source and the light-emitting material, sulfonic acid-based nickel salts are preferred. Furthermore, in view of exhibiting a better singlet oxygen quenching effect, nickel salts of aryl sulfonic acids are more preferred; in view of solubility to a wide range of solvents, nickel salts of alkyl sulfonic acids are preferred. The aryl group of the aryl sulfonic acids is preferably a substituted or unsubstituted phenyl group and more preferably a phenyl group substituted by an alkyl group in view of solubility and dispersibility to solvents.

In view of solubility to an organic solvent and small molar extinction coefficient in the visible range, acetylacetonate-based nickel complexes and thiobisphenolate-based nickel complexes are preferred. A ligand on nickel of these complexes may be substituted by a substituent such as an alkyl group, a cycloalkyl group, a heterocyclic group, an alkenyl group, a cycloalkenyl group, an alkynyl group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, or a phosphine oxide group; these substituents may be further substituted by the substituents described above.

Among them, preferred are a substituted or unsubstituted alkyl group, a substituted or unsubstituted cycloalkyl group, a substituted or unsubstituted aryl group, a substituted or unsubstituted heteroaryl group, or halogen in view of photostability, and more preferred are a substituted or unsubstituted alkyl group, a substituted or unsubstituted cycloalkyl group, a substituted or unsubstituted aryl group, or halogen. Further, because of being less in discoloration after reaction with the singlet oxygen quencher, more preferred are a substituted or unsubstituted alkyl group, a substituted or unsubstituted cycloalkyl group, and halogen. Particularly preferred is a substituted or unsubstituted alkyl group.

Examples of nickel compounds the molar extinction coefficient ε of which is 100 or less in the entire wavelength range of 400 nm or more and 800 nm or less include, but are not limited to, a nickel salt of p-toluylsulfonic acid, acetylacetone nickel (II) complex, hexafluoro acetylacetone nickel (II) complex, 2,2-thiobisphenolate-n-butylamine nickel (II) complex, and [2,2'-thiobis(4-tert-octylphenolate)]-2-erthylhexylamine nickel (II) complex; compounds the molar extinction coefficient ε of which is 100 or less in the entire wavelength range of 400 nm or more and 800 nm or less among the nickel compounds described above are suitably used. These compounds may be contained singly or in combination.

The content of these additives in layer (A), which depends on the molar extinction coefficient, the fluorescence quantum yield, and the absorption intensity at an excitation wavelength of the compound and the thickness and the transmittance of a sheet to be prepared, is usually $1.0 \times 10^{-3}$ part by weight or more and 30 parts by weight or less, more preferably $1.0 \times 10^{-2}$ part by weight or more and 15 parts by weight or less, further preferably $1.0 \times 10^{-2}$ part by weight or more and 10 parts by weight or less, and particularly preferably $1.0 \times 10^{-1}$ part by weight or more and 10 parts by weight or less relative to 100 parts by weight of the binder resin.

<Layer (B)>

Layer (B) contained in the color conversion film according to the embodiment of the present invention is a transparent resin layer having oxygen barrier property. The oxygen barrier property refers to a characteristic with low oxygen permeability. In the present invention, the oxygen permeability of Layer (B) is 1.0 cc/m²·day·atm or less, preferably 0.7 cc/m²·day·atm or less, and further preferably 0.5 cc/m²·day·atm or less.

The oxygen permeability is a value measured, using a flat test piece with a uniform film thickness, based on the electrolytic sensor method described in JIS K7126-2 (2006) using an oxygen permeation rate measuring apparatus (model name: "OXTRAN" (registered trademark) 2/20) manufactured by MOCON Inc. (the USA) at a temperature of 20° C. and a humidity of 0% RH, unless otherwise described.

In the present invention, after intensive studies, the inventors of the present invention have found out that the degradation of the organic light-emitting material in the color conversion film is caused by oxidation degradation by oxygen under light irradiation. Based on this finding, an oxygen barrier layer is formed between Layer (A) and the outside, whereby the oxidation degradation of the organic light-emitting material can be inhibited, and the durability of the color conversion film can be greatly improved.

Further, after intensive studies, it has also been found out that water vapor has less influence on the degradation of the organic light-emitting material in the color conversion film unlike many inorganic light-emitting materials. For this reason, the color conversion film of the present invention does not necessarily require an inorganic compound layer excellent in water vapor barrier property and preferably includes an oxygen barrier transparent resin layer excellent in view of oxygen barrier property, flexibility, and cost.

Layer (B) may be provided at any position of the color conversion film so long as it can achieve the inhibition of oxygen permeation to Layer (A). In view of more surely inhibiting oxygen permeation to Layer (A), Layer (B) is preferably provided on at least one face of Layer (A); as illustrated in FIGS. 2 and 3, for example, Layer (A) and Layer (B) are further preferably laminated in order of Layer (B)/Layer (A)/Layer (B). Layer (A) and Layer (B) may be in direct contact with each other or have another layer therebetween; in view of the inhibition of oxygen permeation. Layer (A) and Layer (B) are preferably in direct contact with each other or laminated with only an adhesive layer described below interposed therein.

Layer (B) is transparent in order not to hinder the emission characteristics of the color conversion film. Being transparent means that light absorption and scattering in the visible range are small and specifically means that total light transmittance is 80% or more. The total light transmittance is more preferably 85% or more and particularly preferably 90% or more.

Haze is preferably 7% or less, more preferably 5% or less, further preferably 2% or less, and particularly preferably 1% or less. The total light transmittance and the haze are values measured, using a flat test piece with a uniform film thickness, by NDH 2000, a haze meter manufactured by Nippon Denshoku Industries Co., Ltd., in accordance with JIS K7361 (1997) at a temperature of 23° C. and a humidity of 50% RH.

Examples of the transparent resin preferably contained in Layer (B) include resins such as poly vinyl chloride, nylon, polyvinyl fluoride, polyvinylidene chloride, polyacrylonitrile, polyvinyl alcohol, and an ethylene-vinyl alcohol copolymer and mixtures of these resins. Among them, polyvinylidene chloride, polyacrylonitrile, an ethylene-vinyl alcohol copolymer, and polyvinyl alcohol are extremely small in oxygen permeability coefficient, and Layer (B) preferably contains these resins. In view of resistance to discoloration, Layer (B) further preferably contains polyvinylidene chloride, polyvinyl alcohol, or an ethylene-vinyl alcohol copolymer; in view of being low in environmental loads, particularly preferably contained is polyvinyl alcohol or an ethylene-vinyl alcohol copolymer. These resins may be contained singly or mixed with different resins; in view of the uniformity of the film and cost, a film formed of a single resin is more preferred.

Because of high oxygen barrier property, a polyol-based resin can be suitably contained in Layer (B). The polyol-based resin is a resin having many hydroxy groups in its molecular chains; the weight ratio of the hydroxy groups in the resin is preferably 15% or more. The weight ratio occupied by hydroxy groups in the resin is a value calculated by "the molecular weight of a hydroxy group (=17)×an average number of hydroxy groups in one molecular chain of the resin/the number average molecular weight of the resin."

The average number of hydroxy groups in one molecular chain of the resin can be determined from the hydroxy equivalent, the hydroxy value, or the like of the resin. The number average molecular weight of the resin is a value determined by a known method in accordance with JIS K7252 (2016).

The polyol-based resin partially forms hydrogen bonds between the molecular chains via hydroxy groups to reduce the free volume of the resin, thereby exhibiting high gas barrier property. In the present invention, the polyol-based resin exhibits higher gas barrier property when the ratio of the hydroxy group is higher; the weight ratio of the hydroxy group within the resin is preferably 20% or more, more preferably 25% or more, further preferably 30% or more, and particularly preferably 35% or more. If the ratio of the hydroxy group is excessively high, the polyol-based resin has extremely high hygroscopicity, and desired gas barrier property (oxygen barrier property) cannot be maintained. For this reason, the weight ratio of the hydroxy group within the resin is preferably 60% or less and further preferably 50% or less.

Among the polyol-based resins, preferred are saponified products of vinyl acetate such as polyvinyl alcohol, an ethylene-vinyl alcohol copolymer, and mixtures containing these resins because of being particularly excellent in oxygen barrier property. The weight ratios of the hydroxy group when the degree of saponification is 100 mol % of these resins are listed in Table 2.

TABLE 2

| Resin | Ratio of —OH group |
| --- | --- |
| Polyvinyl alcohol | About 39% |
| Ethylene-vinyl alcohol copolymer (ethylene content: 30%) | About 30% |
| Ethylene-vinyl alcohol copolymer (ethylene content: 50%) | About 24% |
| Ethylene-vinyl alcohol copolymer (ethylene content: 70%) | About 16% |

For the polyol-based resin, a single resin or a mixture of two or more resins may be used; in view of the uniformity of the resin layer and cost, a single resin is more preferably used.

For polyvinyl alcohol, a saponified product of polyvinyl acetate in which 98 mol % or more of the acetyl group is saponified can be used, for example. For the ethylene-vinyl alcohol copolymer, a saponified product of an ethylene-vinyl alcohol copolymer with an ethylene content of 20 to 70% in which 98 mol % or more of the acetyl group is saponified can be used, for example.

For polyvinyl alcohol and the ethylene-vinyl alcohol copolymer, commercially available resins and films can also be used. Specific examples thereof include polyvinyl alcohol resin PVA117 manufactured by Kuraray Co., Ltd. and ethylene-vinyl alcohol copolymer ("EVAL" (registered trademark)) resins L171B and F171B and film EF-XL manufactured by Kuraray Co., Ltd.

In the present invention, Layer (B) is also preferably a cured object layer of the polyol-based resin and a resin composition containing a silicon compound represented by General Formula (6) and a hydrolysate thereof.

(6)

In General Formula (6), $R^{12}$s are optionally the same as or different from each other, and are selected from the group consisting of hydrogen, an alkyl group, a cycloalkyl group, an alkenyl group, a cycloalkenyl group, and a silyl group. $L^1$s are optionally the same as or different from each other, and are selected from a single bond, an alkylene group, and a phenylene group. Ys are optionally the same as or different from each other, and are selected from the group consisting of hydrogen, an alkyl group, a cycloalkyl group, a heterocyclic group, an alkenyl group, a cycloalkenyl group, an alkynyl group, a hydroxy group, a thiol group, a glycidyl group, an alkoxy group, an alkylthio group, a glycidyl ether group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a boryl group, and a phosphine oxide group. The symbol n is an integer of 0 or more and 4 or less.

The silicon compound represented by General Formula (6) may be a single component or a mixture of two or more ones. In view of causing the silicon compound represented by General Formula (6) to be efficiently hydrolyzed, $R^{12}$ is preferably an alkyl group or a cycloalkyl group. In view of raw material costs, $R^{12}$ is more preferably an alkyl group, preferably an alkyl group with a carbon number of six or less among them, and more preferably a methyl group, an ethyl group, a propyl group, or a butyl group. Particularly preferred is a methyl group or an ethyl group. In view of solubility, $L^1$ is preferably a single bond or an alkylene group. When $L^1$ is an alkylene group, its carbon number is preferably six or less, because the strength of a cross-linked structure described below is high. The symbol n is preferably 2 or less, and —$OR^{12}$ is preferably two or more, because the strength of the cross-linked structure described below is high. The symbol n is more preferably 1 or less. The following shows examples of the silicon compound represented by General Formula (6); this silicon compound is not limited to these examples.

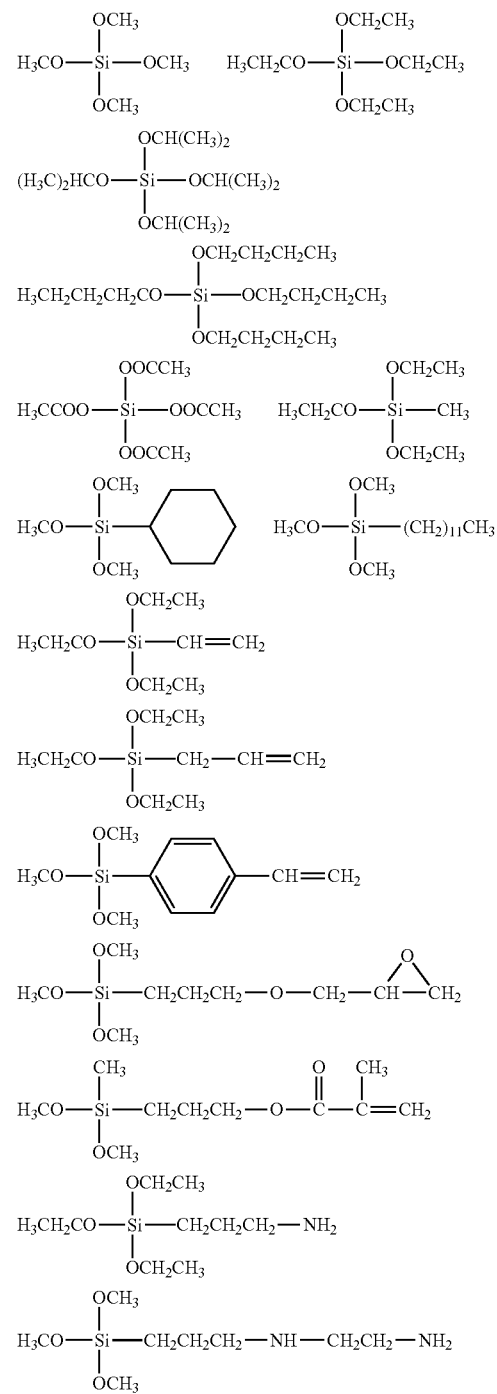

-continued

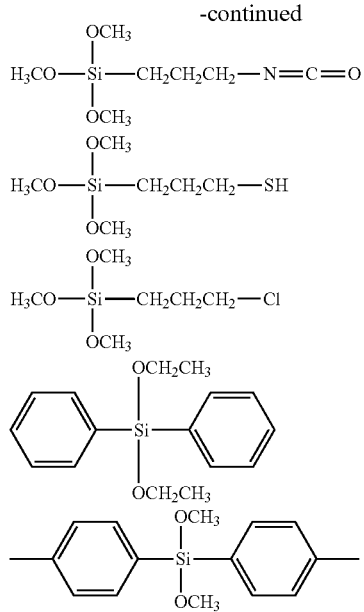

The polyol-based resin contains many hydroxy groups in its molecular chains and is likely to swell in a high temperature and high humidity condition. When swelling, the free volume of the polyol-based resin increases, and the oxygen barrier property of the polyol-based resin decreases. The silicon compound represented by General Formula (6) and the hydrolysate thereof couple with the hydroxy group of the polyol-based resin by dehydration condensation to form the cross-linked structure and exhibit an effect of inhibiting the swelling of the polyol-based resin. Consequently, Layer (B) can maintain high oxygen barrier property even in a high temperature and high humidity condition. This cross-linked structure is considered to be a structure that cross-links a plurality of hydroxy groups within the molecules of the polyol-based resin or a structure that cross-links the molecules of the polyol-based resin, which are considered to be mixed.

When the contents of the silicon compound represented by General Formula (6) and the hydrolysate thereof in a resin composition for forming Layer (B) are higher, cross-linking density is higher, thus producing a larger effect of inhibiting the swelling of the polyol-based resin. However, if the contents are excessively high, the strength and flexibility of Layer (B) after being cured decrease. Consequently, a silicon atom content in Layer (B) is preferably 1 wt % or more and 20 w % or less, more preferably 3 wt % or more and 15 w % or less, and further preferably 5 wt % or more and 12 w % or less.

To further inhibit the swelling of the polyol-based resin in a high temperature and high humidity condition, an inorganic compound layer excellent in water vapor barrier property may be formed on the surface of Layer (B). Examples of the inorganic compound layer include metal oxide thin films and metal nitride thin films of inorganic oxides such as silicon oxide, aluminum oxide, titanium oxide, tantalum oxide, zinc oxide, tin oxide, indium oxide, yttrium oxide, and magnesium oxide, inorganic nitrides such as silicon nitride, aluminum nitride, titanium nitride, and silicon carbide nitride, mixtures thereof, and with other elements added thereto. Among them, preferred are silicon oxide and aluminum oxide in view of cost, and aluminum oxide can be particularly suitably used.

To Layer (B), antioxidants, curing agents, cross-linking agents, processing-and-thermal stabilizers, lightfast stabilizers such as ultraviolet absorbers, or the like may be added as needed to the extent that they do not have an excessive influence on the light emission and durability of Layer (A).

The thickness of Layer (B), which is not limited to a particular thickness, is preferably 100 μm or less in view of the flexibility of the entire color conversion film and cost. The thickness of Layer (B) is more preferably 50 μm or less, further preferably 20 μm or less, particularly preferably 10 μm or less, and may be 1 μm or less. In view of the easiness of layer formation, the thickness of Layer (B) is preferably 0.01 μm or more.

In the present invention, the resin with high oxygen barrier property is used for Layer (B), whereby Layer (B) can exhibit sufficient oxygen barrier property even with a thickness of 100 μm or less and can inhibit the degradation of the organic light-emitting material. In particular, when polyvinyl alcohol or the ethylene-vinyl alcohol copolymer is used for Layer (B), Layer (B) can exhibit excellent oxygen barrier property even with a thickness of 20 μm or less. Layer (B) is thin, whereby the thickness of the entire color conversion film and can also be reduced, thus achieving a highly flexible and low-cost color conversion film. In addition, this color conversion film is thin and excellent in flexibility and can be used in complex shapes other than a plane such as a curved face, and when incorporated into a light source unit described below, it enables design with a high degree of freedom.

<Other Layers>

The color conversion film according to the embodiment of the present invention may have the following layers, for example, apart from Layer (A) and Layer (B).

(Base Layer)

For the base layer (the base layer 10 illustrated in FIGS. 1 to 3, for example), known metals, films, glasses, ceramics, paper sheets, and the like can be used without any particular limitation. Specifically, examples of the base layer include metal plates and foils of aluminum (including aluminum alloys), zinc, copper, iron, and the like; films of plastics such as cellulose acetate, polyethylene terephthalate, polyethylene, polyester, polyamide, polyimide, polyphenylene sulfide, polystyrene, polypropylene, polycarbonate, polyvinyl acetal, aramids, silicones, polyolefins, thermoplastic fluororesins, a copolymer of tetrafluoroethylene and ethylene (ETFE); films of plastics of α-polyolefin resins, polycaprolactone resins, acrylic resins, silicone resins, and copolymerized resins of these resins and ethylene; paper sheets laminated with the plastics and paper sheets coated with the plastics; paper sheets laminated or deposited with the metals; and plastic films laminated or deposited with the metals. When the base layer is a metal plate, the surface thereof may be subjected to chromium-based or nickel-based plating treatment or ceramic treatment.

Among these materials, in view of the easiness of preparing the color conversion film and the easiness of shaping the color conversion film, glasses and resin films are preferably used. To exclude the possibility of breakage or the like when a film-shaped base layer is handled, films having high strength are preferred. In view of those required characteristics and economy, resin films are preferred; among them, in view of economy and handleability, preferred are plastic films selected from the group consisting of polyethylene terephthalate, polyphenylene sulfide, polycarbonate, and polypropylene. When the color conversion film is dried or when the color conversion film is shaped under pressure at a high temperature of 200° C. or more by an extruder, a polyimide film is preferred in view of heat resistance. In view of the easiness of peeling off the sheet, the surface of the base layer may be subjected to mold releasing treatment in advance. Similarly, to improve inter-layer adhesiveness, the surface of the base layer may be subjected to easily adhering treatment in advance.

To further inhibit the swelling of the polyol-based resin in a high temperature and high humidity condition, an inorganic compound layer excellent in water vapor barrier property may be formed on the surface of the base layer; this is because imparting water vapor barrier property to the base layer itself reduces the amount of water vapor reaching Layer (B). For the inorganic compound layer, the same ones as those described above can be suitably used.

The thickness of the base layer is not limited to a particular thickness; the lower limit thereof is preferably 10 µm or more and more preferably 25 µm or more. In view of heat resistance, the thickness of the base layer is further preferably 38 nm or more. The upper limit thereof is preferably 5,000 µm or less and more preferably 3,000 µm or less.

(Adhesive Layer)

In the color conversion film according to the embodiment of the present invention, an adhesive layer may be provided between the layers as needed. For the adhesive layer, known materials can be used without particular limitation so long as they do not have an excessive influence on the light emission and durability of the color conversion film. When strong adhesion is required, preferably used are photocurable materials, thermocurable materials, anaerobic curable materials, and thermoplastic materials; among them, thermocurable materials are more preferred, and in particular, a material that is curable at 0° C. to 150° C. is preferred.

The thickness of the adhesive layer, which is not limited a particular thickness, is preferably 0.01 to 100 µm, more preferably 0.01 to 25 µm, further preferably 0.05 to 5 µm, and particularly preferably 0.05 to 1 µm.

(Other Functional Layers)

The color conversion film according to the embodiment of the present invention may further provide an auxiliary layer having a light diffusion layer, anti-reflection function, an anti-glare function, an anti-reflection-and-anti-glare function, a hard coating function (an abrasion-resistant function), an antistatic function, a soil-resistant function, an electromagnetic shielding function, an infrared cutting function, an ultraviolet cutting function, a water vapor barrier function, a polarizing function, or a toning function in accordance with required functions.

Examples of the layer having the water vapor barrier function include metal oxide thin films and metal nitride thin films of inorganic oxides such as silicon oxide, aluminum oxide, titanium oxide, tantalum oxide, zinc oxide, tin oxide, indium oxide, yttrium oxide, and magnesium oxide, inorganic nitrides such as silicon nitride, aluminum nitride, titanium nitride, and silicon carbide nitride, mixtures thereof, and with other elements added thereto; and films formed of various kinds of resins such as polyethylene, polypropylene, nylon, polyvinylidene chloride, a copolymer of vinylidene chloride and vinyl chloride, a copolymer of vinylidene chloride and acrylonitrile, fluorine-based resins, and polyvinyl alcohol-based resins such as a saponified product of vinyl acetate.

<Method for Manufacturing Color Conversion Film>

The following describes an example of a method for manufacturing the color conversion film according to the embodiment of the present invention. In this method of manufacture, first, the composition for preparing Component (A) is manufactured as follows. Specifically, certain amounts of the organic light-emitting material, the binder resin, additives, and the like described above are mixed with each other. In this process, a solvent may be mixed therewith as needed.

The solvent is not limited to a particular solvent so long as it can adjust the viscosity of a resin in a fluid state and does not have an excessive influence on the emission and durability of a light-emitting substance. Examples of the solvent include water, 2-propanol, ethanol, toluene, methyl ethyl ketone, methyl isobutyl ketone, cyclohexanone, hexane, acetone, terpineol, texanol, methyl cellosolve, butyl carbitol, butyl carbitol acetate, and propylene glycol monomethyl ether acetate. Two or more of these solvents may be contained in combination. Toluene among these solvents in particular is suitably contained in view of not having any influence on the degradation of the organic light-emitting material and giving a less residual amount after being dried.

The components are mixed with each other so as to give a certain composition and are then uniformly mixed and dispersed by a stirring-and-kneading machine such as a homogenizer, a rotary-and-revolutionary stirring machine, a triple roll mill, a ball mill, a planetary ball mill, or a beads mill to obtain the composition for preparing Layer (A). After being mixed and dispersed or during being mixed and dispersed, defoaming in a vacuum or under a reduced pressure is also preferably performed. In addition, a specific component may be mixed in advance, or treatment such as aging may be performed. A desired solid content can be obtained by removing the solvent by an evaporator.

Next, the composition for preparing Layer (A) is applied to a substrate such as the base layer or Layer (B) and is dried to prepare Layer (A). The application can be performed by a reverse roll coater, a blade coater, a slit die coater, a direct gravure coater, an offset gravure coater, a kiss coater, a natural roll coater, an air knife coater, a roll blade coater, a Vari-Bar roll blade coater, a two-stream coater, a rod coater, a wire bar coater, an applicator, a dip coater, a curtain coater, a spin coater, a knife coater, or the like. To obtain the uniformity of the film thickness of Layer (A), the application is preferably performed by a slit die coater.

The drying can be performed using a general heating apparatus such as a hot air drier or an infrared drier. For the heating of the color conversion film, a general heating apparatus such as a hot air drier or an infrared drier is used. In this case, heating condition include usually 1 minute to 5 hours at 40° C. to 250° C. and preferably 2 minutes to 4 hours at 60° C. to 200° C. Stepwise heating and curing such as step cure is also available.

After Layer (A) is prepared, the base layer can be changed as needed. In this case, examples of a simple method include, but are not limited to, a method that performs the change using a hot plate and a method that uses a vacuum laminator or a dry film laminator.

Examples of a method for forming Layer (B) on the base layer or Layer (A) include, but are not limited to, a method that applies the resin composition for preparing Layer (B) and dries and cures it and a method that laminates a film shaped by a process such as extruding or biaxial stretching.

The resin composition to be applied may be mixed with a solvent as needed. The solvent is not limited to a particular solvent so long as it can adjust the viscosity of a resin in a fluid state and does not have an excessive influence on the emission and durability of the color conversion film. Examples of the solvent include water, 2-propanol, ethanol, toluene, methyl ethyl ketone, methyl isobutyl ketone, cyclohexanone, hexane, acetone, terpineol, texanol, methyl cellosolve, butyl carbitol, butyl carbitol acetate, and propylene glycol monomethyl ether acetate. Two or more of these solvents can be contained in combination.

Examples of a method for laminating the layers of the color conversion film include, but are not limited to, a method that forms Layer (A) on Layer (B) by application and drying, a method that forms Layer (B) on Layer (A) by application and drying, a method that sticks a separately shaped self-supporting film for Layer (B) on Layer (A), a method that sticks a separately shaped self-supporting film for Layer (A) on Layer (B), and a method that sticks laminate units individually prepared to each other, such as sticking a "the base layer/Layer (B)/Layer (A)" unit and a "Layer (B)/the base layer" unit to each other. To increase the stability of the laminate film, after laminating the layers, preferred is further performing a thermosetting process, an aging process, or the like.

<Excitation Light>

As to the type of the excitation light, any excitation light can be used so long as it exhibits light emission in a wavelength range that can be absorbed by the organic light-emitting material. Examples thereof include hot-cathode tubes, cold-cathode tubes, fluorescent light sources such as inorganic EL, organic electroluminescence element light sources, LED light sources, incandescent light sources, and sunlight; any of the excitation light can be used in principle.

In particular, light from an LED light source is preferred excitation light. For display and lighting uses, further preferred excitation light is light from a blue LED light source having excitation light in the wavelength range of 430 to 500 nm in view of the capability of increasing the color purity of blue light and the inhibition of photodegradation of the organic light-emitting material. If the wavelength range of the excitation light is on the longer wavelength side thereof, the blue light is lacking, and white light cannot be formed; if the wavelength range of the excitation light is on the shorter wavelength side thereof, the light-emitting substance such as the compound represented by General Formula (1) or an organic compound such as the binder resin is likely to photodegrade, which are not preferred.

The excitation light may have one emission peak or have two or more emission peaks; to increase color, purity, preferred is one having one emission peak. A plurality of excitation light sources having different emission peaks can be combined with each other as appropriate.

<Light Source Unit>

The light source unit according to the embodiment of the present invention at least includes a light source and the color conversion film described above. The arrangement of the light source and the color conversion film is not limited to particular arrangement; the light source and the color conversion film may adhere closely to each other, or the remote phosphor method, in which the light source and the color conversion film are separate from each other, may be used. The light source unit may further include a color filter for the purpose of increasing color purity.

As described above, the excitation light in the wavelength range of 430 to 500 nm or less has relatively low excitation energy and can thus prevent the decomposition of the light-emitting substance such as the compound represented by General Formula (1). Consequently, the light source in the light source unit is preferably a light-emitting diode having its maximum emission in the wavelength range of 430 to 500 nm. The light source unit of the present invention can be used for displays, lighting, the interior design, signs, signboards, and the like, and is suitably used for displays and lighting in particular.

<Display and Lighting Apparatus>

The display according to the embodiment of the present invention includes the light source unit including the color conversion film described above. For a display such as a liquid crystal display, for example, the light source unit described above is used as a backlight unit. The lighting apparatus according to the embodiment of the present invention includes the light source unit including the color conversion film described above. This lighting apparatus is configured to emit white light by combining a blue LED light source as the light source unit and the color conversion film that converts blue light from this blue LED light source into light with a wavelength longer than the blue light with each other, for example.

EXAMPLES

The following describes the present invention with reference to examples; these examples do not limit the present invention. In the following examples. Compounds G-1 to G-5 and R-1 to R-4 are compounds shown below.

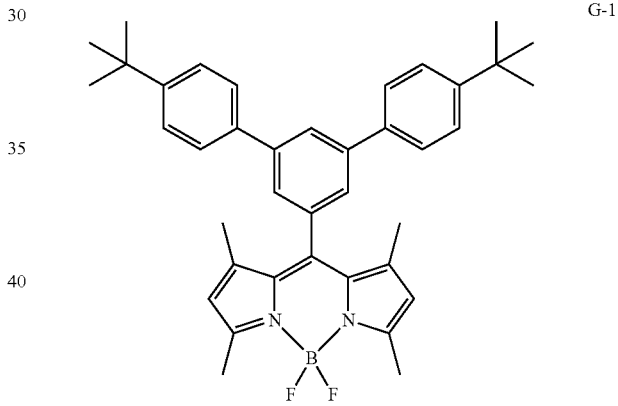

G-1

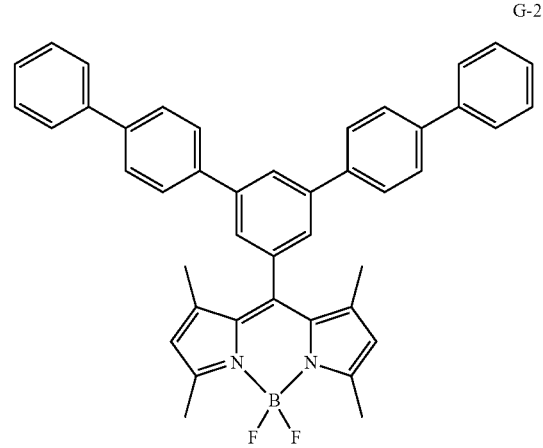

G-2

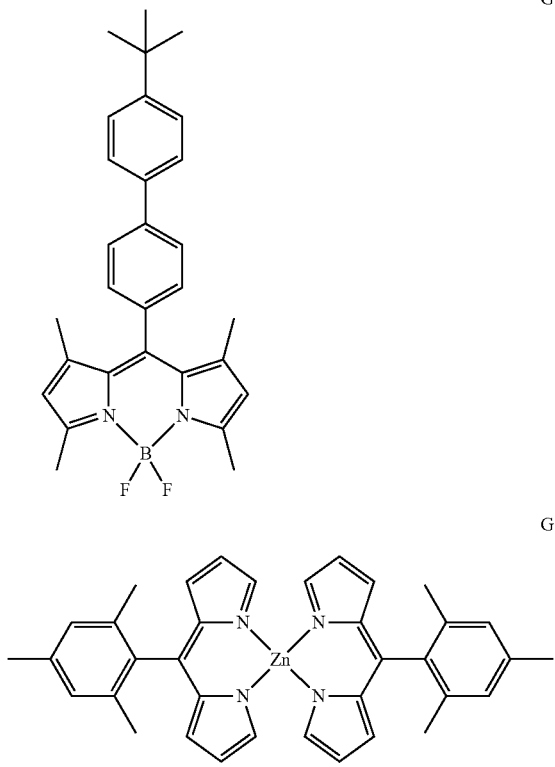

G-3

G-4

G-5

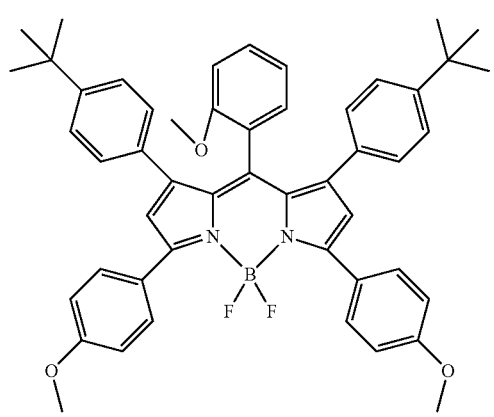

R-1

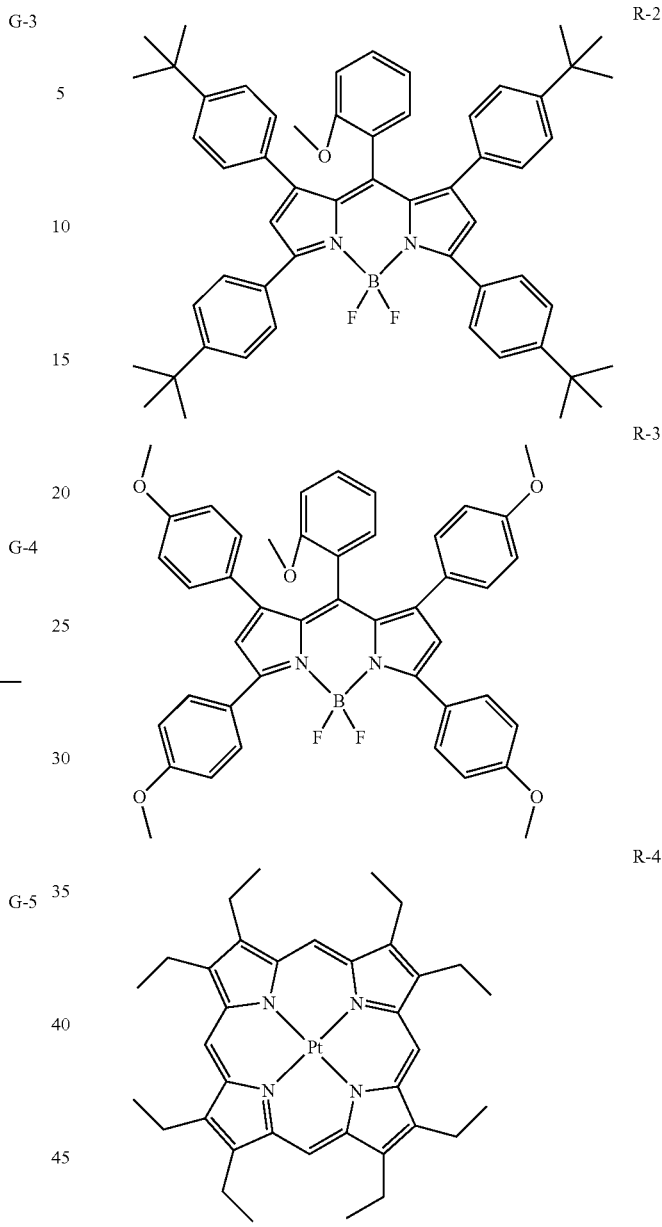

R-2

R-3

R-4

<Measurement of ¹H-NMR>
¹H-NMR on the compounds was measured with a deuteriochioroform solution using Superconducting FTNMR EX-270 (manufactured by JEOL Ltd.).

<Measurement of Absorption Spectrum>
Absorption spectra of the compounds were measured with the compounds dissolved in toluene at a concentration of $1\times10^{-6}$ mol/L using U-3200 type spectrophotometer (manufactured by Hitachi, Ltd.).

<Measurement of Fluorescence Spectrum>
For fluorescence spectra of the compounds, fluorescence spectra when the compounds were dissolved in toluene at a concentration of $1\times10^{-6}$ mol/L and were excited at a wavelength of 460 nm were measured using F-2500 type fluorescence spectrophotometer (manufactured by Hitachi, Ltd.).

<Measurement of Oxygen Permeability>
The oxygen permeability was measured, using a flat test piece with a uniform film thickness, based on the electrolytic sensor method described in JIS K7126-2 (2006) using an oxygen permeation rate measuring apparatus (model name: "OXTRAN" (registered trademark) 2/20) manufactured by MOCON Inc. (the USA) at a temperature of 20° C. and a humidity of 0% RH, unless otherwise described.

<Measurement of Water Vapor Permeability>

The water vapor permeability was measured, using a flat test piece with a uniform film thickness, based on Method B (the infrared sensor method) described in JIS K7129 (2008) using a water vapor permeability measuring apparatus (model name: "PERMATRAN" (registered trademark) W3/31) manufactured by MOCON inc. (the USA) at a temperature of 40° C. and a humidity of 90% RH.

<Measurement of Total Light Transmittance>

The total light transmittance was measured, using a flat test piece with a uniform film thickness, by NDH 2000, a haze meter manufactured by Nippon Denshoku Industries Co., Ltd., in accordance with JIS K7361 (1997) at a temperature of 23° C. and a humidity of 50% RH.

<Measurement of Color Conversion Characteristics>

A current of 10 mA was passed through a light-emitting apparatus having each of the color conversion films and a blue LED element (manufactured by ProLight; type PM2B-3LBE-SD emission peak wavelength: 460 nm) to light an LED chip, and an emission spectrum was measured using a spectral radiance meter (CS-1000 manufactured by Konica Minolta, Inc.). The distance between each of the color conversion films and the blue LED element was set to 3 cm.

<Evaluation of Lightfastness>

A current of 10 mA was passed through a light-emitting apparatus having each of the color conversion films and a blue LED element; (manufactured by ProLight; type PM2B-3LBE-SD emission peak wavelength: 460 nm) to light an LED chip, and initial luminance was measured using a spectral radiance meter (CS-1000 manufactured by Konica Minolta, Inc.). The distance between each of the color conversion films and the blue LED element was set to 3 cm. After that, each of the color conversion films was continuously irradiated with the light from the blue LED element at room temperature, and the time elapsed until the luminance decreased by a certain amount was observed to evaluate lightfastness.

Synthesis Example 1

The following describes a method for synthesizing Compound G-1 of Synthesis Example 1 of the present invention. In the method for synthesizing Compound G-1, 3,5-dibromobenzaldehyde (3.0 g), 4-t-butylphenylboronic acid (5.3 g), tetrakis(triphenylphosphine)palladium (0) (0.4 g), and potassium carbonate (2.0 g) were put into a flask, and purged with nitrogen. Degassed toluene (30 mL) and degassed water (10 mL) were added thereto, and the resultant mixture was refluxed for 4 hours. This reaction solution was cooled to room temperature, and the organic layer was separated and was then washed with a saturated saline solution. This organic layer was dried with magnesium sulfate and was filtered, and the solvent was then distilled off therefrom. The obtained reaction product was purified by silica gel chromatography to obtain 3,5-bis(4-t-butylphenyl)benzaldehyde (3.5 g) as a white solid.

Next, 3,5-bis(4-t-butylphenyl)benzaldehyde (1.5 g) and 2,4-dimethylpyrrole (0.7 g) were put into a reaction solution, and dehydrated dichloromethane (200 mL) and trifluoroacetic acid (one drop) were added thereto, and the resultant mixture was stirred for 4 hours in a nitrogen atmosphere. Subsequently, a dehydrated dichloromethane solution of 2,3-dichloro-5,6-dicyano-1,4-benzoqainone (0.85 g) was added thereto, and the resultant mixture was stirred for additional 1 hour. After completion of reaction, a boron trifluoride diethyl ether complex (7.0 mL) and diisopropylethylamine (7.0 mL) were added thereto, and the resultant mixture was stirred for 4 hours. Water (100 mL) was then further added thereto, the resultant mixture was stirred, and the organic layer was separated. This organic layer was dried with magnesium sulfate and was filtered, and the solvent was then distilled off therefrom. The obtained reaction product was purified by silica gel chromatography to obtain a compound (0.4 g) (yield: 18%). A $^1$H-NMR analysis result of this obtained compound is as follows, by which it was confirmed that this compound was Compound G-1.

$^1$H-NMR (CDCl$_3$ (d=ppm)): 7.95 (s, 1H), 7.63-7.48 (m, 10H), 6.00 (S, 2H), 2.58 (S, 6H), 1.50 (s, 6H), 1.37 (s, 18H).

Figure 4:
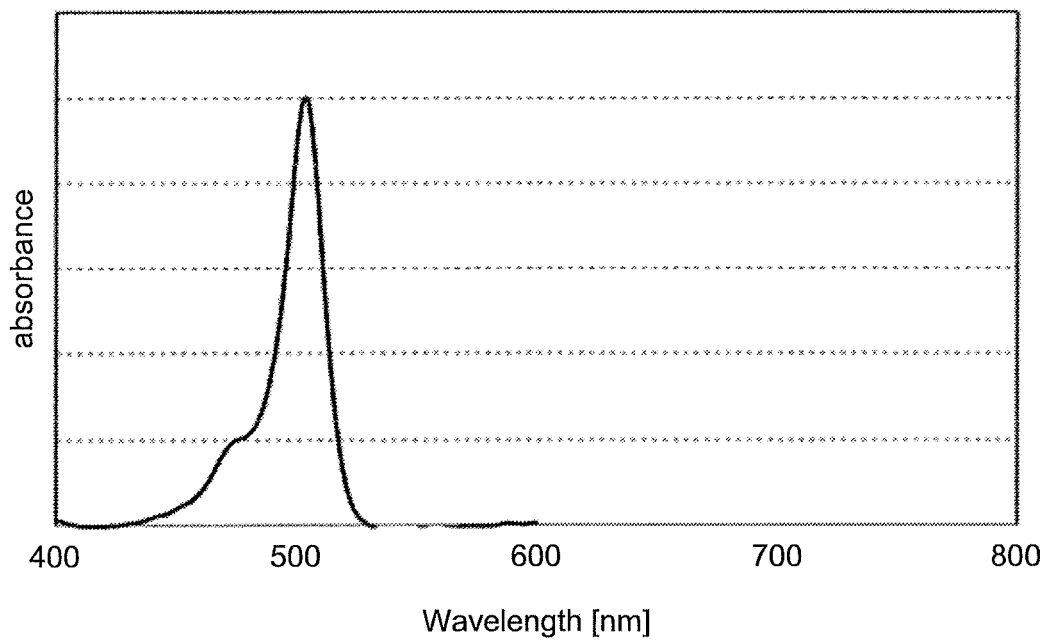
FIG. 4 is a diagram exemplifying an absorption spectrum of a compound of Synthesis Example 1 in examples of the present invention.
Figure 5:
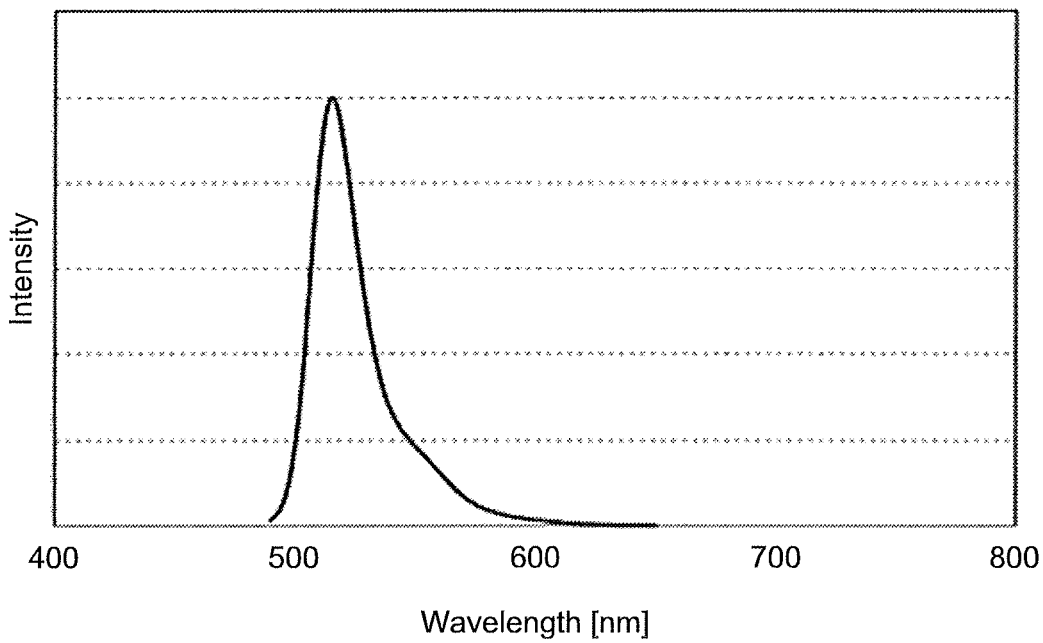
FIG. 5 is a diagram exemplifying an emission spectrum of the compound of Synthesis Example 1 in the examples of the present invention.

An absorption spectrum of this compound G-1 is as illustrated in FIG. 4, which showed light absorption characteristics against a blue excitation light source (460 nm). A fluorescence spectrum of this compound G-1 is as illustrated in FIG. 5, which showed a sharp emission peak in the green region. Showing a fluorescence quantum yield of 83%, this Compound G-1 was a compound that enabled efficient color conversion.

Synthesis Example 2

The following describes a method for synthesizing Compound R-1 of Synthesis Example 2 of the present invention. In the method for synthesizing Compound R-1, a mixed solution of 4-(4-t-butylphenyl)-2-(4-methoxyphenyl)pyrrole (300 mg), 2-methoxybenzoyl chloride (201 mg), and toluene (10 ml) was heated at 120° C. for 6 hours in a nitrogen flow. This heated solution was cooled to room temperature and was then evaporated. Next, the resultant concentrate was washed with ethanol (20 ml) and was dried in a vacuum to obtain 2-(2-methoxybenzoyl)-3-(4-t-butylphenyl)-5-(4-methoxyphenyl)pyrrole (260 mg).

Next, a mixed solution of 2-(2-methoxybenzoyl)-3-(4-t-butylphenyl)-5-(4-methoxyphenyl)pyrrole (260 mg), 4-(4-t-butylphenyl)-2-(4-methoxyphenyl)pyrrole (180 mg), methanesulfonic acid anhydride (206 mg), and degassed toluene (10 ml) was heated at 125° C. for 7 hours in a nitrogen flow. This heated solution was cooled to room temperature, water (20 ml) was then injected thereto, and extraction was performed with dichloromethane (30 ml). The organic layer was washed with water (20 ml) twice and was evaporated, and the resultant concentrate was dried in a vacuum.

Next, to a mixed solution of the obtained pyrromethene body and toluene (10 ml) in a nitrogen stream, diisopropylethylamine (305 mg) and a boron trifluoride diethyl ether complex (670 mg) were added, and the resultant mixture was stirred at room temperature for 3 hours. Water (20 ml) was then injected thereinto, and extraction was performed with dichloromethane (30 ml). The organic layer was washed with water (20 ml) twice, was dried with magnesium sulfate, and was evaporated. The resultant concentrate was purified by silica gel chromatography and was dried in a vacuum to obtain reddish-violet powder (0.27 g). A $^1$H-NMR analysis result of the obtained powder is as follows, by which it was confirmed that the reddish-violet powder obtained above was Compound R-1.

$^1$H-NMR (CDCl$_3$, ppm): 1.19 (s, 18H), 3.42 (s, 3H), 3.85 (s, 6H), 5.72 (d, 1H), 6.20 (t, 1H), 6.42-6.97 (m, 16H), 7.89 (d, 4H).

Figure 6:
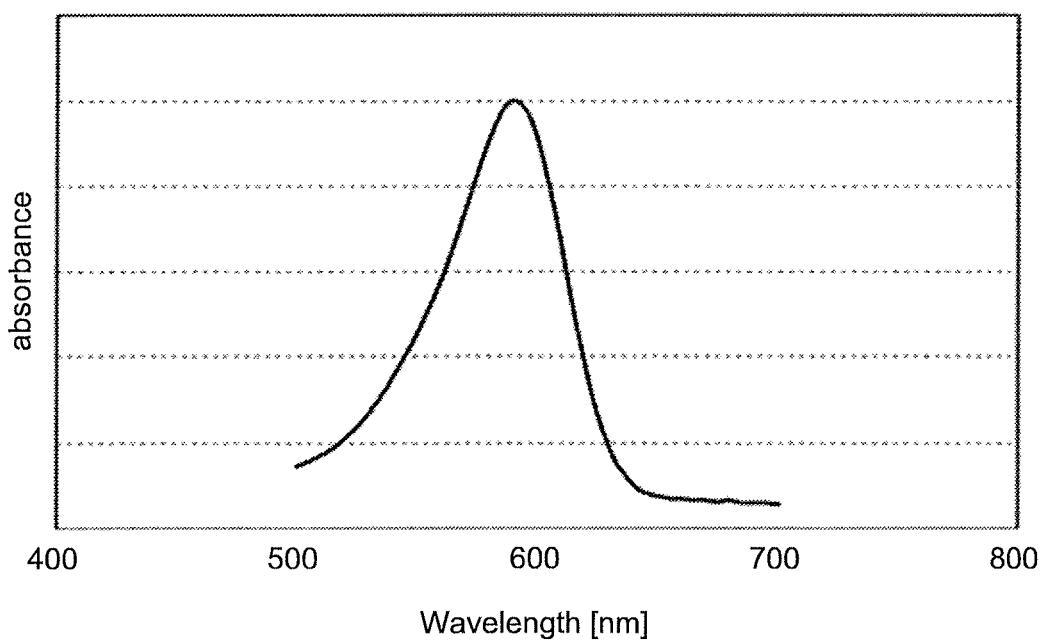
FIG. 6 is a diagram exemplifying an absorption spectrum of a compound of Synthesis Example 2 in the example of the present invention.
Figure 7:
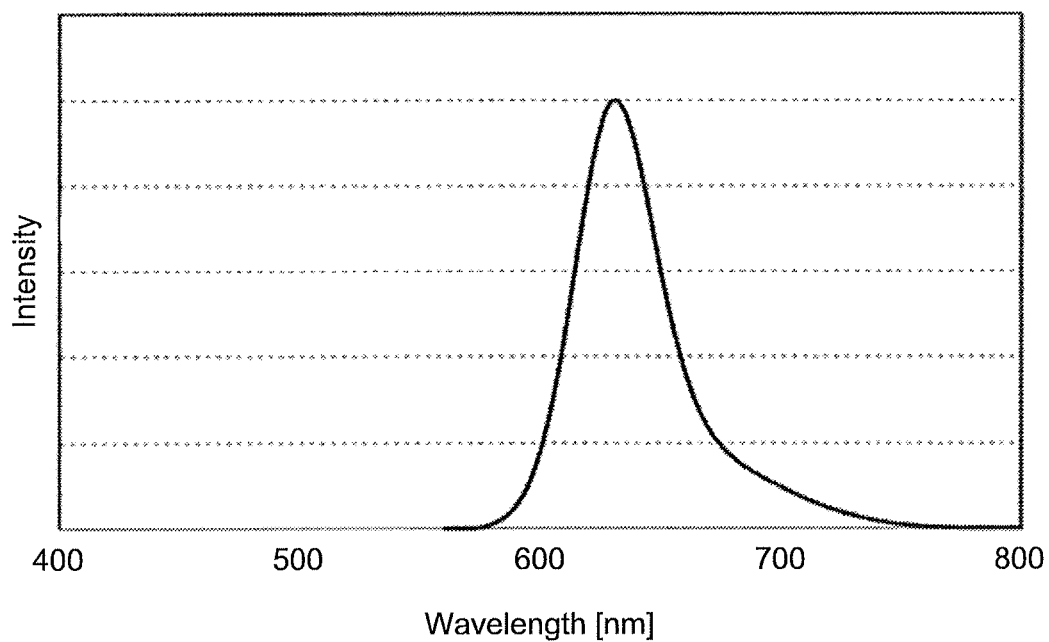
FIG. 7 is a diagram exemplifying an emission spectrum of the compound of Synthesis Example 2 in the examples of the present invention.

An absorption spectrum of this compound R-1 is as illustrated in FIG. 6, which showed light absorption characteristics against blue and green excitation light sources. A fluorescence spectrum of this compound G-1 is as illustrated in FIG. 7, which showed a sharp emission peak in the red region. Showing a fluorescence quantum yield of 90%, this Compound R-1 was a compound that enabled efficient color conversion.

Example 1

In Example 1 of the present invention, 0.20 part by weight of Compound G-1 as the organic light-emitting material and 0.50 part by weight of a curing agent were mixed with 100 parts by weight of a silicone resin "OE-6630A/B" (manufactured by Dow Corning Toray Co., Ltd.), and the resultant mixture was stirred and defoamed at 1,000 rpm for 20 minutes using a planetary stirring and defoaming apparatus "Mazerustar KK-400" (manufactured by Kurabo Industries Ltd.) to obtain a color conversion composition as a resin liquid for sheet preparation. Next, the resin liquid for sheet preparation was applied to "Cerapeel" BLK (manufactured by Toray Advanced Film Co., Ltd.) using a slit die coater and was heated and dried at 130° C. for 2 hours to form a color conversion layer with an average film thickness of 200 μm.

Next, a thermosetting adhesive layer was applied to a polyethylene terephthalate film (thickness: 50 μm), and an ethylene-vinyl alcohol copolymer film (ethylene content: 32 mol %, thickness: 12 μm, and total light transmittance: 90%) was laminated thereon to prepare Oxygen Barrier Laminate Film F1. The oxygen permeability of this Oxygen Barrier Laminate Film F1 containing the ethylene-vinyl alcohol copolymer was about 0.6 $cc/m^2 \cdot day \cdot atm$, and the water vapor permeability thereof was about 11 $g/m^2 \cdot day$. Two pieces of Oxygen Barrier Laminate Film F1 were prepared.

Subsequently, a thermosetting adhesive layer was formed by application on the ethylene-vinyl alcohol copolymer film (Layer (B)) of one piece of Oxygen Barrier Laminate Film F1, the color conversion layer (Layer (A)) was laminated thereon, and "Cerapeel" BLK was peeled off.

Finally, a thermosetting adhesive layer was formed by application on the ethylene-vinyl alcohol copolymer film (Layer (B)) of the other piece of Oxygen Barrier Laminate Film F1, and the adhesive layer was laminated on the color conversion layer (Layer (A)) to prepare a color conversion film with a structure similar to that of the color conversion film 1 illustrated in FIG. 3. In the obtained color conversion film, the average film thicknesses of the adhesive layers were all 0.50 μm. FIG. 3 does not illustrate the thermosetting adhesive layers.

Blue LED light was subjected to color conversion using this color conversion film; when only the emission region of green light was extracted, high color purity green emission with a peak wavelength of 526 nm and with a full width at half maximum of an emission spectrum at the peak wavelength being 25 nm was obtained. When the color conversion film was continuously irradiated with the light from the blue LED element at room temperature, the time elapsed until the luminance decreased by 5% was 600 hours. An evaluation result of Example 1 is listed in Table 3 below.

Examples 2 to 5

In Examples 2 to 5 of the present invention, color conversion films were prepared and evaluated similarly to Example 1 except that compounds (Compounds G-2, G-3, G-4, and G-5) listed in Table 3 below were used as the organic light-emitting material (the light-emitting material of Layer (A)) in place of Compound G-1. Evaluation results of Examples 2 to 5 are listed in Table 3.

Comparative Example 1

In Comparative Example 1 against the present invention, after a resin liquid for film preparation was prepared similarly to Example 1, the resin liquid for film preparation was applied to a polyethylene terephthalate film (thickness: 50 μm, oxygen permeability: about 40 $cc/m^2 \cdot day \cdot atm$, water vapor permeability: about 12 $g/m^2 \cdot day$, and total light transmittance: 89%) as the base layer using a slit die coater and was heated and dried at 130° C. for 2 hours to form a color conversion layer (Layer (A)) with an average film thickness of 200 μm. In Comparative Example 1, an evaluation similar to that of Example 1 was carried out using this laminate film. An evaluation result of Comparative Example 1 is listed in Table 3.

Comparative Examples 2 to 5

In Comparative Examples 2 to 5 against the present invention, color conversion films were prepared and evaluated similarly to Comparative Example 1 except that compounds (Compounds G-2, G-3, G-4, and G-5) listed in Table 3 below were used as the organic light-emitting material in place of Compound G-1. Evaluation results of Comparative Examples 2 to 5 are listed in Table 3.

Comparative Example 6

In Comparative Example 6 against the present invention, a color conversion film was prepared and evaluated similarly to Comparative Example 1 except that a polyethylene terephthalate film the surface of which had been subjected to alumina deposition treatment to form an alumina thin film layer (thickness: 50 μm, oxygen permeability: about 1.5 $cc/m^2 \cdot day \cdot atm$, water vapor permeability: about. 0.3 $g/m^2 \cdot day$, and total light transmittance: 89%) was used as the base layer. An evaluation result of Comparative Example 6 is listed in Table 3.

Example 6

In Example 6 of the present invention, 0.08 part by weight of Compound R-1 as the organic light-emitting material and 0.5 part by weight of a curing agent were mixed with 100 parts by weight of a two-part thermosetting epoxy-based acrylic resin, and the resultant mixture was stirred and defoamed at 300 rpm for 1 hour to obtain a color conversion composition as a resin liquid for sheet preparation. The obtained color conversion composition was applied to "Cerapeel" BLK (manufactured by Toray Advanced Film Co., Ltd.) using a bar coating method and was dried at 120° C. for 5 minutes to form a color conversion layer with an average film thickness of 10 μm.

Next, a thermosetting adhesive layer was applied to a polyethylene terephthalate film (thickness: 50 μm), and an ethylene-vinyl alcohol copolymer film (ethylene content: 32 mol %, thickness: 15 μm, and total light transmittance: 90%) was laminated thereon to prepare Oxygen Barrier Laminate Film F2. The oxygen permeability of this Oxygen Barrier Laminate Film F2 containing the ethylene-vinyl alcohol, copolymer was about 0.5 $cc/m^2 \cdot day \cdot atm$, and the water vapor permeability thereof was about 10 $g/m^2 \cdot day$. Two pieces of Oxygen Barrier Laminate Film F2 were prepared.

Subsequently, a thermosetting adhesive layer was formed by application on the ethylene-vinyl alcohol copolymer film (Layer (B)) of one piece of Oxygen Barrier Laminate Film F2, the color conversion layer (Layer (A)) was laminated thereon, and "Cerapeel" BLK was peeled off.

Finally, a thermosetting adhesive layer was formed by application on the ethylene-vinyl alcohol copolymer film (Layer (B)) of the other piece of Oxygen Barrier Laminate Film F2, and the adhesive layer was laminated on the color conversion layer (Layer (A)) to prepare a color conversion film with a structure similar to that of the color conversion film 1 illustrated in FIG. 3. In the obtained color conversion film, the average film thicknesses of the adhesive layers were all 0.50 µm. FIG. 3 does not illustrate the thermosetting adhesive layers.

Blue LED light was subjected to color conversion using this color conversion film; when only the emission region of red light was extracted, high color purity red emission with a peak wavelength of 635 nm and with a full width at half maximum of an emission spectrum at the peak wavelength being 49 nm was obtained. When the color conversion film was continuously irradiated with the light from the blue LED element at room temperature, the time elapsed until the luminance decreased by 2% was 600 hours. An evaluation result of Example 6 is listed in Table 4 below.

Examples 7 to 9

In Examples 7 to 9 of the present invention, color conversion films were prepared and evaluated similarly to Example 6 except that compounds (Compounds R-2, R-3, and R-4) listed in Table 4 below were used as the organic light-emitting material (the light-emitting material of Layer (A)) in place of Compound R-1. Evaluation results of Examples 7 to 9 are listed in Table 4.

Comparative Example 7

In Comparative Example 7 against the present invention, after a resin liquid for film preparation was prepared similarly to Example 6, the resin liquid for film preparation was applied to a polyethylene terephthalate film (thickness: 50 µm, oxygen permeability: about 40 cc/m²·day·atm, water vapor permeability: about 12 g/m²·day, and total light transmittance: 89%) as the base layer using a bar coating method and was dried at 120° C. for 5 minutes to form a color conversion layer (Layer (A)) with an average film thickness of 10 µm. In Comparative Example 7, an evaluation similar to that of Example 6 was carried out using this laminate film. An evaluation result of Comparative Example 7 is listed in Table 4.

Comparative Examples 8 to 10

In Comparative Examples 8 to 10 against the present embodiment, color conversion films were prepared and evaluated similarly to Comparative Example 7 except that compounds (Compounds R-2, R-3, and R-4) listed in Table 4 below were used as the organic light-emitting material in place of Compound R-1. Evaluation results of Comparative Examples 8 to 10 are listed in Table 4.

Comparative Example 11

In Comparative Example 11 against the present invention, a color conversion film was prepared and evaluated similarly to Comparative Example 7 except that a polyethylene terephthalate film the surface of which had been subjected to alumina deposition treatment to form an alumina thin film layer (thickness: 50 µm, oxygen permeability: about 1.5 cc/m²·day·atm, water vapor permeability: about 0.9 g/m²·day, and total light transmittance: 89%) was used as the base layer. An evaluation result of Comparative Example 11 is listed in Table 4.

Example 10

In Example 10 of the present invention, 0.20 part by weight of Compound G-1 (Light-Emitting Material (a)) and 0.08 part by weight of Compound R-1 (Light-Emitting Material (b)) as the organic light-emitting material and 0.5 part by weight of a curing agent were mixed with 100 parts by weight of a two-part thermosetting epoxy-based acrylic resin, and the resultant mixture was stirred and defoamed at 300 rpm for 1 hour to obtain a color conversion composition as a resin liquid for sheet preparation. The obtained color conversion composition was applied to "Cerapeel" BLK (manufactured by Toray Advanced Film Co., Ltd.) using a bar coating method and was dried at 120° C. for 5 minutes to form a color conversion layer with an average film thickness of 10 µm.

Next, a water/2-propanol mixed solution of a polyvinyl alcohol resin was applied to a polyethylene terephthalate film (thickness: 50 µm) using a bar coating method and was dried at 120° C. for 5 minutes to form a coating layer with an average film thickness of 0.30 µm, thereby preparing Oxygen Barrier Laminate Film F3. The total light emittance of the polyvinyl alcohol resin layer was 91%. The oxygen permeability of this Oxygen Barrier Laminate Film F3 including the polyvinyl alcohol resin layer was about 0.5 cc/m²·day·atm, and the water vapor permeability thereof was about 12 g/m²·day. Two pieces of Oxygen Barrier Laminate Film F3 were prepared.

Subsequently, a thermosetting adhesive layer was formed by application on the polyvinyl alcohol resin layer (Layer (B)) of one piece of Oxygen Barrier Laminate Film F3, the color conversion layer (Layer (A)) was laminated thereon, and "Cerapeel" BLK was peeled off.

Finally, a thermosetting adhesive layer was formed by application on the polyvinyl alcohol resin layer (Layer (B)) of the other piece of Oxygen Barrier Laminate Film F3, and the adhesive layer was laminated on the color conversion layer (Layer (A)) to prepare a color conversion film with a structure similar to that of the color conversion film 1 illustrated in FIG. 3. In the obtained color conversion film the average film thicknesses of the adhesive layers were all 0.50 µm. FIG. 3 does not illustrate the thermosetting adhesive layers.

Blue LED light was subjected to color conversion using this color conversion film; when only the emission region of green light was extracted, high color purity green emission with a peak wavelength of 527 nm and with a full width at half maximum of an emission spectrum at the peak wavelength being 28 nm was obtained; when only the emission region of red light was extracted, high color purity red emission with a peak wavelength of 635 nm and with a full width at half maximum of an emission spectrum at the peak wavelength being 49 nm was obtained. When the color conversion film was continuously irradiated with the light from the blue LED element at room temperature, the time elapsed until the luminance decreased by 5% was 620 hours. An evaluation result of Example 10 is listed in Table 5 below.

Examples 11 to 15

In Examples 11 to 15 of the present invention, color conversion films were prepared and evaluated similarly to Example 10 except that compounds (Compounds G-1, G-2, G-3, and G-5 and Compounds R-1, R-2, and R-3) listed in Table 5 were used as the organic light-emitting material (Light Emitting Materials (a) and (b) of Layer (A)). Evaluation results of Examples 11 to 15 are listed in Table 5.

Comparative Example 12

In Comparative Example 12 against the present invention, after a resin liquid for film preparation was prepared similarly to Example 10, the resin liquid for film preparation was applied to a polyethylene terephthalate film (thickness: 50 μm, oxygen permeability: about 40 cc/m²·day·atm, water vapor permeability: about 12 g/m²·day, and total light transmittance: 89%) as the base layer using a bar coating method and was dried at 120° C. for 5 minutes to form a color conversion layer with an average film thickness of 10 μm. In Comparative Example 12, an evaluation similar to that of Example 10 was carried out using this laminate film. An evaluation result of Comparative Example 12 is listed in Table 5.

Comparative Examples 13 to 17

In Comparative Examples 13 to 17 against the present invention, color conversion films were prepared and evaluated similarly to Comparative Example 12 except that compounds (Compounds G-1, G-2, G-3, and G-5 and Compounds R-1, R-2, and R-3) listed in Table 5 were used as the organic light-emitting material (Light-Emitting Materials (a) and (b) of Layer (A)). Evaluation results of Comparative Examples 13 to 17 are listed in Table 5.

Comparative Example 18

In Comparative Example 18 against the present invention, a color conversion film was prepared and evaluated similarly to Example 12 except that a polyethylene terephthalate film the surface of which had been subjected to alumina deposition treatment to form an alumina thin film layer (thickness: 50 μm, oxygen permeability: about 1.5 cc/m²·day·atm, water vapor permeability: about 0.9 g/m²·day, and total light transmittance: 89%) was used as the base layer. An evaluation result of Comparative Examples 18 is listed in Table 5.

Example 16

In Example 16 of the present invention, 0.20 part by weight of Compound G-1 as the organic light-emitting material and 0.50 part by weight of a curing agent were mixed with 100 parts by weight of a two-part thermosetting epoxy-based acrylic resin, and the resultant mixture was stirred and defoamed at 1,000 rpm for 20 minutes using a planetary stirring and defoaming apparatus "Mazerustar KK-400" (manufactured by Kurabo Industries Ltd.) to obtain a color conversion composition as a resin liquid for Layer (A) (a resin liquid for film formation). The obtained color conversion composition was applied to "Cerapeel" BLK (manufactured by Toray Advanced Film Co., Ltd.) using a bar coating method and was dried at 100° C. for 5 minutes to obtain Layer (A), that is, a color conversion layer with an average film thickness of 10 μm.

Next, 1.2 g of tetraethyl orthosilicate, 0.5 g of 2-propanol, and 0.5 g of methanol were mixed with each other, and aqueous hydrochloric acid in which 4 g of hydrochloric acid (0.1 N) and 5 g of water had been mixed with each other was gradually added dropwise thereto. After that, 0.4 g of a polyvinyl alcohol resin with a degree of saponification of 98 mol % or more as a polyol-based resin was added thereto, and the resultant mixture was stirred to obtain a resin liquid for Layer (B). Next, this resin liquid for Layer (B) was applied to a polyethylene terephthalate film (thickness: 50 μm) using a bar coating method and was dried at 150° C. for 1 minute to form a coating layer (Layer (B)) with an average film thickness of 0.30 μm, thereby preparing Oxygen Barrier Laminate Film F4. The silicon atom content of Layer (B) was 10.1 wt % by calculation from the above mixing ratio. The oxygen permeability of this Oxygen Barrier Laminate Film F4 was about 0.8 cc/m²·day·atm in an environment of a temperature of 20° C. and a humidity of 0% and about 1.0 cc/m²·day·atm in an environment of a temperature of 50° C. and a humidity of 85%. Two pieces of Oxygen Barrier Laminate Film F4 were prepared.

Subsequently, a thermosetting adhesive layer was formed by application on the polyol-based resin layer (Layer (B)) of one piece of Oxygen Barrier Laminate Film F4, Layer (A) was laminated thereon, and "Cerapeel" BLK was peeled off.

Finally, a thermosetting adhesive layer was formed by application on the polyol-based resin layer (Layer (B)) of the other piece of Oxygen Barrier Laminate Film F4, and the adhesive layer was laminated on Layer (A) to prepare a color conversion film with a structure similar to that of the color conversion film 1 illustrated in FIG. 3. In the obtained color conversion film, the average film thicknesses of the adhesive layers were all 0.5 μm. FIG. 3 does not illustrate the thermosetting adhesive layers.

Blue LED light was subjected to color conversion using this color conversion film; when only the emission region of green light was extracted, high color purity green emission with a peak wavelength of 526 nm and with a full width at half maximum of an emission spectrum at the peak wavelength being 26 nm was obtained. When the color conversion film was continuously irradiated with the light from a blue LED element at room temperature, the time elapsed until the luminance decreased by 5% was 580 hours; when the color conversion film was continuously irradiated with the light from the blue LED element in an environment of a temperature of 50° C. and a humidity of 85%, the time elapsed until the luminance decreased by 5% was 500 hours. An evaluation result of Example 16 is listed in Table 6 below.

Example 17

In Example 17 of the present invention, a color conversion film was prepared and evaluated similarly to Example 16 except that a compound (Compound G-2) listed in Table 6 below was used as the organic light-emitting material (the light-emitting material of Layer (A)) in place of Compound G-1. An evaluation result of Example 17 is listed in Table 6.

Examples 18 and 19

In Examples 18 and 19 of the present invention, color conversion films were prepared and evaluated similarly to Example 16 except that compounds (Compounds G-1 and G-2) listed in Table 6 were used as the organic light-emitting material (the light emitting-material of Layer (A)), and Oxygen Barrier Laminate Film F3 prepared similarly to Example 10 was used in place of Oxygen Barrier Laminate Film F4. Evaluation results of Examples 18 and 19 are listed in Table 6.

Comparative Examples 19 and 20

In Comparative Examples 19 and 20 against the present invention, color conversion films were prepared and evaluated similarly to Example 16 except that compounds (Compounds G-1 and G-2) listed in Table 6 were used as the organic light-emitting material (the light emitting-material of Layer (A)), and a polyethylene terephthalate film (thickness: 50 μm, oxygen permeability: about 40 cc/m²·day·atm, water vapor permeability: about 12 g/m²·day, and total light transmittance: 89%) was used in place of Oxygen Barrier Laminate Film F4. Evaluation results of Comparative Examples 19 and 20 are listed in Table 6.

TABLE 3

| | Layer (A) Light-emitting material | Layer (B) Transparent resin | Oxygen permeability (20° C., 0% RH) (cc/m² · day · atm) | Water vapor permeability (g/m² · day) | Peak wavelength (nm) | Full width at half maximum (nm) | Light-fastness (h) |
|---|---|---|---|---|---|---|---|
| Example 1 | G-1 | Oxygen Barrier Laminate Film F1 (ethylene-vinyl alcohol copolymer) | 0.6 | 11 | 526 | 25 | 600 |
| Example 2 | G-2 | Oxygen Barrier Laminate Film F1 (ethylene-vinyl alcohol copolymer) | 0.6 | 11 | 526 | 25 | 560 |
| Example 3 | G-3 | Oxygen Barrier Laminate Film F1 (ethylene-vinyl alcohol copolymer) | 0.6 | 11 | 527 | 25 | 500 |
| Example 4 | G-4 | Oxygen Barrier Laminate Film F1 (ethylene-vinyl alcohol copolymer) | 0.6 | 11 | 511 | 35 | 200 |
| Example 5 | G-5 | Oxygen Barrier Laminate Film F1 (ethylene-vinyl alcohol copolymer) | 0.6 | 11 | 490 | 55 | 360 |
| Comparative Example 1 | G-1 | Base layer (polyethylene terephthalate) | 40 | 12 | 526 | 25 | 20 |
| Comparative Example 2 | G-2 | Base layer (polyethylene terephthalate) | 40 | 12 | 526 | 25 | 19 |
| Comparative Example 3 | G-3 | Base layer (polyethylene terephthalate) | 40 | 12 | 527 | 25 | 17 |
| Comparative Example 4 | G-4 | Base layer (polyethylene terephthalate) | 40 | 12 | 511 | 35 | 18 |
| Comparative Example 5 | G-5 | Base layer (polyethylene terephthalate) | 40 | 12 | 490 | 55 | 30 |
| Comparative Example 6 | G-1 | Alumina deposited film | 1.5 | 0.9 | 526 | 25 | 120 |

TABLE 4

| | Layer (A) Light-emitting material | Layer (B) Transparent resin | Oxygen permeability (20° C., 0% RH) (cc/m² · day · atm) | Water vapor permeability (g/m² · day) | Peak wavelength (nm) | Full width at half maximum (nm) | Light-fastness (h) |
|---|---|---|---|---|---|---|---|
| Example 6 | R-1 | Oxygen Barrier Laminate Film F2 (ethylene-vinyl alcohol copolymer) | 0.5 | 10 | 635 | 49 | 600 |
| Example 7 | R-2 | Oxygen Barrier Laminate Film F2 (ethylene-vinyl alcohol copolymer) | 0.5 | 10 | 617 | 47 | 550 |
| Example 8 | R-3 | Oxygen Barrier Laminate Film F2 (ethylene-vinyl alcohol copolymer) | 0.5 | 10 | 638 | 48 | 500 |
| Example 9 | R-4 | Oxygen Barrier Laminate Film F2 (ethylene-vinyl alcohol copolymer) | 0.5 | 10 | 647 | 30 | 200 |
| Comparative Example 7 | R-1 | Base layer (polyethylene terephthalate) | 40 | 12 | 635 | 49 | 100 |
| Comparative Example 8 | R-2 | Base layer (polyethylene terephthalate) | 40 | 12 | 617 | 47 | 95 |
| Comparative Example 9 | R-3 | Base layer (polyethylene terephthalate) | 40 | 12 | 638 | 48 | 92 |
| Comparative Example 10 | R-4 | Base layer (polyethylene terephthalate) | 40 | 12 | 647 | 30 | 74 |
| Comparative Example 11 | R-1 | Alumina deposited film | 1.5 | 0.9 | 635 | 49 | 150 |

TABLE 5

| | Layer (A) Light-emitting material (a) | (b) | Layer (B) Transparent resin | Oxygen permeability (20° C., 0% RH) (cc/m² · day · atm) | Water vapor permeability (g/m² · day) | Peak wavelength (nm) | Full width at half maximum (nm) | Light-fastness (h) |
|---|---|---|---|---|---|---|---|---|
| Example 10 | G-1 | R-1 | Oxygen Barrier Laminate Film F3 (polyvinyl alcohol) | 0.5 | 12 | 527, 635 | 28, 49 | 620 |
| Example 11 | G-1 | R-2 | Oxygen Barrier Laminate Film F3 (polyvinyl alcohol) | 0.5 | 12 | 527, 628 | 28, 48 | 610 |
| Example 12 | G-1 | R-3 | Oxygen Barrier Laminate Film F3 (polyvinyl alcohol) | 0.5 | 12 | 527, 638 | 28, 48 | 580 |
| Example 13 | G-2 | R-1 | Oxygen Barrier Laminate Film F3 (polyvinyl alcohol) | 0.5 | 12 | 527, 635 | 28, 49 | 560 |
| Example 14 | G-3 | R-1 | Oxygen Barrier Laminate Film F3 (polyvinyl alcohol) | 0.5 | 12 | 528, 635 | 28, 49 | 510 |
| Example 15 | G-5 | R-1 | Oxygen Barrier Laminate Film F3 (polyvinyl alcohol) | 0.5 | 12 | 490, 635 | 56, 49 | 380 |
| Comparative Example 12 | G-1 | R-1 | Base layer (polyethylene terephthalate) | 40 | 12 | 527, 635 | 28, 49 | 21 |
| Comparative Example 13 | G-1 | R-2 | Base layer (polyethylene terephthalate) | 40 | 12 | 527, 628 | 28, 48 | 20 |
| Comparative Example 14 | G-1 | R-3 | Base layer (polyethylene terephthalate) | 40 | 12 | 527, 638 | 28, 48 | 20 |
| Comparative Example 15 | G-2 | R-1 | Base layer (polyethylene terephthalate) | 40 | 12 | 527, 635 | 28, 49 | 20 |
| Comparative Example 16 | G-3 | R-1 | Base layer (polyethylene terephthalate) | 40 | 12 | 528, 635 | 28, 49 | 18 |
| Comparative Example 17 | G-5 | R-1 | Base layer (polyethylene terephthalate) | 40 | 12 | 490, 635 | 56, 49 | 31 |
| Comparative Example 18 | G-1 | R-1 | Alumina deposited film | 1.5 | 0.9 | 527, 635 | 28, 49 | 130 |

TABLE 6

| | Layer (A) Light-emitting material | Layer (B) Transparent resin | Oxygen permeability (20° C., 0% RH) (cc/m² · day · atm) | Water vapor permeability (50° C., 85% RR) (g/m² · day) | Peak wavelength (nm) | Full width at half maximum (nm) | Light-fastness (20° C.) (h) | Light-fastness (50° C., 85% RH) (h) |
|---|---|---|---|---|---|---|---|---|
| Example 16 | G-1 | Oxygen Barrier Laminate Film F4 (polyvinyl alcohol and tetraethyl orthosilicate) | 0.8 | 1.0 | 526 | 26 | 580 | 500 |
| Example 17 | G-2 | Oxygen Barrier Laminate Film F4 (polyvinyl alcohol and tetraethyl orthosilicate) | 0.8 | 1.0 | 526 | 26 | 540 | 460 |
| Example 18 | G-1 | Oxygen Barrier Laminate Film F3 (polyvinyl alcohol) | 0.5 | 6.0 | 526 | 25 | 600 | 90 |
| Example 19 | G-2 | Oxygen Barrier Laminate Film F3 (polyvinyl alcohol) | 0.5 | 6.0 | 526 | 25 | 560 | 75 |
| Comparative Example 19 | G-1 | Polyethylene terephthalate | 35 | 100 | 526 | 26 | 20 | 12 |
| Comparative Example 20 | G-2 | Polyethylene terephthalate | 35 | 100 | 526 | 26 | 19 | 11 |

INDUSTRIAL APPLICABILITY

As described above, the color conversion film and the light source unit including the same, the display, and the lighting apparatus according to the present invention are suitable for a color conversion film and a light source unit including the same, a display, and a light apparatus that achieve both high color reproducibility and high durability.

REFERENCE SIGNS LIST

1 Color conversion film
10 Base layer
11 Color conversion layer
12 Oxygen barrier transparent resin layer

The invention claimed is:

1. A color conversion film that converts incident light into light with a wavelength longer than that of the incident light, the color conversion film being a laminate film comprising the following Layer (A) and Layer (B):

Layer (A): a color conversion layer as a continuous layer containing at least one organic light-emitting material and a binder resin; and Layer (B): a transparent resin layer with an oxygen permeability of 1.0 cc/m²·day·atm or less, wherein:

the Layer (B) is a cured object layer of a polyol-based resin and a resin composition containing a silicon compound represented by General Formula (6) and a hydrolysate of the silicon compound:

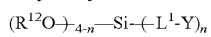 (6)

where
- each $R^{12}$ is independently selected from the group consisting of hydrogen, an alkyl group, a cycloalkyl group, an alkenyl group, a cycloalkenyl group, and a silyl group;
- each $L^1$ is independently selected from the group consisting of a single bond, an alkylene group, and a phenylene group;
- each Y is independently selected from the group consisting of hydrogen, an alkyl group, a cycloalkyl group, a heterocyclic group, an alkenyl group, a cycloalkenyl group, an alkynyl group, a hydroxy group, a thiol group, a glycidyl group, an alkoxy group, an alkylthio group, a glycidyl ether group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a boryl group, and a phosphine oxide group; and
- n is an integer of 0 or more and 4 or less.

2. The color conversion film according to claim 1, wherein the Layer (A) and the Layer (B) are laminated in order of the Layer (B), the Layer (A), and the Layer (B).

3. The color conversion film according to claim 1, wherein the polyol-based resin contains polyvinyl alcohol or an ethylene-vinyl alcohol copolymer.

4. The color conversion film according to claim 1, wherein a transparent resin contained in Layer (B) is a polyol-based resin.

5. The color conversion film according to claim 1, wherein the organic light-emitting material contains a compound represented by General Formula (1):

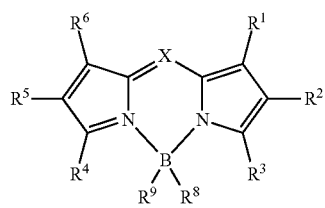

(1)

where X is C—$R^7$ or N; $R^1$ to $R^9$ are the same as or different from each other, and are selected from hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, a phosphine oxide group, and a condensed ring and an aliphatic ring formed between adjacent substituents.

6. The color conversion film according to claim 5, wherein X in the General Formula (1) is C—$R^7$ in which $R^7$ is a group represented by General Formula (2):

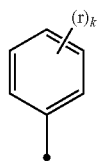

(2)

where r is selected from the group consisting of hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, and a phosphine oxide group; k is an integer of 1 to 3; and when k is 2 or more, rs are the same as or different from each other.

7. The color conversion film according to claim 5, wherein $R^1$, $R^3$, $R^4$, and $R^6$ in the General Formula (1) are the same as or different from each other, and are substituted or unsubstituted phenyl groups.

8. The color conversion film according to claim 5, wherein $R^1$, $R^3$, $R^4$, and $R^6$ in the General Formula (1) are the same as or different from each other, and are substituted or unsubstituted alkyl groups.

9. A light source unit comprising:
a light source; and
the color conversion film according to claim 1.

10. The light source unit according to claim 9, wherein the light source is a light-emitting diode having maximum emission in a range of 430 nm or more and 500 nm or less.

11. A display comprising the light source unit according to claim 9.

12. A lighting apparatus comprising the light source unit according to claim 9.

13. A color conversion film that converts incident light into light with a wavelength longer than that of the incident light, the color conversion film being a laminate film comprising the following Layer (A) and Layer (B):
Layer (A): a color conversion layer as a continuous layer containing at least one organic light-emitting material and a binder resin; and
Layer (B): a transparent resin layer with an oxygen permeability of 1.0 cc/m²·day·atm or less, wherein the organic light-emitting material contains a compound represented by General Formula (1):

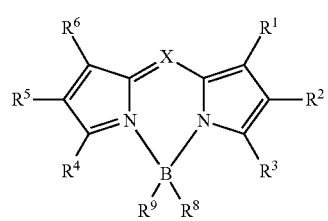

(1)

where X is C—$R^7$ or N; $R^1$ to $R^9$ are the same as or different from each other, and are selected from hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, a phosphine oxide group, and a condensed ring and an aliphatic ring formed between adjacent substituents.

14. The color conversion film according to claim 13, wherein the Layer (A) and the Layer (B) are laminated in order of the Layer (B), the Layer (A), and the Layer (B).

15. The color conversion film according to claim 13, wherein the transparent resin contained in the Layer (B) contains polyvinyl alcohol or an ethylene-vinyl alcohol copolymer.

16. The color conversion film according to claim 13, wherein the transparent resin contained in Layer (B) is a polyol-based resin.

17. A light source unit comprising:
a light source; and
the color conversion film according to claim 13.

18. The light source unit according to claim 17, wherein the light source is a light-emitting diode having maximum emission in a range of 430 nm or more and 500 nm or less.

19. A display comprising the light source unit according to claim 17.

20. A lighting apparatus comprising the light source unit according to claim 17.

* * * * *